US007323955B2

(12) United States Patent
Jachowski

(10) Patent No.: US 7,323,955 B2
(45) Date of Patent: Jan. 29, 2008

(54) NARROW-BAND ABSORPTIVE BANDSTOP FILTER WITH MULTIPLE SIGNAL PATHS

(75) Inventor: Douglas R. Jachowski, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 260 days.

(21) Appl. No.: 11/145,219

(22) Filed: Jun. 6, 2005

(65) Prior Publication Data

US 2006/0273869 A1 Dec. 7, 2006

(51) Int. Cl.
*H01P 1/20* (2006.01)
*H01P 5/18* (2006.01)
*H03H 7/00* (2006.01)

(52) U.S. Cl. ...................... 333/204; 333/110; 333/126; 333/132; 333/174; 327/556

(58) Field of Classification Search ................. 327/556
See application file for complete search history.

(56) References Cited

U.S. PATENT DOCUMENTS 2,035,258 A 3/1936 Bode
3,142,028 A 7/1964 Wanselow
4,262,269 A 4/1981 Griffin et al.
4,307,413 A * 12/1981 Takeuchi et al. ............ 348/667

(Continued)

FOREIGN PATENT DOCUMENTS

JP 58-161516 9/1983

(Continued)

OTHER PUBLICATIONS

H. Matsumura & Y. Konishi, "An active microwave filter with dielectric resonator," *1979 IEEE MTT-S Int. Microwave Symp. Digest*, pp. 323-325, Jun. 1979.

(Continued)

*Primary Examiner*—Robert Pascal
*Assistant Examiner*—Kimberly E Glenn
(74) *Attorney, Agent, or Firm*—John J. Karasek; L. George Legg

(57) ABSTRACT

An absorptive bandstop filter includes at least two frequency-dependent networks, one of which constitutes a bandpass filter, that form at least two forward signal paths between an input port and an output port and whose transmission magnitude and phase characteristics are selected to provide a relative stopband bandwidth that is substantially independent of the maximum attenuation within the stopband and/or in which the maximum attenuation within the stopband is substantially independent of the unloaded quality factor of the resonators. The constituent network characteristics can also be selected to provide low reflection in the stopband as well as in the passband. The absorptive bandstop filter can be electrically tunable and can substantially maintain its attenuation characteristics over a broad frequency tuning range.

25 Claims, 30 Drawing Sheets

U.S. PATENT DOCUMENTS

| | | | | |
|---|---|---|---|---|
| 4,426,630 A * | 1/1984 | Folkmann | | 333/174 |
| 4,577,168 A | 3/1986 | Hartmann | | |
| 4,694,266 A | 9/1987 | Wright | | |
| 5,187,460 A | 2/1993 | Forterre et al. | | |
| 5,339,057 A | 8/1994 | Rauscher | | |
| 5,525,945 A | 6/1996 | Chiappetta et al. | | |
| 5,721,521 A | 2/1998 | Drabeck et al. | | |
| 5,781,084 A | 7/1998 | Rhodes | | |
| 6,020,783 A | 2/2000 | Coppola | | |
| 6,107,898 A * | 8/2000 | Rauscher | | 333/175 |
| 6,636,128 B2 | 10/2003 | Rauscher | | |

FOREIGN PATENT DOCUMENTS

WO WO-WO95/16018 6/1995

OTHER PUBLICATIONS

T. Nishikawa Y. Ishikawa, J. Hatari, & K. Wakino, "Dielectric receiving filter with sharp stopband using an active feedback resonator method for cellular base stations," *IEEE Trans. Microwave Theory Tech.*, vol. 37, pp. 2074-2079, Dec. 1989.

* cited by examiner

NARROW-BAND ABSORPTIVE BANDSTOP FILTER WITH MULTIPLE SIGNAL PATHS

FIELD OF THE INVENTION

This invention relates to a bandstop filter. More particularly, the invention relates to a tunable narrow-band absorptive bandstop, or notch, filter.

BACKGROUND OF THE INVENTION

Currently, there is significant interest in narrow-band bandstop, or notch, filters for use in advanced communication systems. A notch filter is used in the signal path of a receiver or transmitter to suppress undesired signals in a narrow band of frequencies, signals that would otherwise compromise system performance. For example, notch filters can be used to remove interference from receiver front-ends due to collocated transmitters, adjacent receive bands, and jammers, and can be used in transmitters to eliminate harmonic and spurious signals due to power amplifier non-linearities.

Any means of attenuating electromagnetic power over a limited frequency band or bands is typically called a band-stop, band-reject, or notch filter. Conventional notch filter performance, as measured by stopband attenuation, pass-band insertion loss, and selectivity—which is the ratio of stopband width, $b_s$, to the width between passband edges, $b_p$—is ultimately limited by the "unloaded quality factor", unloaded Q or $Q_u$, of the resonators that comprise the filter. Since $Q_u$ is generally proportional to resonator volume and cost, the quest for a more effective notch filter (one with greater stopband attenuation, lower passband loss, and greater selectivity) is at odds with the perpetual drive towards miniaturization and cost reduction.

It is conventional practice to construct notch filters from resonant elements, or resonators, that behave as either shunt low impedances or series high impedances at their resonant frequencies such that they reflect incident power, and thereby attenuate the transmission of incident power, at these frequencies. For instance, a common way to attenuate the power through a transmission line at a particular microwave frequency is to couple a resonant element to the transmission line, as shown in FIG. 1, wherein both the power dissipation (or loss, which is typically quantified by the inversely related $Q_u$) of the resonance and the level of the coupling between the resonance and the transmission line determine the attenuation $L_o$ at the resonant frequency $f_o$ as well as determine the frequency span b about $f_o$ outside of which a certain maximum level of insertion loss is not exceeded. Examples of such a traditional bandstop filter would include an open-circuited half-wavelength microstrip transmission line resonator capacitively (gap-) coupled to a microstrip transmission line, as well as a $TE_{01}$-mode dielectric-resonator-loaded cavity inductively (loop-) coupled to a coaxial transmission line.

Unfortunately, in these types of bandstop filters, the relative bandwidth $$b = \left|\frac{f_1^2 - f_o^2}{f_1 f_o}\right|$$

for an attenuation $L_1$ at a frequency $f_1$ is dependent on both the maximum attenuation $L_o$ at resonant frequency $f_o$ and the resonator's quality $Q_u$, according to:

$$b = \frac{1}{Q_u}\sqrt{\frac{10^{L_o/10} - 10^{L_1/10}}{10^{L_1/10} - 1}} \qquad (1)$$

When attenuation level $L_1=10\log_{10}(2)\approx 3$ dB, b is called the relative 3 dB bandwidth $b_{3dB}$, and:

$$b_{3\,dB} = \frac{1}{Q_u}\sqrt{10^{L_o/10} - 2} \qquad (2)$$

Consequently, for a fixed $Q_u$, the greater the maximum attenuation is, the larger the relative bandwidth, while the narrower the relative bandwidth is, the less the maximum attenuation. Also, for a fixed level of coupling between the resonance and the transmission line, the maximum attenuation is dependent on the resonator $Q_u$, so that a resonance with a lower $Q_u$ results in a wider relative bandwidth, smaller maximum attenuation, and lower filter selectivity. To emphasize the drawbacks of conventional notch filters, FIG. 2(*a*) illustrates the effect of $Q_u$ on $L_o$ when b and resonator-to-transmission-line coupling are held constant, while FIG. 2(*b*) shows the effect of $Q_u$ on b when Lo and resonator-to-transmission-line coupling are held constant.

The only means of realizing better performance from optimally designed conventional notch filters is to employ resonators with commensurately higher $Q_u$, which means either using relatively large waveguide cavity resonators, significantly smaller, but heavy and moderately expensive, single-mode or dual-mode dielectric resonators, or very expensive superconducting resonators that require cryogenic packaging and a cryocooler. Using higher $Q_u$ resonators unavoidably requires accepting some combination of a larger volume, a heavier weight, and a greater cost, as well as inherent incompatibility with conventional printed-circuit and integrated-circuit manufacturing processes.

U.S. Pat. No. 2,035,258, Hendrik W. Bode, issued Mar. 24, 1936, describes a lumped-element notch filter, shown in FIG. 3*a*, in which a series resonant circuit is connected in parallel with a shunt resonant circuit such that at a certain frequency the effective resistance and reactance of the two circuits are "simultaneously balanced," resulting in "substantially infinite attenuation . . . at the frequency of balance." FIG. 3*b* is a graph illustrating a representative transmission response of the filter of FIG. 3*a*. It is advantageous that the ultimate attenuation is substantially infinite and independent of the $Q_u$ of the reactive components comprising the resonant circuits. A disadvantage, however, is that the values of the constituent lumped inductors and capacitors must be exceptionally precise and that the ratios of the inductor values and the capacitor values in the circuits are impractically large. Consequently, it has not found wide use, especially at microwave frequencies where realizing lumped inductors is problematic.

U.S. Pat. No. 3,142,028, R. D. Wanselow, describes an alternate type of distributed-element microwave notch filter in which the reflection coefficient is independent of the amount of prescribed attenuation. The filter comprises a four-port, 3 dB, 90° hybrid (i.e., "quadrature") waveguide coupler (also called a "3 dB short-slot forward wave directional coupler") in which the two intermediate ports are each coupled to a separate, lossy-dielectric-filled cavity resonator. Both resonators have the same resonant frequency, and their $Q_u$ and coupling to the hybrid can be adjusted to realize a specific notch attenuation and bandwidth, with the resonators absorbing, rather than reflecting, incident power at their resonant frequencies. To reduce the size of Wanselow's filter, his circuit has subsequently been implemented using surface acoustic wave resonators and either a transmission line quadrature coupler or a lumped-element quadrature hybrid, as well as using a dual-mode dielectric resonator and a microstrip directional coupler.

U.S. Pat. No. 4,262,269 describes an approach that employs positive feedback around an amplifier and through a passive resonator to cancel the power dissipation in the resonator and effectively create an infinite-$Q_u$ active resonator. As in the '258 patent's filter, notch filters employing such active resonators exhibit an ultimate attenuation that is substantially infinite and independent of the $Q_u$ of the passive resonators. The approach, however, suffers from instability (a tendency to oscillate) inherent to positive feedback schemes, and while the approach significantly improves the stopband attenuation, it fails to improve, and can actually degrade, the band-edge noise figure.

U.S. Pat. No. 5,339,057 describes an alternate type of distributed-element active bandstop filter that employs inherently stable feedforward, rather than unstable positive feedback. Input power is channelized, or split, between an amplified unidirectional bandpass signal path and an amplified unidirectional delay signal path, as shown in FIG. 4*a*. An incident signal is split into two separate components, which are adjusted to be of equal amplitude and opposite phase at the desired frequency, and the adjusted components are recombined to form a notched output signal, with the stopband attenuation attributed to signal cancellation. FIG. 4*b* is a graph illustrating a representative transmission response of the filter of FIG. 4*a*. Although the maximum attenuation is independent of the resonator $Q_u$ and the invention introduces distributed transmission line elements, it requires an amplifier in the delay signal path. The noise, gain nonlinearities, and signal distortion inherent in any such amplifier in an all-pass signal path makes the invention generally unsuitable for many important applications, including receiver pre-select filtering and transmitter clean-up filtering.

U.S. Pat. No. 5,781,084, J. D. Rhodes, incorporated herein by reference, describes a fully passive non-reciprocal absorptive notch filter that exhibits a maximum attenuation independent of the constituent resonator $Q_u$. The filter is composed of a three-port circulator, one port of which is terminated by a reflective single-port filter. When the reflective one-port filter is comprised of a single resonant circuit and the coupling between the resonant circuit and the circulator is adjusted so that, at resonance, the impedance of the resonant circuit is matched to the impedance of the circulator, then at resonance all the power supplied at the input port of the circulator is absorbed in the resistive part of the resonator, no power is transmitted to the output port of the circulator, and the notch filter exhibits infinite attenuation at the resonant frequency. The relative 3 dB bandwidth of Rhode's filter is expressed as:

$$b_{3\,dB} = \frac{2}{Q_u} \tag{3}$$

which, when compared with (2), makes it clear that both the relative bandwidth and resonator $Q_u$ are independent of the maximum notch attenuation, and visa versa. The filter also has the significant advantage that higher-order bandstop filter responses can be realized by simply terminating a circulator port with higher-order reflective one-port passive networks, so that only a single circulator is required for any order filter and the number of resonators is the same as the order of the bandstop filter response. This is in contrast to the active approaches discussed above, which require cascading of n first-order notch filters, including their respective amplifiers, to realize an $n^{th}$-order bandstop filter response. Unfortunately, circulators are generally connectorized components, and although they can be made compatible with hybrid circuit manufacturing, they are generally much larger than semiconductor amplifiers and are incompatible with conventional monolithic printed-substrate and integrated circuit processing.

Another prior art channelized notch filter employs two active bandpass filter signal paths to realize directional-filter coupling (rather than simple directional coupling) to the delay signal path, using the principal of signal cancellation. Although this provides a low-distortion, amplifier-free "delay" signal path, it requires twice as many amplifiers and resonators, and three times the transmission line length and its associated insertion loss in the delay path.

There is, therefore, a need for an improved low-distortion narrow-band notch filter for which maximum attenuation is independent of resonator $Q_u$, thereby effectively improving resonator $Q_u$.

Miniature, electrically tunable bandstop filters are also needed for suppression of signal interference in the receivers, and suppression of spurious signal output from the transmitters, of frequency-agile and/or reconfigurable communication and sensor systems. Conventional tunable bandstop filters suffer appreciable performance variation and degradation over their frequency tuning range due to frequency dependent loss in the tuning elements and resonators, as well as frequency dependent coupling magnitude and frequency dependent phase shift in the coupling elements.

There is, therefore, also a need for an improved electrically tunable, low-distortion, narrow-band notch filter for which maximum attenuation is independent of resonator Qu and which substantially maintain their performance characteristics over their frequency tuning range.

SUMMARY OF THE INVENTION

According to the invention, an absorptive bandstop filter includes at least two frequency-dependent networks, one of which constitutes a bandpass filter, that form at least two forward signal paths between an input port and an output port and whose transmission magnitude and phase characteristics are selected to provide a relative stopband bandwidth that is substantially independent of the maximum attenuation within the stopband and/or in which the maximum attenuation within the stopband is substantially independent of the unloaded quality factor of the resonators. The constituent network characteristics can also be selected to provide low reflection in the stopband as well as in the passband. The absorptive bandstop filter can be electrically tunable and can substantially maintain its attenuation characteristics over a broad frequency tuning range.

Significant advantages of a filter according to the invention include that the maximum attenuation is substantially independent of the unloaded quality factor of the resonators and can be essentially infinite, the reflection can be somewhat independent of the transmission and can be essentially zero in the stopband as well as in the passband even when the attenuation is essentially infinite, resonator frequency tuning alone can compensate for changes in filter component characteristics allowing for maintenance of filter characteristics over broad frequency tuning ranges, low stopband reflection can be maintained over moderate frequency tuning ranges, and both intrinsic and cascaded higher-order responses are realizable and the filter can exhibit better performance characteristics than a lossy elliptic function filter using similar components. First-order microstrip filters according to the invention can exhibit performance comparable to waveguide, dielectric resonator, and even superconductive filters. Yet the invention is not technology dependent, so that any resonator technology, even superconductive technology, can be applied in the realization of filters according to the invention—with corresponding improvements in performance.

Active-circuit filter embodiments can be significantly smaller, less expensive, more reliable, less prone to amplifier instability, exhibit lower insertion loss, and/or possess lower-distortion filter realizations than prior art active approaches.

The ability to realize low stopband reflection together without sacrificing stopband attenuation can be advantageous when the filter is cascaded with an amplifier, as amplifier design constraints are eased if one or both of the amplifier port impedances is known to be constant over all frequencies of interest. This low stopband reflection property can be particularly helpful in maintaining amplifier stability in frequency agile filter applications.

Passive reciprocal embodiments of the invention can advantageously utilize inexpensive, inherently stable, inherently low-distortion, monolithic-manufacturing-process compatible, conventional materials and components technologies.

Active embodiments of the notch filter do not require an amplifier to limit feedback in the delay signal path. Instead, any means of limiting delay-path feedback may be used, including substantially linear, low-noise passive directional components, such as directional couplers and isolators, as well as non-directional notch or bandstop filters.

The use of a passive non-reciprocal element in at least one of the filter's signal paths halves the number of resonators required to implement a certain order filter response.

The present invention improves resonator effective $Q_u$ and provides more compact, more affordable, and more reliable circuit topologies and realizations for which maximum attenuation is independent of resonator $Q_u$. The present filter significantly extends the state of the art in miniature, inexpensive, high performance, and frequency-agile notch filters.

Additional features and advantages of the present invention will be set forth in, or be apparent from, the detailed description of preferred embodiments which follows.

DETAILED DESCRIPTION OF THE PREFERRED EMBODIMENTS

Figure 41:
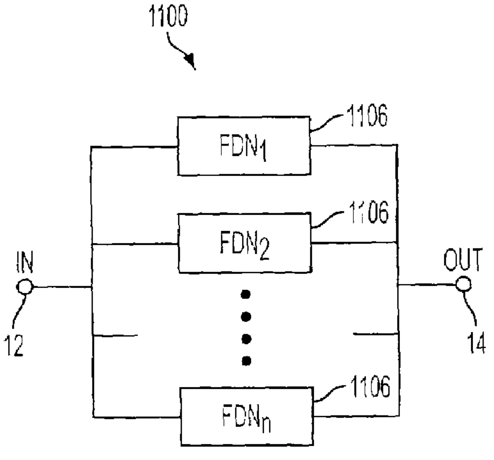
FIG. 41 is a block diagram of an absorptive notch filter according to the invention.

Referring now to FIG. 41, an absorptive bandstop, i.e. notch, filter 1100 according to the invention includes an input port 12 and an output port 14 which are joined by two or more frequency-dependent networks (FDN) 1106, which may or may not have portions in common, such that there are at least two distinct predominant forward signal paths connecting input port 12 to output port 14, with at least one of these signal paths having no amplifier and no more than one of these signal paths having one or more amplifiers. Filter 1100 must also contain one or more resonances, which may have either substantially the same values of unloaded Q or different values of unloaded Q and which have resonant frequencies such that the largest of the resonant frequencies is no more than fifty percent larger than the smallest resonant frequency.

A frequency dependent network is defined as an entity with frequency-dependent signal transmission magnitude and/or phase properties. Examples of frequency-dependent networks are filters, such as a bandpass filter and a notch filter, which have both signal transmission magnitude and phase frequency-dependent characteristics, as well as networks with predominately frequency-invariant transmission magnitude and/or essentially frequency-invariant transmission phase shift over a limited range of frequencies, such as an frequency-dependent phase shift network (i.e., an all-pass phase shift element) or delay line. Any of the frequency-dependent networks 1106 may also be mechanically or electrically tunable, as required by a specific application.

Beginning with the circuit topology of 1100 and using common circuit synthesis techniques, such as through iterative design and optimization using a circuit simulator, it is possible to design and synthesize the frequency-dependent networks 1106 of absorptive notch filter 1100 so as to select the signal transmission magnitude and phase properties of frequency-dependent networks 1106 such that the combined power transferred from input port 12 to output port 14 is substantially attenuated at one or more stopband frequencies within a range of frequencies defining a stopband and such that the relative 3 dB bandwidth of this stopband is substantially independent of the maximum level of attenuation within the stopband and/or that the maximum level of the attenuation within this stopband is substantially independent of the unloaded quality factor, or unloaded Q, of the constituent components (such as the resonances) of the frequency-dependent networks 1106. Some examples of representative transmission characteristics of different realizations of notch filter 1100 are shown in FIGS. 8, 17*d*, 18*c*, 19*b*, 20*c*, 21*b*, 21*c*, 22*b*, 25, and 30*b*. In general, absorptive notch filter 1100 may be comprised of all passive components or may include some active components (such as amplifiers), may include passive components consisting of all lumped elements, all distributed elements, or both lumped and distributed elements, may be comprised of all fixed-tuned components or may include some mechanically and/or electrically tunable components, and may have either reciprocal or non-reciprocal transmission characteristics.

Using the above mentioned design method, it is also possible to design the frequency-dependent networks 1106 so as to select their signal transmission magnitude and phase properties such that the incident signal power reflected from input port 12 and/or output port 14 is substantially attenuated at the stopband frequencies. In particular, the maximum reflected power level in the stopband can be of the same or smaller order of magnitude as the maximum reflected power level within at least one of the passbands adjacent to the stopband. Examples of representative reflection characteristics of various such realizations of absorptive notch filter 1100 are shown in FIGS. 12*b*, 13*b*, 16*d*, 17*d*, 18*c*, 22*b*, 26, and 30*b*. And, it is also possible to design the frequency-dependent networks 1106 such that the incident power is substantially reflected from input port 12 and/or output port 14 at the stopband frequencies, instead. Examples of representative reflection characteristics of various such realizations of absorptive notch filter 1100 are shown in FIGS. 15*d*, 19*b*, 20*c*, and 21*b*.

In addition, some of the constituent components and/or properties of the frequency-dependent networks 1106 may be made mechanically and/or electrically tunable such that the transmission characteristic of filter 1100 is tunable as well. Examples of representative transmission characteristics of different tunable realizations of notch filter 1100 are shown in FIGS. 12*a*, 13*a*, 15*a*, and 15*d*.

Figure 25:
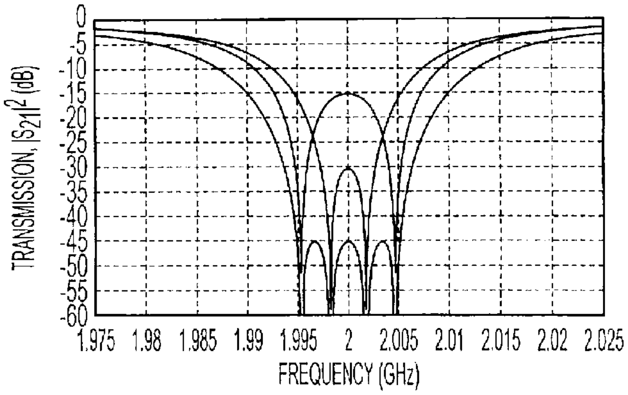
FIG. 25 is a graph illustrating simulated transmission characteristics of the individual biquad filters (light traces) of FIG. 21*a* and the composite characteristic of their cascade connection (dark trace) according to the invention.
Figure 26:
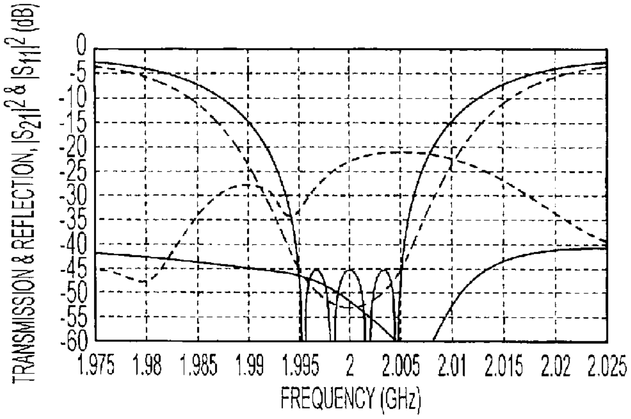
FIG. 26 is a graph illustrating simulated characteristics of the cascaded biquad bandstop filter (transmission: dark solid trace, reflection: light solid trace) of FIG. 25 according to the invention and the comparable "conventional" lossy quasi-elliptic bandstop filter (transmission: dark dashed trace, reflection: light dotted trace) according to the prior art.
Figure 38A:
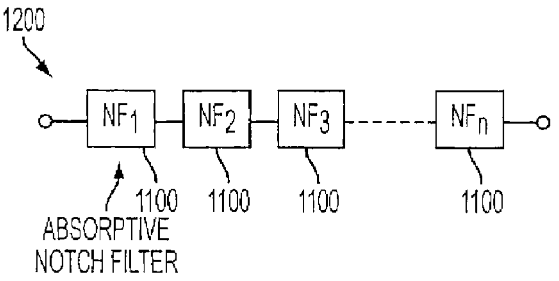
FIG. 38*a* is a block diagram of non-interacting cascaded notch filters according to the invention.
Figure 38B:
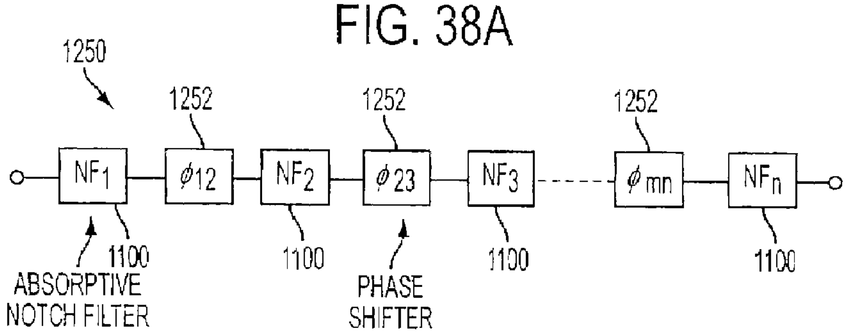
FIG. 38*b* is a block diagram of interacting cascaded notch filters according to the invention.

An absorptive notch filter (NF) 1100 may be combined with an arbitrary number of other such notch filters 1100 (of similar or different design) in a cascade, as shown in FIG. 38*a* by composite filter 1200, to realize a composite bandstop characteristic, a representative example of which is shown in FIG. 25. Depending on the particular signal reflection characteristics of each absorptive notch filter 1100, it may also be desirable to connect the notch filters 1100 with all-pass phase shift elements 1252 (of similar or different design, as called for by a particular application), to form a cascaded composite bandstop filter 1250 as shown in FIG. 38*b*.

While it is impractical to describe all possible realizations of, or compositions including, absorptive notch filter 1100, several preferred embodiments will be described as examples of the wide variety of forms, topologies, and implementations that absorptive notch filter 1100 can assume.

Figure 40:
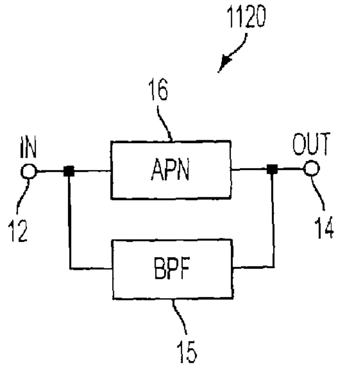
FIG. 40 is a block diagram of an absorptive notch filter including a bandpass filter according to the invention.

A first basic network topology that absorptive notch filter 1100 can assume is demonstrated by absorptive notch filter 1120, as shown in the conceptual diagram of FIG. 40, and is comprised of an input port 12 and an output port 14 joined by each of two frequency dependent networks, 16 and 15, where 16 and 15 each contain at least one independent forward signal path. Frequency dependent network 16 constitutes a passive frequency-dependent phase shift network (i.e., a predominately all-pass phase shift element), while frequency dependent network 15 is a bandpass filter, which may or may not be tunable. Note that frequency-dependent phase shift network 16 may also exhibit an essentially. frequency-invariant transmission phase shift within the stopband of absorptive notch filter 1120, which is preferable in most applications. While a truly frequency-invariant transmission phase shift and transmission magnitude is the most desirable characteristic for 16 in most applications, such an ideal element does not exist, and typically it is most convenient to approximate the ideal characteristic with a frequency-dependent element, such as a length of transmission line, that can exhibit approximately frequency-invariant characteristics over a limited frequency range.

Figure 42:
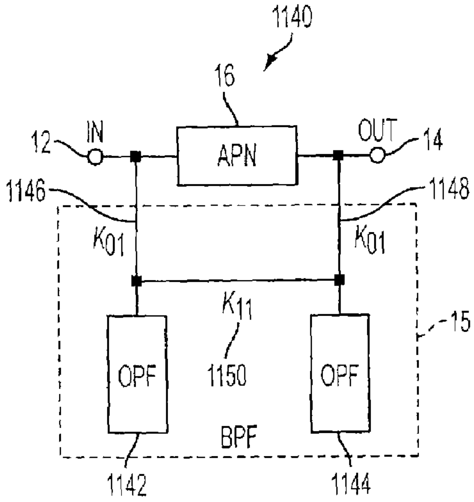
FIG. 42 is a block diagram of an absorptive notch filter including two one-port filters according to the invention.

In some instances, it is preferable for bandpass filter 15 of absorptive notch filter 1120 to have a canonic, cross-coupled-resonance topology. As in FIGS. 21*a* and 22*a*, but a "cul-de-sac" topology, as illustrated in FIG. 42, can also be preferred. Note that by setting coupling $k_{22}$ to zero in FIG. 21*a*, its canonic bandpass filter topology takes on the cul-de-sac form, which enables low stopband reflection in notch filter 700 of FIG. 21*a*, as will be described in detail later.

Referring again to FIG. 42, absorptive notch filter 1140 includes an input port 12, an output port 14, a first signal path connecting port 12 to port 14 that contains a coupling element, or frequency-dependent phase shift network, (APN) 16 having a predominately frequency-invariant transmission magnitude within a range of frequencies defining a band of interest, and a second signal path connecting port 12 to port 14 that constitutes a bandpass filter 15. Bandpass filter 15 includes one-port filters (OPF) 1142 and 1144, coupling elements $k_{01}$ 1146 and 1148 that couple one-port filters 1142 and 1144, each containing one or more resonances, to ports 12 and 14, respectively, and coupling element $k_{11}$ 1150 that couples one-port filters 1142 and 1144 to each other.

Beginning with the circuit topology of 1140 and using common circuit synthesis techniques, such as through iterative design and optimization using a circuit simulator, it is possible to select the coupling magnitudes and phases of coupling elements 16, 1146, 1148, and 1150 and the signal transmission magnitude and phase properties of one-port filters 1142 and 1144 of absorptive notch filter 1140 such that the combined power transferred from input port 12 to output port 14 is substantially attenuated at one or more stopband frequencies within a range of frequencies defining a stopband and such that the relative 3dB bandwidth of this stopband is substantially independent of the maximum level of attenuation within the stopband and/or that the maximum level of the attenuation within this stopband is substantially independent of the unloaded Q of the constituent resonances of the one-port filters 1142 and 1144.

Figure 5A:
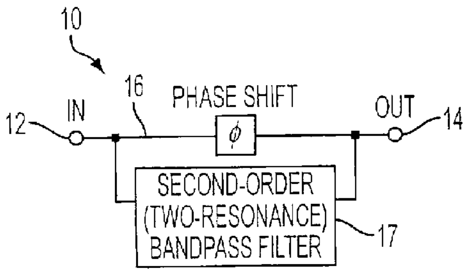
FIG. 5*a* is a schematic diagram of an absorptive-pair notch filter according to the invention.
Figure 5B:
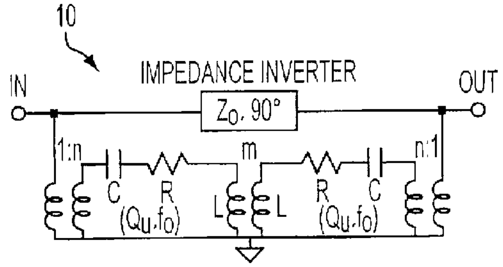
FIG. 5*b* is an equivalent circuit schematic of an absorptive-pair notch filter according to the invention.
Figure 39:
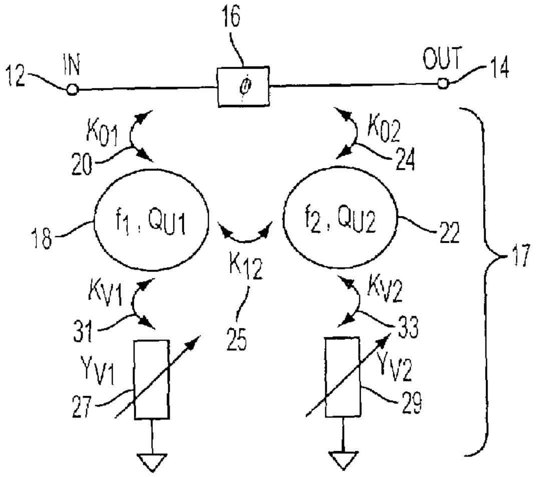
FIG. 39 is a schematic diagram of a tunable first-order absorptive-pair notch filter according to the invention.

One of the simplest examples of filters 1120 and 1140 is a corresponding "first-order" absorptive-pair notch filter 10, shown in FIG. 5*a*, wherein bandpass filter 15 of notch filters 1120 and 1140 is a second-order bandpass filter 17 of notch filter 10. Referring to FIG. 39, a "first-order" absorptive notch filter 10 includes an input port 12 and an output port 14. A first signal path includes a coupling element 16 coupling input port 12 to output port 14. A second signal path includes a two-port second-order (two-resonance) bandpass filter 17, also coupling port 12 to port 14. Bandpass filter 17 is comprised of an input coupling element 20, a first resonance 18, a resonance coupling element 25, a second resonance 22, and an output coupling element 24, wherein resonance 18 is coupled to port 12 through coupling element 20, resonance 22 is coupled to port 14 through coupling element 24, and resonance 18 is coupled to resonance 22 through coupling element 25. The two resonances 18 and 22 have resonant frequencies $f_1$ and $f_2$, respectively, and unloaded quality factors $Q_{u1}$ and $Q_{u2}$, respectively.

Optionally, filter 17 can be made tunable by making some or all of its constituent resonances and/or couplings tunable. In order to minimize filter cost, size, and signal distortion, it is generally preferable to minimize the number of tuned components. Consequently, it is preferable to only tune the resonant frequencies and, referring to FIG. 39, mechanically or electrically variable shunt admittances 27 and 29 are shown optionally coupled to resonances 18 and 22 by coupling elements 31 and 33, respectively.

Figure 37A:
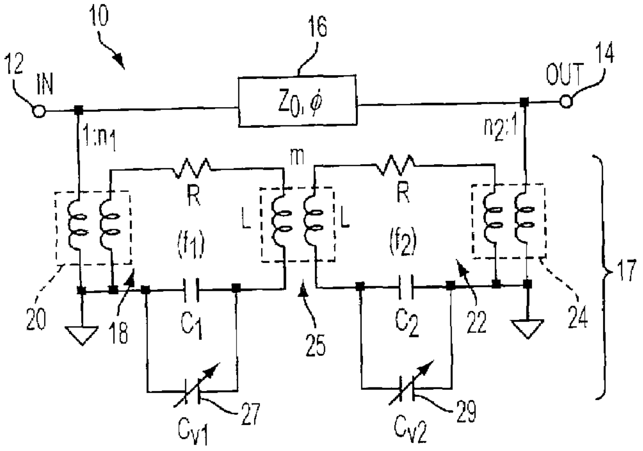
FIG. 37*a* is an equivalent circuit schematic of a first-order absorptive-pair notch filter of the type of FIG. 5*a* according to the invention.

Referring now to FIG. 37*a*, an equivalent circuit for "first-order" absorptive notch filter 10 includes an input port 12 and an output port 14. A first signal path includes acoupling element, or frequency-dependent phase shift network, 16 coupling input port 12 to output port 14. A second signal path includes a two-port second-order (two-resonance) bandpass filter 17, also coupling port 12 to port 14. Bandpass filter 17 is comprised of an input coupling element 20, a first resonance 18, a resonance coupling element 25, a second resonance 22, and an output coupling element 24, wherein resonance 18 is coupled to port 12 through coupling element 20, resonance 22 is coupled to port 14 through coupling element 24, and resonance 18 is coupled to resonance 22 through coupling element 25. The two resonances 18 and 22 have resonant frequencies $f_1$ and $f_2$, respectively, and unloaded quality factors $Q_{u1}$ and $Q_{u2}$, respectively. The coupling element 16 can essentially be an all-pass phase-shift element with a predominantly frequency-invariant transmission magnitude, transmission phase shift $\phi$, and admittance $Y_t=1/Z_o$ within the stopband of notch filter 10.

In this document, the term "resonance" is used to refer to the fundamental resonant mode of a physical resonator or to any one of many different resonant modes that a physical resonator might have. Consequently, the term "resonance" will always be understood to include the physical resonator that supports the particular resonant mode being referred to, keeping in mind that a single physical resonator can have more than one "resonance", or resonant mode, associated with it. For instance, resonances 18 and 22 could be fundamental resonant frequencies of two physically distinct resonators or they could be two independent resonant modes of a single dual-mode resonator, such as a dual-mode planar patch resonator, a dual-mode microstrip loop resonator, a dual-mode dielectric resonator, etc.

A "coupling element" always has an associated coupling magnitude—typically denoted by symbols n, m, or k—as well as an associated signed phase shift—typically denoted by $\phi$. Although an actual coupling could be realized by any type of coupling element—such as direct (eg., transmission line or wire) connection, predominately electric field (eg., gap, capacitive, interdigitated, or end-coupled-line) coupling, predominately magnetic field (i.e., loop, inductive, mutual inductive, transformer, or edge-coupled-parallel-line) coupling, or some type of composite electric and magnetic field coupling (eg., interdigitated edge-coupled-parallel-lines)—for illustration purposes, in FIG. 37*a* coupling elements 20 and 24 have been represented by ideal transformers with a primary-to-secondary turns ratio of 1:n and coupling 25 has been represented by mutually coupled inductance m=kL, where k is the coupling coefficient and L is the inductance. And, although resonances could be realized in a wide variety of ways—such as by lumped-element circuits including both capacitors and inductors, single-mode or multiple-mode distributed-element transmission line circuits of various electrical lengths (such as quarter-wavelength, half-wavelength, or full-wavelength) and employing various technologies (such as waveguide, microstrip line, dielectric resonator, and superconductive material), and combined lumped/distributed circuits—for illustration purposes, in FIG. 37*a* resonances 18 and 22 have been represented by series lumped-element inductor-capacitor-resistor (LCR) resonators with resonant frequencies $f_1=1/(2\pi\sqrt{L(C_1+C_{v1})})$ and $f_2=1/(2\pi\sqrt{L(C_2+C_{v2})})$ and unloaded quality factors $Q_{u1}=2\pi f_1L/R$ and $Q_{u2}=2\pi f_2L/R$, respectively. Phase shifter 16 can also be realized in any of a variety of ways—the simplest being a transmission line with characteristic impedance $Z_o$ and electrical length $\phi$ at a frequency $f_o$ between $f_1$ and $f_2$.

Optionally, bandpass filter 17 (and consequently notch filter 10) in FIG. 37*a* can be made tunable by making some or all of its constituent resonances and/or couplings tunable. The variable shunt admittances 27 and 29 of FIG. 39 are implemented as mechanically or electrically tunable variable capacitances 27 and 29 in FIG. 37*a*, which are shown optionally coupled by direct connection to resonances 18 and 22, respectively.

For filter 10 in FIG. 37*a* a minimum fractional 3 dB stopband bandwidth of about $$bW_{3dB}=2/Q_u, \tag{4}$$

an essentially infinite attenuation at $f_o$, and an essentially infinite return loss at all frequencies are realized by choosing $$f_o=f_1=f_2,\ Q_u=Q_{u1}=Q_{u2},\ \phi=90°,\ n=\sqrt{2R/Z_o},\ k=1/Q_u, \text{ and } Z_o=R_S=R_L, \tag{5}$$

where $R_S$ and $R_L$ are the source and load impedances at ports 12 and 14, respectively. In this case, the general fractional bandwidth for a stopband band-edge attenuation value $L_S$ (in dB) is approximately $$bw=2/(Q_u\sqrt{10^{L_S/10}-1}), \tag{6}$$

while, for a traditional first-order reflective bandstop filter with an attenuation $L_o$ at center frequency $f_o$, it is $$bw_{trad}=\sqrt{10^{L_o/10}-10^{L_S/10}}/(Q_u\sqrt{10^{L_S/10}-1}). \tag{7}$$

Figure 1:
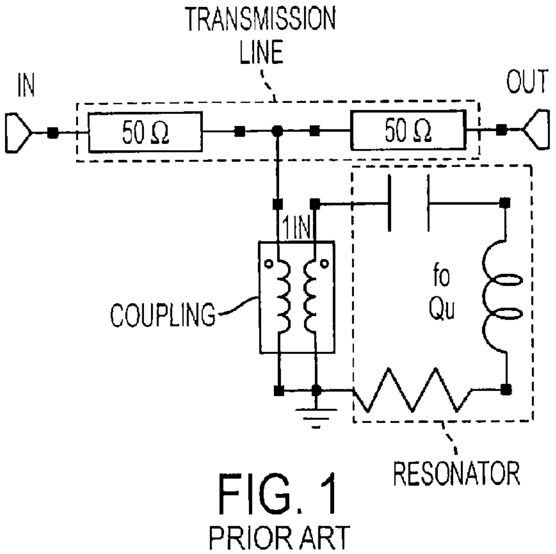
FIG. 1 PRIOR ART
FIG. 1 is a circuit schematic of a conventional notch filter according to the prior art.
Figure 2A:
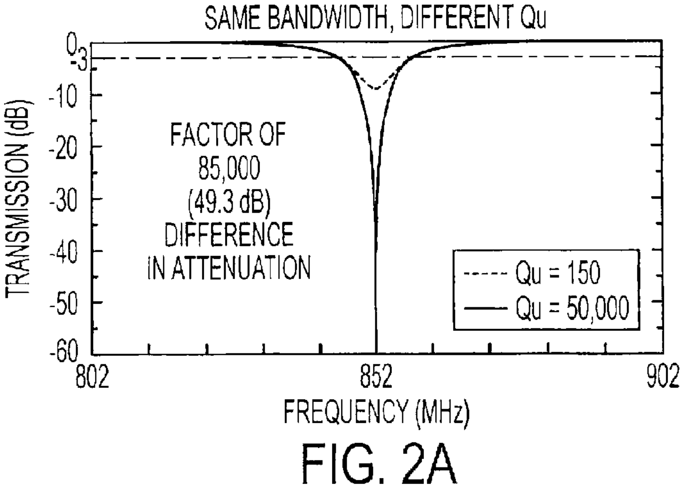
FIG. 2A PRIOR ART
FIG. 2*a* is a graph illustrating the effect of unloaded Q on attenuation in conventional notch filters according to the prior art.
Figure 2B:
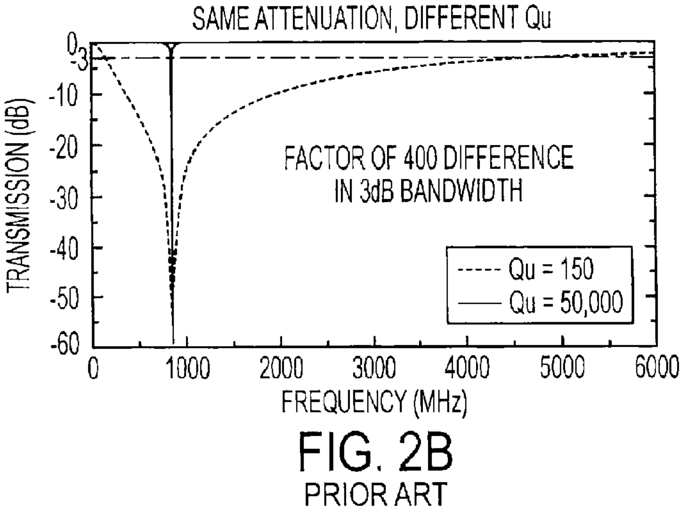
FIG. 2B PRIOR ART
FIG. 2*b* is a graph illustrating the effect of unloaded Q on bandwidth in conventional notch filters according to the prior art.
Figure 3A:
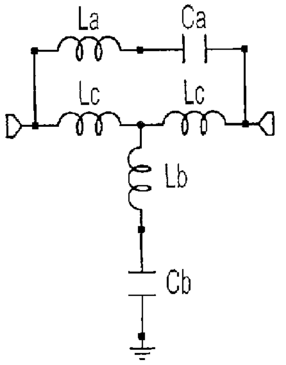
FIG. 3A PRIOR ART
FIG. 3*a* is a circuit schematic of a "bridged-T" notch filter according to the prior art.
Figure 3B:
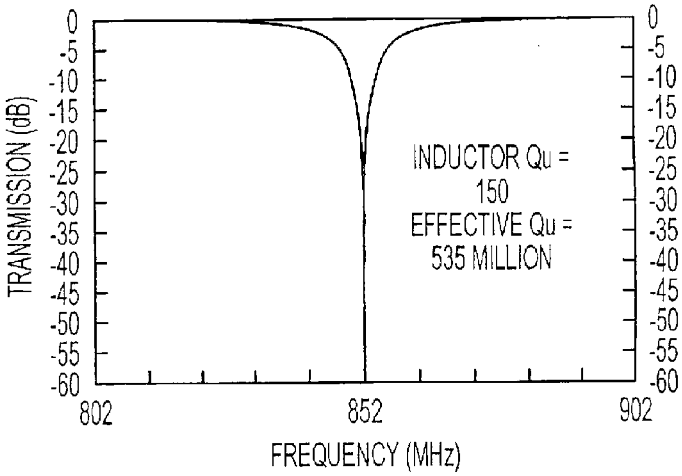
FIG. 3B PRIOR ART
FIG. 3*b* is a graph illustrating a representative transmission response of the filter of FIG. 3*a*.
Figure 4A:
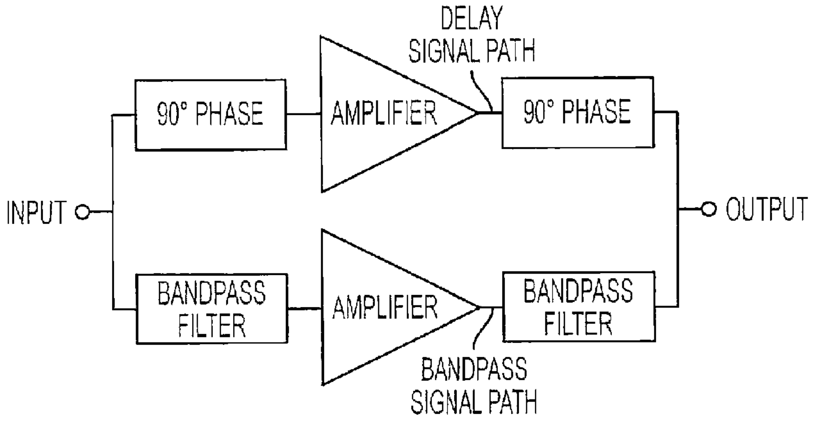
FIG. 4A PRIOR ART
FIG. 4*a* is a diagram of a channelized active notch filter according to the prior art.
Figure 4B:
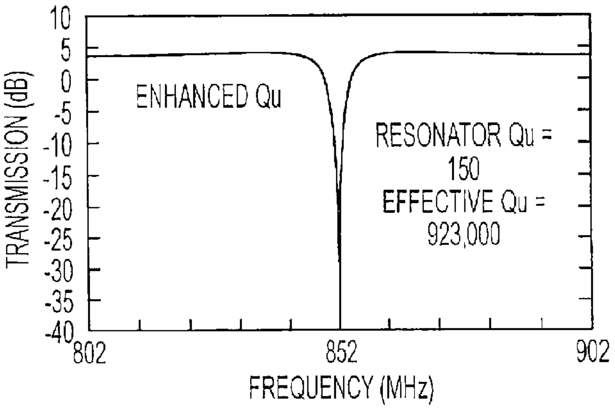
FIG. 4B PRIOR ART
FIG. 4*b* is a graph illustrating a representative transmission response of the filter of FIG. 4*a*.
Figure 6:
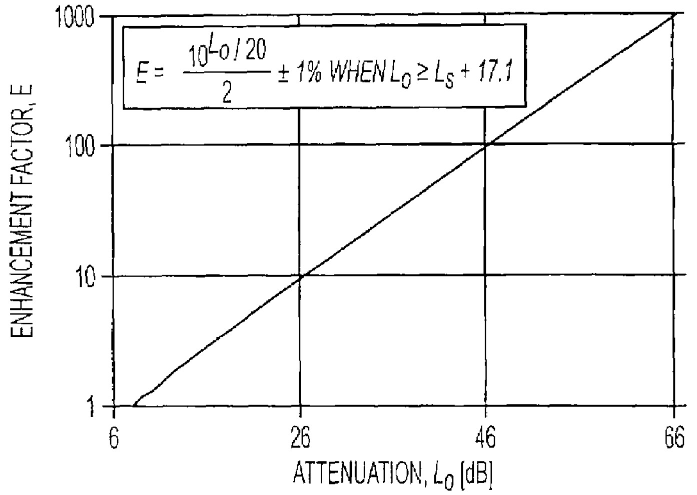
FIG. 6 is a graph illustrating the fractional-bandwidth enhancement factor versus minimum attenuation at the notch center frequency of an optimum (minimum-fractional-bandwidth) first-order absorptive notch filter according to the invention as compared with a conventional notch as in FIG. 1.

Thus, a fractional-bandwidth (or selectivity or effective $Q_u$) enhancement factor that quantifies advantages of absorptive notch filter 10 of FIG. 37*a* over the conventional notch filter of FIG. 1 is defined as $$E=bw_{trad}/bw=\sqrt{10^{L_o/10}-10^{L_S/10}}/2, \tag{8}$$

and is graphed in FIG. 6.

Figure 5C:
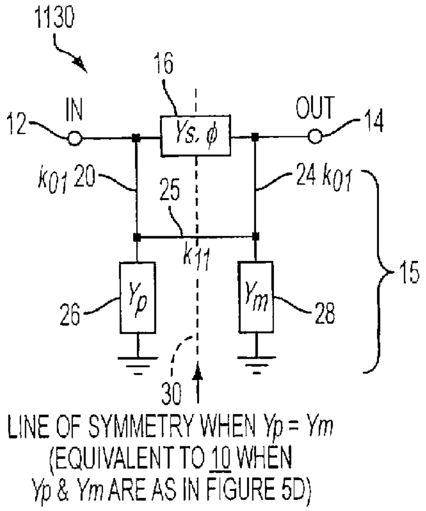
FIG. 5*c* is an alternative equivalent circuit schematic of an arbitrary-order absorptive notch filter according to the invention.

Absorptive notch filter 1130 of FIG. 5*c* is another representative equivalent circuit embodiment of filter 1120 of FIG. 40. In FIG. 5*c*, frequency selective network 15 is comprised of coupling elements 20 and 24, as represented by ideal (frequency invariant) admittance inverters of admittance $k_{01}$ and 90° frequency-invariant phase shift, generalized one-port filter networks 26 and 28 with potentially differing and optionally tunable driving-point admittances $Y_p$ and $Y_m$, and coupling element 25, as represented by an ideal admittance inverter of admittance $k_{11}$ and 90° frequency-invariant phase shift. Admittance inverters 20 and 24 couple one-port filter networks 26 and 28 to input port 12 and output port 14, respectively, and admittance inverter 25 couples 26 ($Y_p$) to 28 ($Y_m$). Ports 12 and 14 are additionally connected by all-pass phase shift network 16 of admittance $Y_S$ and frequency-invariant phase shift $\phi$.

While an accurate analysis of a frequency agile filter would require frequency dependent representations of couplings and phase shifts in its circuit model, including frequency dependence leads to more complicated mathematical results from which it is more difficult to discern the main performance characteristics and principal design guidelines. Consequently, frequency invariant couplings and phase shifts, such as the ideal admittance inverters and phase shift element in FIG. 5*c*, will be assumed in the analyses to follow. Both structurally symmetric and asymmetric versions of a "first-order" embodiment of circuit 1130 of FIG. 5*c* will be considered in order to highlight particular unique characteristics of the transmission network 10 of FIGS. 5*a*, 39, and 37*a*.

A. Structurally Symmetric Absorptive Notch Filter Analysis

Figure 5D:
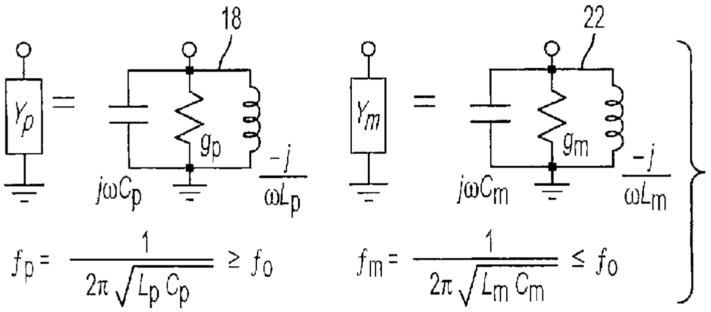
FIG. 5*d* is a circuit schematic definition of components in FIG. 5*c* that converts the circuit of FIG. 5*c* into an equivalent circuit of an absorptive-pair notch filter according to the invention.

To simplify the "arbitrary-order" notch filter 1130 of FIG. 5*c* to a "first-order" notch filter 10, as in FIGS. 5*a*, 39, and 37*a*, the driving-point admittances of the one-port filter networks 26 and 28 can be represented by the corresponding lossy lumped-element resonances 18 and 22 of FIG. 5*d*. Thus, the idealized "first-order" structurally symmetric absorptive notch filter 10 is as shown in FIGS. 5*c-d*, with $$Y_r=Y_p=Y_m=g(1+jQ_u\alpha) \tag{9}$$

where $$C_r=C_p=C_m,\ L_r=L_p=L_m, \text{ and } g=g_p=g_m,$$

$$Q_u=2\pi f_oC_r/g,$$

$$\alpha=(f/f_o-f_o/f), \text{ and}$$

$$f_o=1/(2\pi\sqrt{L_rC_r}).$$

Reciprocal symmetric networks may be analyzed using even- and odd-mode analysis. Assuming equal source and load impedances, $R_S=R_L=1/Y_t$, the two-port scattering parameters, $S_{11}$ and $S_{21}$, are given by $$S_{11}=\frac{1-Y_oY_e/Y_t^2}{(1+Y_o/Y_t)(1+Y_e/Y_t)} \tag{10}$$

$$S_{21}=\frac{(Y_o-Y_e)/Y_t}{(1+Y_o/Y_t)(1+Y_e-Y_t)}. \tag{11}$$

Figure 7A:
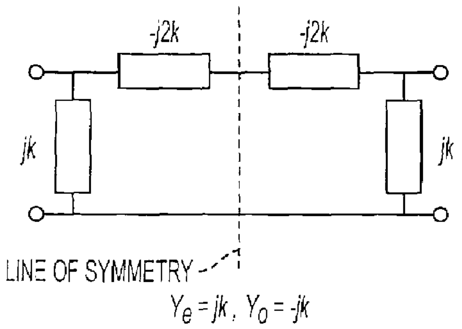
FIG. 7*a* is a schematic of a symmetric Π network for an ideal admittance inverter of admittance k as appears in FIG. 5*c*.
Figure 7B:
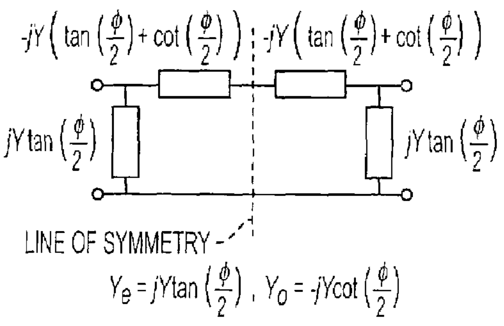
FIG. 7*b* is a schematic of a symmetric Π network for an ideal phase shift element of characteristic admittance Y and phase shift $\phi$ as appears in FIG. 5*c*.

The even- and odd-mode admittances, $Y_e$ and $Y_o$, of 1130 and 10 are determined by applying an open circuit and a short circuit along the line of symmetry 30 of the network 1130 in FIG. 5*c*. The phase shift element $\phi$ 16 and the admittance inverter $k_{11}$ 25 can be represented as a Π network to facilitate dividing them along the line of symmetry 30, as shown in FIG. 7*a* for ideal admittance inverter 25 and in FIG. 7*b* for ideal phase shifter 16. Although the phase shift element φ 16 could be implemented in a variety of ways, such as by a parallel-coupled-line phase shifter or a lowpass filter, for simplicity it is represented by a transmission line of characteristic admittance $Y_S$ and electrical length φ at the bandstop filter center frequency $f_o$. The even- and odd-mode admittance, $Y_e$ and $Y_o$, of "first-order" absorptive notch filter 10 of FIGS. 5*c-d* are then given by $$Y_e = jY_s \tan\left(\frac{\phi}{2}\right) + \frac{k_{01}^2}{Y_r + jk_{11}} \tag{12}$$

$$Y_o = -jY_s \tan\left(\frac{\phi}{2}\right) + \frac{k_{01}^2}{Y_r - jk_{11}}. \tag{13}$$

1) Transmission Response

The transmission response can be determined most easily using the highpass prototype of the notch filter 10, which is described by (10) through (13) with $$Y_r = g(1 + j\omega' q_u), \tag{14}$$

where ω' is the normalized highpass prototype radian frequency scale, $q_u = \omega_1' c/g$ is the unloaded Q of the shunt admittances of the highpass prototype, and $\omega_1' = 1$ is defined as the band edge radian frequency at which the attenuation is $L_s$. The transmission poles and zeros of the highpass prototype lie in the complex s'-plane, where $s' = \sigma' + j\omega'$. The bandstop filter response is recovered from the highpass prototype by applying the conventional transformation $$\omega' \rightarrow \alpha/\gamma \tag{15}$$

with α as given in (9), $\gamma = (f_2 - f_1)/f_o$, and $f_o^2 = f_2 f_1$, which transforms a highpass prototype stopband centered at ω'=0 into a bandstop filter stopband centered at $f = f_o$.

Using (11)-(14), $S_{21}$ in terms of s'=jω' is found to be $$S_{21}(j\omega') = e^{-j\phi} \frac{(s' - s'_{z1})(s' - s'_{z2})}{(s' - s'_{p1})(s' - s'_{p2})} \tag{16}$$

with transmission zeros at $$s'_{z1} = -\left(\frac{1}{q_u}\right)\left(1 + \frac{1}{gY_t}\sqrt{Y_t k_{11}(k_{01}^2 \sin[\phi] - Y_t k_{11})}\right) \tag{17}$$

$$s'_{z2} = -\left(\frac{1}{q_u}\right)\left(1 - \frac{1}{gY_t}\sqrt{Y_t k_{11}(k_{01}^2 \sin[\phi] - Y_t k_{11})}\right) \tag{18}$$

and transmission poles at $$s'_{p1} = -(k_{01}^2(1-\cos(\phi)) + 2gY_t + j(k_{01}^2 \sin(\phi) - 2k_{11}Y_t))/2gY_t q_u \tag{19}$$

$$s'_{p2} = -(k_{01}^2(1+\cos(\phi)) + 2gY_t - j(k_{01}^2 \sin(\phi) - 2k_{11}Y_t))/2gY_t q_u \tag{20}$$

The squared magnitude of the transfer function, $|S_{21}|^2$, is $$|S_{21}(j\omega')|^2 = \frac{(s' - s'_{z1})(s' + s'^{*}_{z1})(s' - s'_{z2})(s' + s'^{*}_{z2})}{(s' - s'_{p1})(s' + s'^{*}_{p1})(s' - s'_{p2})(s' + s'^{*}_{p2})} \tag{21}$$

where the asterisks (*) indicate the complex conjugate. As is usual, (21) can be plotted on a decibel scale using $$10 \log_{10}(|S_{21}(j\omega')|^2)[\text{dB}] \tag{22}$$

Figure 8:
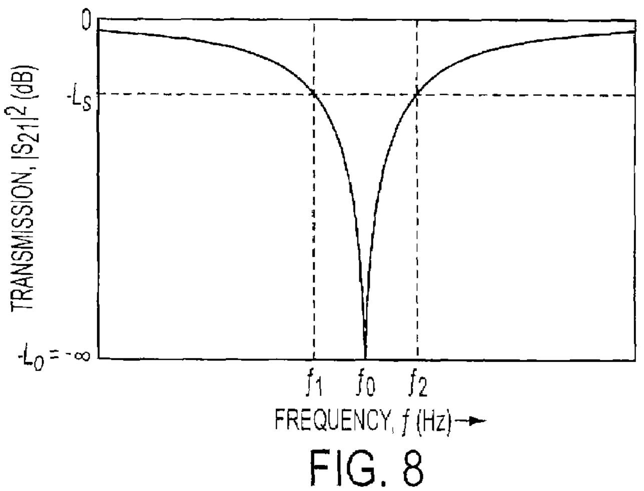
FIG. 8 is a graph illustrating a representative transmission response of the symmetric absorptive notch filter as in FIGS. 5*c-d* according to the invention.

Referring to FIG. 8, the primary design objective for the absorptive notch filter is:

$$|S_{21}|_{f=f_o}^2 = 0 (\text{i.e., } L_o = -10\log(|S_{21}|_{f=f_o}^2) = \infty \text{dB}). \tag{23}$$

Using (9), (11), (12), and (13), the numerator of $S_{21}(f_o)$ is $$-j2Y_t^2 f_o^4 \csc(\phi)(g^2 + k_{11}^2 - k_{01}^2 k_{11} \sin(\phi)/Y_t). \tag{24}$$

Equating (24) to zero and solving provides the following design criteria that guarantees that the structurally symmetric "first-order" absorptive notch filter 10 of FIGS. 5*c-d* will have infinite attenuation at $f_o$:

$$k_{01} = \sqrt{Y_t \frac{g^2 + k_{11}^2}{k_{11}\sin(\phi)}} \tag{25}$$

Using (16) and (25), $S_{21}$ of the highpass prototype in terms of s'=jω' for a symmetric or an asymmetric transmission response with infinite attenuation at ω'=0 is $$S_{21}(j\omega') = e^{-j\phi} \frac{s'(s' - s'_z)}{(s' - s'_{p1})(s' - s'_{p2})} \tag{26}$$

with real-axis transmission zeros at s'=0 and $$s_z' = -2/q_u \tag{27}$$

and complex transmission poles at $$s_{p1}' = -((2gk_{11} + (g^2 + k_{11}^2)\tan(\phi/2)) + j(g^2 - k_{11}^2))/2gk_{11}q_u \tag{28}$$

$$s_{p2}' = -((2gk_{11} + (g^2 + k_{11}^2)\cot(\phi/2)) - j(g^2 - k_{11}^2))/2gk_{11}q_u. \tag{29}$$

From (28) and (29), it is apparent that the criteria for realizing a symmetric transmission response is $$k_{11} = g, \tag{30}$$

for which the poles move to the real axis and become $$s_{p1}' = -(1 + \tan(\phi/2))/q_u \tag{31}$$

$$s_{p2}' = -(1 + \cot(\phi/2))/q_u. \tag{32}$$

The general transmission response given by (26)-(29) will be asymmetric for $k_{11} \neq g$, will have a lowpass skew for $k_{11} > g$, and will have a highpass skew for $k_{11} < g$. And, if $\phi = \pi/2$ and (30) is satisfied, then (25) becomes $$k_{01} = \sqrt{2gY_t} \tag{33}$$

$s'_{p1}=s'_{p2}=s'_z$, the filter order is halved, and (26) becomes $$S_{21}(j\omega') = -j\frac{s'}{s'+2/q_u}. \quad (34)$$

Note that if $\phi=\pi/2$ and $k_{11}\neq g$ then (26) simplifies to $$S_{21}(j\omega') = -j\frac{s'(s'-s'_z)}{(s'-s'_{p1})(s'-s'_{p2})} \quad (35)$$

with the complex transmission poles simplifying to $$s_{p1}'=-((g+k_{11})^2+j(g^2-k_{11}^2))/(2gk_{11}q_u) \quad (36)$$

$$s_{p2}'=-((g+k_{11})^2-j(g^2-k_{11}^2))/(2gk_{11}q_u). \quad (37)$$

The effect of $\phi$ on the transmission characteristics can be determined from the squared magnitude of (18). When the criteria that allow (26) to simplify to (34) are satisfied it is easily shown that $$|S_{21}(j\omega')|^2=-S_{21}(j\omega')S_{21}(-j\omega'). \quad (38)$$

Otherwise, for the highpass prototype obeying (25), $$|S_{21}|^2 = \frac{s'^2(s'^2-s'^2_z)}{(s'-s'_{p1})(s'+s'^*_{p1})(s'-s'_{p2})(s'+s'^*_{p2})} \quad (39)$$

where the asterisks (*) indicate the complex conjugate and $s'_{p1}$ and $s'_{p2}$ are as shown in (28) and (29). To simplify matters, assume the symmetric response criteria, (30), is satisfied so that, for $s'=j\omega'$, (39) becomes $$|S_{21}(j\omega')|^2=s'^2(s'^2-s'^2_z)/(s'^2-s'^2_{p1})(s'^2-s'^2_{p2}) \quad (40)$$

where $s'_{p1}$ and $s'_{p2}$ are as shown in (31) and (32). For a frequency $\omega'_S$ at which the band edge attenuation is $L_S$, (40) becomes $$|S_{21}(j\omega'_S)|^2 = \frac{\omega'^2_S\left(\omega'^2_S+\left(\frac{2}{q_u}\right)^2\right)}{\left(\omega'^2_S+\left(\frac{1+\tan(\phi/2)}{q_u}\right)^2\right)\left(\omega'^2_S+\left(\frac{1+\cot(\phi/2)}{q_u}\right)^2\right)} = 10^{-L_S/10} \quad (41)$$

Solving (41) for $\omega'_S$ gives the symmetric-response prototype bandwidth $b=\omega'_S$ as a function of $L_S$, $q_u$, and $\phi$:

$$b = \pm\frac{1}{q_u}\sqrt{\frac{2}{A-1}\left(c(c+1)-A\pm\sqrt{A^2+c(A+c+1)(c^2-1)}\right)} \quad (42)$$

where $A=10^{L_S/10}$ and $c=\csc(\phi)$. To resolve the sign ambiguity within the square root in (42), assume for a moment that $\phi=\pi/2$ so that c=1 and, for choices of {+, −} for this sign, (42) simplifies to $$b = \left\{\pm\frac{2}{q_u}\sqrt{\frac{1}{A-1}},\ \pm j\frac{2}{q_u}\right\} \quad (43)$$

from which it is clear that for a positive real bandwidth b, $$b = \frac{1}{q_u}\sqrt{\frac{2}{A-1}\left(c(c+1)-A+\sqrt{A^2+c(A+c+1)(c^2-1)}\right)} \quad (44)$$

and, setting A=2, the 3 dB bandwidth is $$b = \frac{1}{q_u}\sqrt{2\left(c(c+1)-2+\sqrt{4+c(c+3)(c^2-1)}\right)} \quad (45)$$

Using (36), the criteria for minimum bandwidth can be determined by equating the partial derivative of b with respect to $\phi$ to zero and solving for $\phi$. Although $\partial b/\partial\phi$ is fairly complicated, it can be shown to be proportional to a simple function of $\phi$, $$\frac{\partial b}{\partial \phi} \propto \cot(\phi)\csc(\phi), \quad (46)$$

which is equal to zero for $$\phi = \phi_{b_{\min}} = \pm\frac{\pi}{2}+2k\pi \quad (47)$$

where k is any integer. Applying (47) to (44), c becomes 1 and the minimum bandwidth for band-edge attenuation $L_S$ is $$b = \frac{2}{q_u}\sqrt{\frac{1}{A-1}}, \quad (48)$$

as in (6), and, for A=2, the minimum 3 dB bandwidth is $$b = \frac{2}{q_u}, \quad (49)$$

as in (4).

Figure 9:
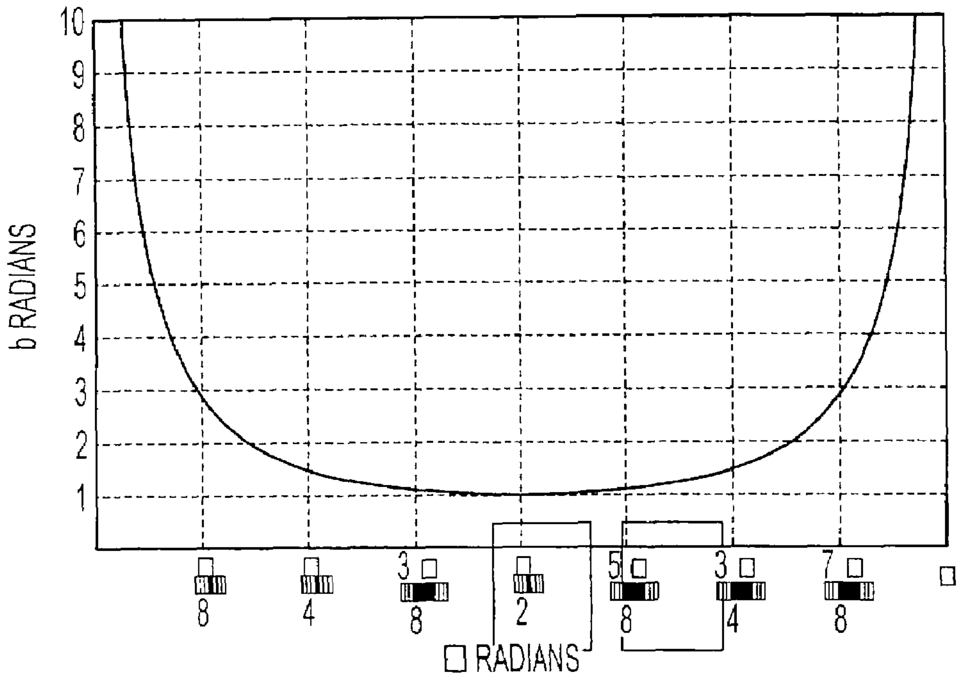
FIG. 9 is a graph illustrating the normalized highpass prototype bandwidth b as a function of $\phi$ assuming $L_S$=3.0103 dB and $q_u$=2 for the symmetric absorptive notch filter as in FIGS. 5*c-d* according to the invention.

Using (45), FIG. 9 shows the dependence of the 3 dB bandwidth on $\phi$, arbitrarily assuming $q_u=2$. The minimum bandwidth is unity as expected from (49). Unlike prior absorptive microwave notch filters that depend on varying $q_u$ to adjust bandwidth, the bandwidth of this notch filter can also be specified by $\phi$.

A conventional first-order bandstop filter has a finite stopband attenuation $L_o$ at its center frequency $f_0$ and the bandwidth $b_c$ of its highpass prototype for a band-edge attenuation of $L_S$ is $$b_c = \frac{1}{q_u}\sqrt{\frac{10^{L_o/10} - A}{A - 1}}, \tag{50}$$

as in (7), where $A=10L^{S/10}$ as before and $L_o$ and $L_S$ are in dB. The relative bandwidth (or selectivity or effective $Q_u$) enhancement factor E, defined as the ratio of (50) to (48), is graphed in FIG. 6 and is given by $$E=b_c/b=\sqrt{10^{L_o/10}-10^{L_S/10}}/2, \tag{51}$$

as in (8). Note that the absorptive notch filter 10 of FIGS. 5*a*, 39, 37*a*, and 5*c-d* is capable of orders of magnitude better selectivity than the conventional notch filter of FIG. 1 when stopband attenuations $L_o$ in excess of 26 dB are required.

2) Reflection Response

Passive reciprocal absorptive bandstop filters, such as 1130 and 10, having little or no reflection at any frequency act as frequency-invariant impedances and are potentially helpful in minimizing amplifier stability problems when attached to either port of an amplifier. Such absorptive notch filters can also be cascaded with themselves, as in composite filter 1200 of FIG. 38*a*, or other components such that the transmission responses are additive and non-interacting.

Using (10) and (12)-(14), the numerator of $S_{11}(\omega')$ is $$k_{01}^2\csc(\phi)(-2k_{11}Y_t+2gY_t(\omega' q_u-j)\cos(\phi)+k_{01}^2\sin(\phi)), \tag{52}$$

from which it is apparent that $S_{11}$ will be zero, and there will be no reflection at any frequency $\omega'$ if both $$\phi=\pi/2 \text{ and } k_{01}=\sqrt{2k_{11}Y_t}. \tag{53}$$

If the infinite attenuation criteria (25) is applied to (52), the numerator of $S_{11}(\omega')$ becomes $$(g^2+k_{11}^2)(g^2-k_{11}^2+2gk_{11}(\omega' q_u-j)\cos(\phi))\csc^2(\phi), \tag{54}$$

so that both (53) and (30) must be satisfied to have $S_{11}=0$ at all frequencies. Consequently, the same design criteria that result in infinite attenuation and minimum stopband bandwidth (48) also result in no reflection. Note that the criteria for no reflection, (53), is independent of the admittances $Y_p$ 26 and $Y_m$ 28—a potentially useful property for switched bandstop filter applications.

While non-reflective absorptive bandstop filters are useful in some instances, reflective absorptive bandstop filters are useful as well, since individual filter stages in a cascade can interact to improve selectivity, as is the case in traditional reflective bandstop filters. Such a filter is illustrated by composite filter 1250 of FIG. 38*b*, where phase shift networks 1252 connect the individual absorptive notch filter stages 1100 to assist in and modify their interaction.

Using (10) and (12)-(14), $S_{11}$ in terms of $s'=j\omega'$ is $$S_{11}(j\omega') = -e^{-j\phi}\cos(\phi)\left(\frac{k_{01}^2}{gY_t q_u}\right)\frac{(s'-s'_{rz})}{(s'-s'_{p1})(s'-s'_{p2})} \tag{55}$$

with a reflection zero at infinity and at $$s'_{rz} = -\left(\frac{1}{q_u}\right)\left(1 + j\frac{1}{2gY_t}(k_{01}^2\sin[\phi] - 2Y_t k_{11})\right) \tag{56}$$

and reflection poles given by (19) and (20). The squared magnitude of the reflection, $|S_{11}|^2$, is given by $$|S_{11}(j\omega')|^2 = -\left(\frac{k_{01}^2\cos(\phi)}{gY_t q_u}\right)^2\frac{(s'-s'_{rz})(s'+s'^*_{rz})}{(s'-s'_{p1})(s'+s'^*_{p1})(s'-s'_{p2})(s'+s'^*_{p2})}. \tag{57}$$

Using (55) and (25), $S_{11}$ in terms of $s'=j\omega'$ for a symmetric or an asymmetric transmission response is found to be $$S_{11}(j\omega') = e^{-j\phi}\cot(\phi)\left(\frac{g^2+k_{11}^2}{2gk_{11}}\right)s'_z\frac{(s'-s'_{rz})}{(s'-s'_{p1})(s'-s'_{p2})} \tag{58}$$

where $s'_z$, $s'_{p1}$, and $s'_{p2}$ are as given in (27)-(29) and $$s'_{rz} = -\frac{s'_z}{2}\left(1 + j\frac{g^2-k_{11}^2}{2gk_{11}\cos(\phi)}\right). \tag{59}$$

When design criteria (30) is satisfied, resulting in a symmetric transmission response, (58) simplifies to $$S_{11}(j\omega') = e^{-j\phi}\cot(\phi)s'_z\frac{(s'-s'_{rz})}{(s'-s'_{p1})(s'-s'_{p2})} \tag{60}$$

with $s'_{p1}$ and $s'_{p2}$ given by (31) and (32) and $s'_{rz}=-s'_z/2$. And, as stated before, if $\phi=\pi/2$ in (60) then $S_{11}(j\omega')=0$. However, if $k_{11}\neq g$ but $\phi=\pi/2$, then (58) simplifies to $$s_{11}(j\omega') = -\left(\frac{g^4-k_{11}^4}{2g^2k_{11}^2}\right)\left(\frac{1}{q_u^2}\right)\frac{1}{(s'-s'_{p1})(s'-s'_{p2})}. \tag{61}$$

The effect of $\phi$ on the reflection characteristics can be determined from the squared magnitude of (58). For the general highpass prototype obeying (25), $$|s_{11}|^2 = \cot^2(\phi)\left(\frac{g^2-k_{11}^2}{2gk_{11}}\right)^2 s'^2_z\frac{(-1)(s'-s'_{rz})(s'+s'^*_{rz})}{(s'-s'_{p1})(s'-s'^*_{p1})(s'-s'_{p2})(s'-s'^*_{p2})} \tag{62}$$

where the asterisks (*) indicate the complex conjugate and $s'_{p1}$ and $s'_{p2}$ are as shown in (28) and (29) and $s'_{rz}$ is from (59). Assuming that the symmetric response criteria (30) is satisfied, (62) becomes $$|s_{11}(j\omega')|^2 = \cot^2(\phi)s'^2_z\frac{(-1)(s'^2-(s'_z/2)^2)}{(s'^2-s'^2_{p1})(s'^2-s'^2_{p2})}, \tag{63}$$

where $s'_{p1}$ and $s'_{p2}$ are as shown in (31) and (32). For a frequency $\omega'_R$ at which the band edge return loss is $L_R$ (dB), (63) becomes $$|s_{11}(j\omega'_R)|^2 = \frac{\left(\frac{2}{q_u}\right)^2\left(\omega_R'^2+\left(\frac{1}{q_u}\right)^2\right)\cot^2(\phi)}{\left(\omega_R'^2+\left(\frac{1+\tan(\phi/2)}{q_u}\right)^2\right)\left(\omega_R'^2+\left(\frac{1+\cot(\phi/2)}{q_u}\right)^2\right)} = 10^{-L_R/10} \tag{64}$$

Solving (64) for $\omega'_R$ gives the symmetric-response prototype return loss bandwidth $b_R=\omega'_R$ as a function of $L_R$, $q_u$, and $\phi$:

$$b_R = \frac{\sqrt{2}}{q_u}\sqrt{B(c^2-1)-c(c+1)+\sqrt{(c^2-1)((B-1)^2c^2-2(B-1)c-B^2+B+1)}} \tag{65}$$

where $B=10^{L_R/10}$, $c=\csc(\phi)$, $$k\pi < \phi < \csc^{-1}\left(\frac{1+\sqrt{B(B-1)}}{B-1}\right)+k\pi \tag{66}$$

or $$(k+1)\pi-\csc^{-1}\left(\frac{1+\sqrt{B(B-1)}}{B-1}\right) < \phi < (k+1)\pi \tag{67}$$

for any nonnegative integer k, $$b_R > \sqrt{2}/q_u \text{ for any } L_R, \tag{68}$$

and $b_R\rightarrow\sqrt{2}/q_u$ and $\phi\rightarrow(2k+1)\pi/2$ as $L_R\rightarrow\infty$. The minimum stopband return loss, $L_{R(min)}$, is found to be $$L_{R(\min)} = -10\log\left(\frac{4\sqrt{5+4c}\cot^2(\phi)}{\left(\sqrt{5+4c}+\cot\left(\frac{\phi}{2}\right)\left(2+\cot\left(\frac{\phi}{2}\right)\right)\right)\left(\sqrt{5+4c}+\tan\left(\frac{\phi}{2}\right)\left(2+\tan\left(\frac{\phi}{2}\right)\right)\right)}\right) \tag{69}$$

at the highpass prototype frequencies, $\pm\omega'_{R(min)}$, $$\omega'_{R(\min)} = \frac{1}{q_u}\sqrt{\sqrt{5+4c}-1}. \tag{70}$$

Unlike the conventional notch filter, no simple relationship has been found between the attenuation and return loss at a given frequency for an arbitrary $\phi$.

3) Group Delay

Group delay $D(\omega')$ is derived from the n finite poles $p_i$ and m finite zeros $z_j$ of $S_{21}$ in the usual way:

$$D(\omega') = \sum_{j=1}^{m}\frac{z_j}{\omega^2+z_j^2}-\sum_{i=1}^{n}\frac{p_i}{\omega^2+p_i^2}. \tag{71}$$

For a symmetric transmission response, the use of (27), (31), and (32) lead to the following group delay:

$$D(\omega') = \frac{1}{q_u}\left(\frac{1+\tan\left(\frac{\phi}{2}\right)}{\omega^2+\left(\frac{1+\tan\left(\frac{\phi}{2}\right)}{q_u}\right)^2}+\frac{1+\cot\left(\frac{\phi}{2}\right)}{\omega^2+\left(\frac{1+\cot\left(\frac{\phi}{2}\right)}{q_u}\right)^2}-\frac{2}{\omega^2+\left(\frac{2}{q_u}\right)^2}\right). \tag{72}$$

Figure 10:
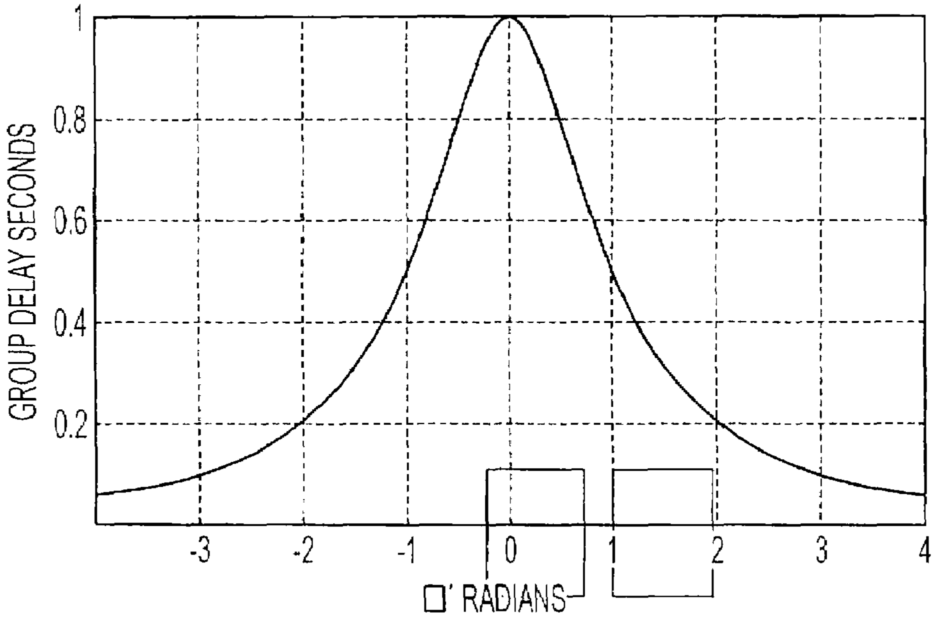
FIG. 10 is a graph illustrating the highpass prototype group delay as calculated from (73) with $q_u$=2 for the symmetric absorptive notch filter as in FIGS. 5*c-d* according to the invention.

And, when $\phi=\pi/2$, (72) simplifies to $$D(\omega') = \frac{2}{q_u}\left(\omega^2+\left(\frac{2}{q_u}\right)^2\right)^{-1}, \tag{73}$$

which is plotted in FIG. 10 for $q_u=2$.

B. Structurally Asymmetric Absorptive Notch Filter

Figure 5E:
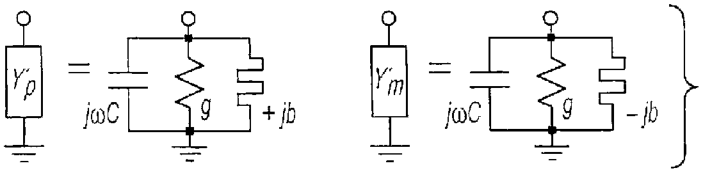
FIG. 5*e* is a circuit schematic definition of components in FIG. 5*c* that converts the circuit of FIG. 5*c* into a highpass prototype of an absorptive-pair notch filter according to the invention.

The idealized structurally asymmetric absorptive notch filter 10 is as shown in FIGS. 5*c-d*, but with $Y_p\neq Y_m$ and with no line of symmetry. For convenience, its asymmetric highpass prototype is examined. The first-order asymmetric highpass prototype is; represented by FIG. 5*c*, with 26 $Y_p=Y_p'=g+j(wc+b)$ and 28 $Y_m=Y_m'=g+j(wc-b)$ as shown in FIG. 5*e*, where b is a frequency invariant susceptance, g is a conductance, and c is a capacitance. Finding $S_{21}$ via ABCD parameter analysis of the highpass prototype, setting $S_{21}(0)=0$, and solving for coupling (i.e. inverter admittance) $k_{01}$ readily demonstrates that, for an arbitrary impedance match, the highpass prototype has infinite attenuation at $\omega'=0$ provided that $$k_{01} = \sqrt{Y_t\frac{b^2+g^2+k_{11}^2}{k_{11}\sin\phi}}. \tag{74}$$

Note that (74) guarantees infinite attenuation at $\omega'=0$ for both asymmetric and symmetric transmission characteristics. Also, it is apparent from (74) that b can be used to adjust for changes in g, $k_{11}$, $\phi$, $k_{01}$, and $Y_t$ that might occur due to changes in the operating environment or requirements.

When the highpass prototype is transformed to a bandstop filter, $Y_p'$ and $Y_m'$ transform into resonators and b effectively becomes a frequency offset between the resonant frequencies of the resonators. Hence, it becomes possible to tune the two resonant frequencies to frequencies offset above and below the notch center frequency to maintain notch attenuation while other filter parameters (such as g, $k_{11}$, $\phi$, $k_{01}$ and $Y_t$) are changing. This property is a crucial aspect of the invention, and is demonstrated in the varactor-tuned filter examples and figures discussed below.

C Varactor-Tuned Absorptive Notch Filter Examples

Figure 37B:
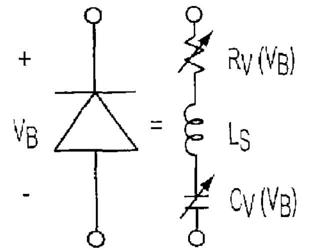
FIG. 37*b* is a schematic of an equivalent circuit for a varactor diode.
Figure 37C:
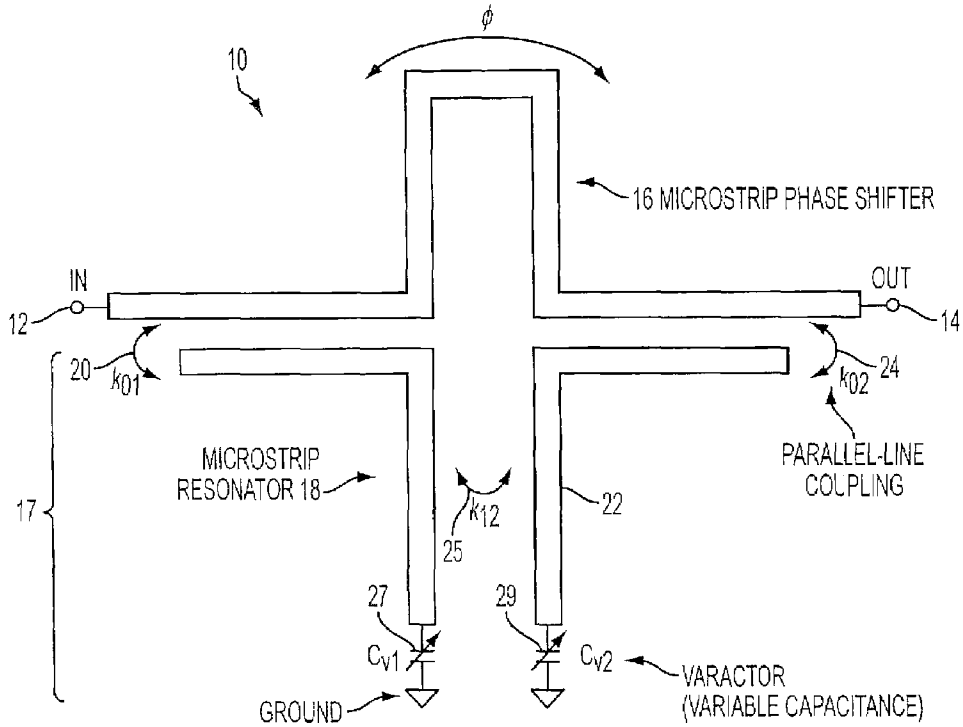
FIG. 37*c* is a schematic layout of a microstrip implementation of a tunable first-order absorptive-pair notch filter according to the invention.

A microstrip realization of the "first-order" absorptive notch filter 10 of FIGS. 5*a*, 39, 37*a*, and 5*c-d* is illustrated in FIG. 37*c*, where input port 12 is connected to output port 14 by a edge-coupled parallel-microstrip-line phase shifter 16, as well as by second-order microstrip bandpass filter 17, which is comprised of edge-coupled parallel-microstrip-line couplings 20, 24, and 25, microstrip transmission line resonators 18 and 22, and optional mechanically or electrically variable capacitances, i.e., varactors, 27 and 29. Microstrip resonators 18 and 22 are coupled to ports 12 and 14 by edge-coupled parallel-microstrip-line couplings 20 and 24, respectively, are coupled to each other by edge-coupled parallel-microstrip-line coupling 25, and are optionally directly connected to varactors 27 and 29 at the ends of microstrip resonators 18 and 22 farthest from ports 12 and 14, respectively. Optional varactors 27 and 29 enable mechanical or electrical tuning of the resonant frequencies of microstrip resonators 18 and 22 and thereby enable tuning of the frequency $f_o$ of maximum stopband attenuation of absorptive notch filter 10. However, varactors 27 and 29 should only be attached to resonators 18 and 22 if such tunability is required, as they tend to degrade the unloaded Q of resonator 18 and 22 as well as the signal distortion and power handling properties of filter 10.

Varactors can be realized in a wide variety of ways (diode varactors, microelectromechanical varactors (MEM varactors), switch selected capacitor arrays, ferroelectric varactors, etc.) which have different tuning speed, resistance, environmental sensitivity, signal distortiony, and power handling properties, and which type of varactor is preferred will depend on the specific requirements of each application.

Figure 37D:
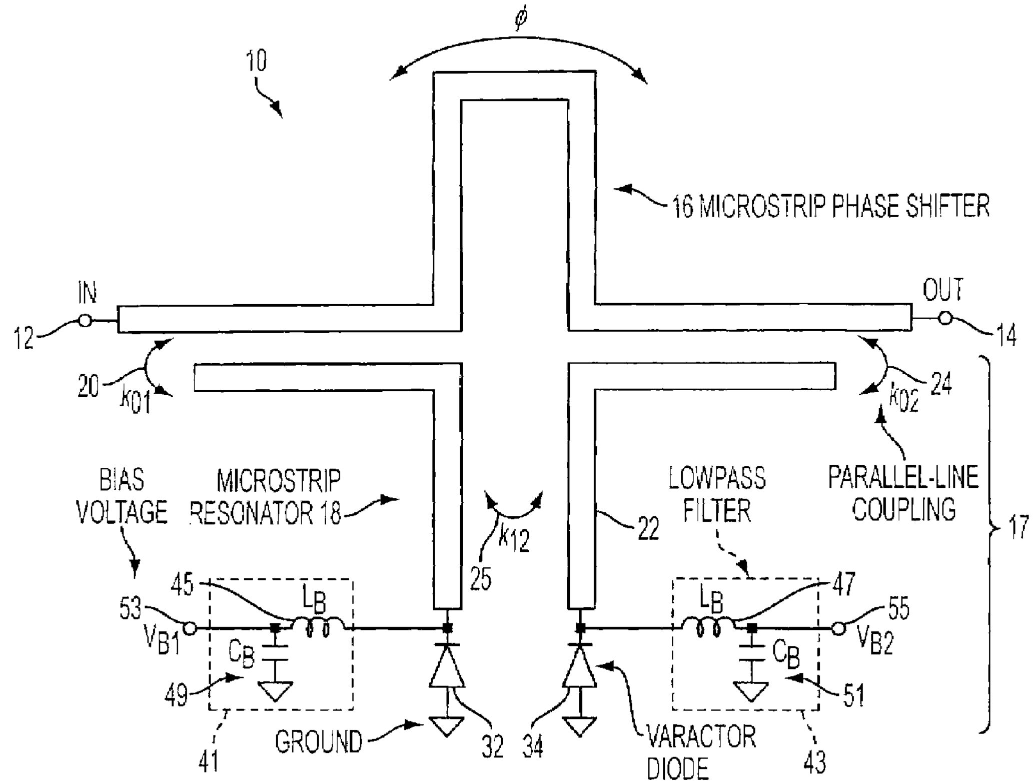
FIG. 37*d* is a revision of FIG. 37*c* including a schematic of varactor diode bias circuits according to the invention.

FIG. 37*d* is mostly identical to FIG. 37*c*, except that the generalized varactors 27 and 29 of FIG. 37*c* have been replaced by varactor diodes 32 and 34, which have their cathodes directly connected to the ends of microstrip resonators 18 and 22 farthest from ports 12 and 14, respectively, and have their anodes connected to a common ground. FIG. 37*b* shows a simplified equivalent circuit of varactor diodes 32 and 34, comprised of a voltage dependent resistance $R_V(V_B)$, an inductance $L_S$, and a voltage dependent capacitance $C_V(V_B)$, where $V_B$ is the reverse bias voltage across the varactor diode and is the electrical means used to control the varactor capacitance and thereby control the resonator resonant frequencies and the frequency $f_o$ of maximum attenuation of notch filter 10.

Referring again to FIG. 37*d*, varactor bias voltages $V_{B1}$ 53 and $V_{B2}$ 55 are applied to varactor diodes 32 and 34 through lowpass filter networks 41 and 43 connected to the cathodes of varactor diodes 32 and 34. Internally, lowpass filters 41 and 43 are comprised of series "choke" inductances 45 and 47 and shunt "bypass" capacitors 49 and 51, respectively. Bias voltages 53 and 55 are applied to the non-grounded ends of shunt bypass capacitors 49 and 51, which are connected to the cathodes of varactor diodes 32 and 34 by series choke inductors 45 and 47, respectively.

Test Results

Figure 11:
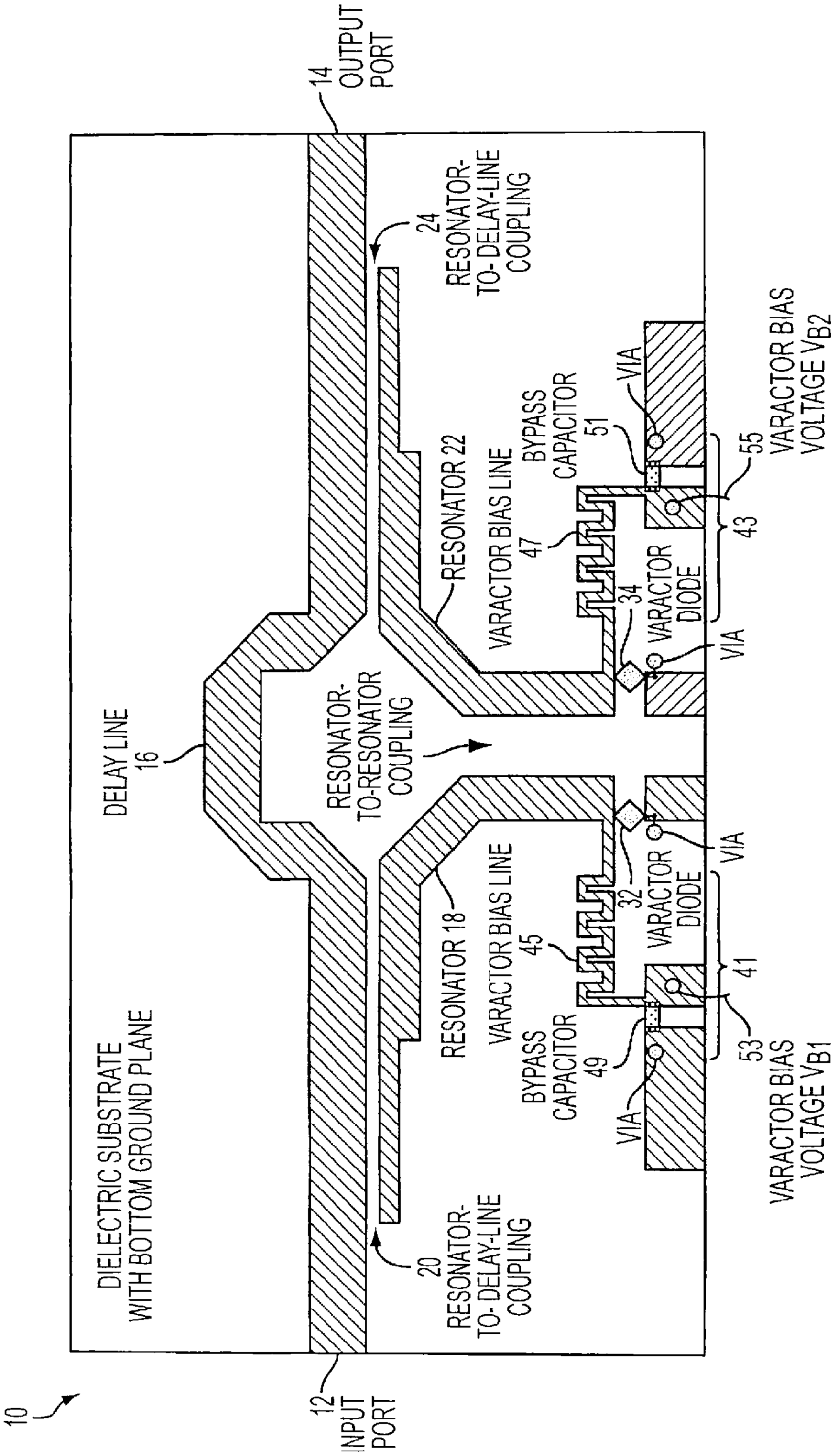
FIG. 11 is a layout of a first microstrip realization of an electrically tunable first-order absorptive notch filter of the type of FIGS. 5*a-d* according to the invention.

A varactor-tuned microstrip absorptive-pair bandstop filter 10 of the type in FIGS. 5*a*, 39, 37*a*, and 5*c-d*, 37*c*, and 37*d* was designed using the preceding theory together with computerized microwave circuit and electromagnetic simulations in conjunction with manual optimization and was constructed as shown in FIG. 11. To achieve an exceptionally small size and low cost, this embodiment of the invention was implemented using microstrip transmission line. The resonances 18 and 22 were each realized as separate microstrip transmission line resonators loaded by tuning varactors 32 and 34. The cathodes of varactors 32 and 34, each a grounded anode Metelics MGV-125-20-E25 GaAs hyperabrupt diode varactor, were attached to one end of each of the respective microstrip resonators 18 and 22 to independently control or tune their resonant frequencies and were connected at the ends of transmission line resonators 18 and 22 that are farthest from ports 12 and 14, respectively. Microstrip edge-coupled parallel-line coupling 20 and 24 was used to couple open-ended microstrip portions of the microstrip resonators 18 and 22 to the input port 12 and output port 14 ends of the microstrip transmission line phase shifter (i.e., approximate impedance inverter, approximate admittance inverter, or all-pass delay line) 16 and microstrip edge-coupled parallel-line coupling 25 was used to couple the varactor-ended microstrip portions of the microstrip resonators 18 and 22 to each other. The Metelics varactors 32 and 34 had a design capacitance range of 1.5 to 0.1 pF for 0.5 to 20 V reverse bias voltage ($V_B$) and a 1.68Ω series resistance at $V_B$=4V. The substrate was a 37×70×1.5 mm Rogers RO4003 dielectric substrate with 0.034 mm thick copper metallization, 3.38 dielectric constant, and 0.0021 dielectric loss tangent. With the varactors short-circuited, the microstrip resonators 18 and 22 were electrically a quarter-wavelength long at about 1.44 GHz.

The cathodes of varactors 32 and 34 were also connected to one end of meandered microstrip line (0.020 inch widths and gaps) inductances 45 and 47, the other end of which were connected to shunt grounded bypass capacitors 49 and 51 (American Technical Ceramics 60OS200JT-250, 20 pF each) as well as to bias voltages 53 and 55, respectively. Series inductances 45 and 47 and shunt capacitances 49 and 51 constituted lowpass filters 41 and 43, respectively, and functioned to isolate relatively high frequency signals incident to port 12 and within notch filter 10 from the sources of the relatively low frequency bias voltages 53 and 55. The frequency $f_o$ of the maximum attenuation of notch filter 10 was tuned by individually adjusting the magnitudes of bias voltages 53 and 55, and, in general, these magnitudes were different. Note that the varactors 32 and 34 and bypass capacitors 49 and 51 were connected to the ground plane on the bottom of the substrate by 0.032 inch diameter, 0.060 long solid copper vias.

Figure 12A:
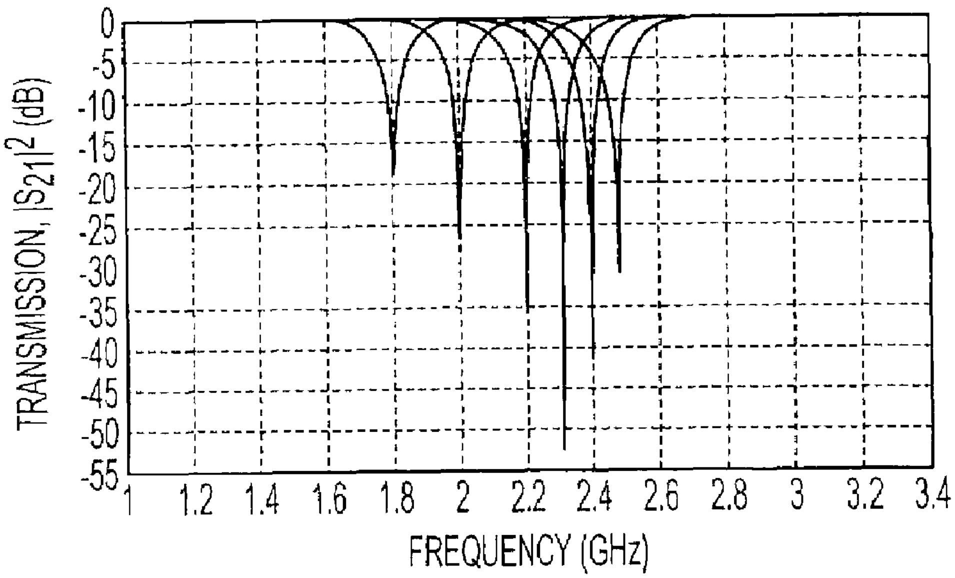
FIG. 12*a* is a graph illustrating the measured transmission response of a first modified version of the filter of FIG. 11 for six different varactor bias settings, with a minimum 1V bias corresponding to the left-most curve and a maximum 18V bias corresponding to the rightmost curve.
Figure 12B:
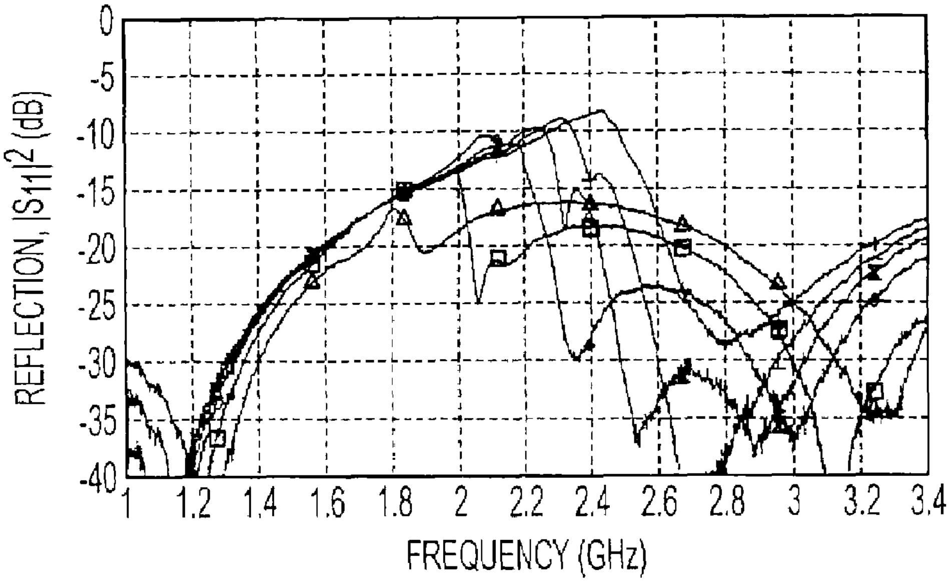
FIG. 12*b* is a graph illustrating the measured reflection response of a first modified version of the filter of FIG. 11 for the same six different varactor bias settings as in FIG. 12*a*.

A first set of measured responses for a bias voltage tuning range of 1V to 18V is shown in FIGS. 12*a-b*. A 20 dB bandstop attenuation depth was maintained over approximately a 30% tuning range and fractional bandwidth enhancements of a factor of 4 to over 100 were observed relative to non-tuned traditional notch filter approaches over the entire tuning range. All this despite the fact that resonator $Q_u$ varied substantially with varactor bias across the tuning range. It was found necessary to manually tune the parallel-line resonator-to-transmission-line couplings 20 and 24 with metalized dielectric overlays prior to sweeping the varactor bias voltages. The relative varactor biases were then experimentally optimized to achieve the maximum bandstop attenuation at each center frequency in FIG. 12*a*.

Figure 13A:
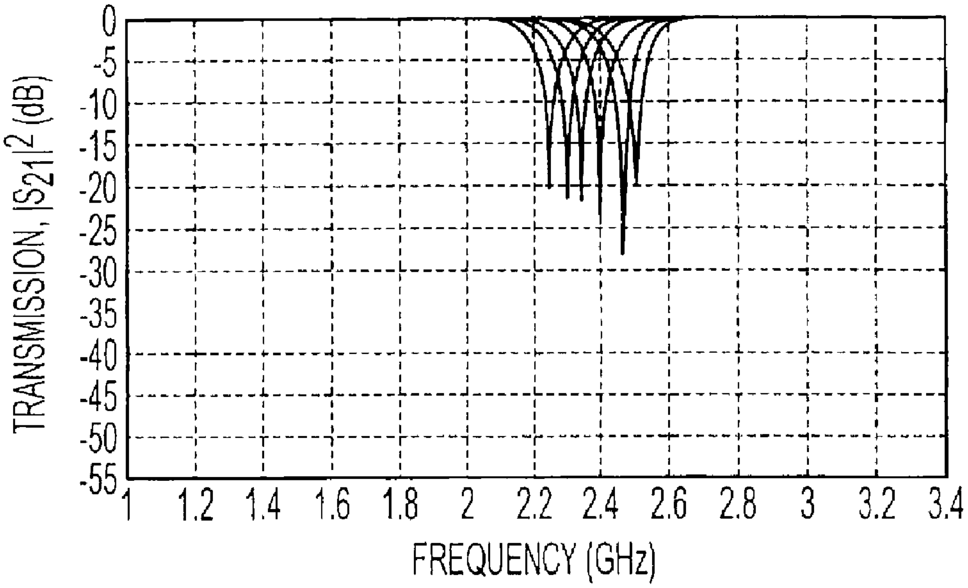
FIG. 13*a* is a graph illustrating the measured transmission response of a second modified version of the filter of FIG. 11 optimized for a 15 dB return loss across the entire tuning range, for six different varactor bias settings, with a minimum 4V bias corresponding to the left-most curve and a maximum 20V bias corresponding to the rightmost curve.
Figure 13B:
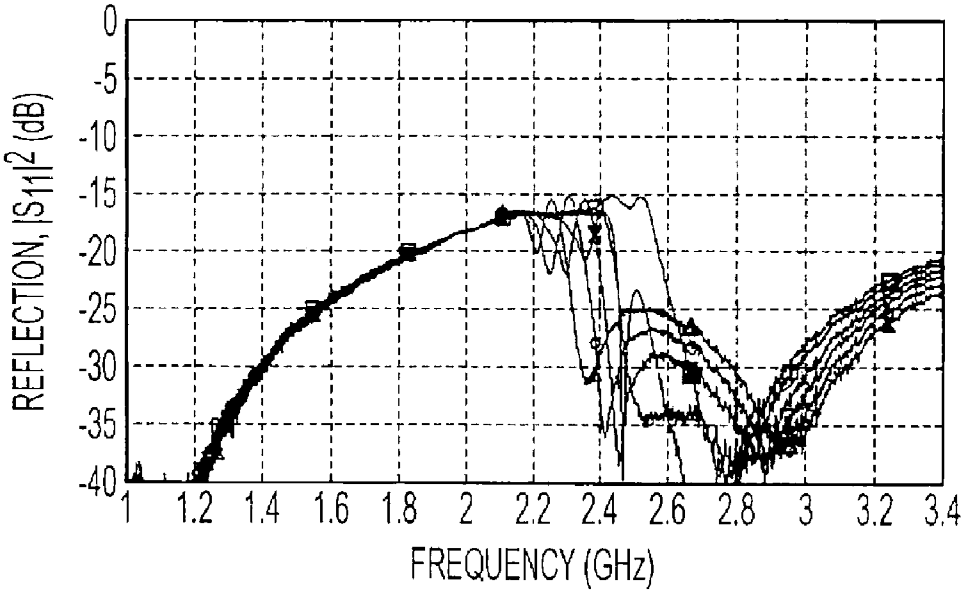
FIG. 13*b* is a graph illustrating the measured reflection response of a second modified version of the filter of FIG. 11 for the same six different varactor bias settings as in FIG. 13*a*.

Another set of measurements, shown in FIGS. 13*a-b*, was obtained by first experimentally modifying the overlays to adjust the resonator-to-transmission-line couplings 20 and 24 prior to experimentally optimizing the relative varactor biases to maintain a minimum 15 dB return loss and a minimum 20 dB attenuation across a 10.5% tuning range. Consequently, it is evident that even frequency-agile versions of filter 10 are capable of maintaining both low reflection within the stopband and respectable maximum attenuation levels while tuning over a reasonably useful frequency range.

Figure 14:
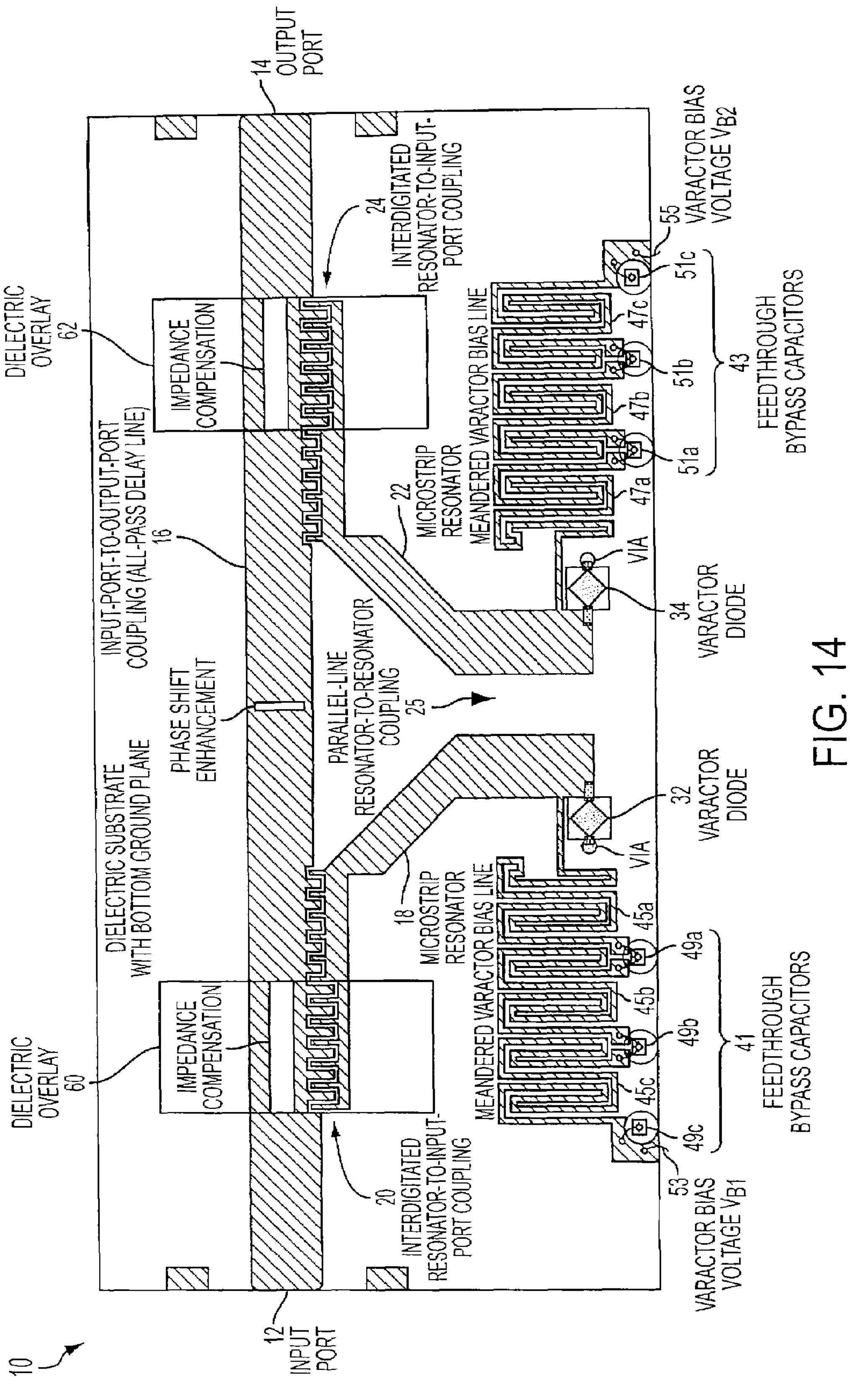
FIG. 14 is a layout of a second microstrip realization of an electrically tunable first-order absorptive notch filter of the type of FIGS. 5*a-d* according to the invention.

In order to determine whether improved performance may be achieved by employing more accurate models of microstrip loss and varactor resistance in the design, as well as by improving the isolation provided by the lowpass filter bias circuit, a second "first-order" varactor-tuned microstrip absorptive-pair bandstop filter realization of the embodiments in FIGS. 5*a*, 39, 37*a*, and 5*c-d*, 37*c*, and 37*d* was designed using the preceding theory together with computerized microwave circuit and electromagnetic simulations in conjunction with manual optimization and was constructed as shown in FIG. 14. It was found preferable to design the circuit such that the required stopband attenuation is achieved at the lowest frequency of the targeted frequency tuning range when zero bias is applied to both varactors. It was also found preferable to use more selective lowpass filters 41 and 43 than those described in FIGS. 37*d* and 11 in order to provide better high frequency signal isolation between the resonators 18 and 22 and the supplies of the bias voltages 53 and 55. Again, to achieve an exceptionally small size and low cost, this embodiment of the invention was implemented using microstrip transmission line. The resonances 18 and 22 were each realized as separate microstrip transmission line resonators loaded by tuning varactors 32 and 34. The cathodes of varactors 32 and 34, each a grounded anode Metelics MGV-125-24-E25 GaAs hyperabrupt diode varactor, were attached to one end of each of the respective microstrip resonators 18 and 22 to independently control or tune their resonant frequencies and were connected at the ends of transmission line resonators 18 and 22 that are farthest from input and output ports 12 and 14, respectively. Microstrip edge-coupled interdigitated parallel-line couplings 20 and 24 with partial dielectric overlays 60 and 62 (identical to the substrate dielectric) were used to couple open-ended microstrip portions of the microstrip resonators 18 and 22 to the input port 12 and output port 14 ends of the microstrip transmission line phase shifter (i.e., approximate impedance inverter, approximate admittance inverter, or all-pass delay line) 16 and microstrip edge-coupled parallel-line coupling 25 was used to couple the varactor-ended microstrip portions of the microstrip resonators 18 and 22 to each other. Dielectric overlays 60 and 62 (with an air gap—i.e., no epoxy to fill gaps between the substrate and the overlay in the vicinity of the transmission line) were used to increase the couplings 20 and 24, respectively, and were glued to the substrate with rubber cement in regions farthest removed from the microstrip transmission lines. To minimize microstrip line edge discontinuities due to microstrip line bends and steps in width, holes were designed into the transmission line 16, as shown in FIG. 14, to compensate the transmission line impedance in regions with substantially interdigitated couplings as well as to most efficiently increase overall phase shift through 16. The Metelics varactors 32 and 34 of FIG. 14 had a measured capacitance range of about 7.4 to 0.38 pF for 0 to 20 V reverse bias voltage ($V_B$) and ameasured maximum series resistance of about 1.865Ω at $V_B$=0V. The substrate was a 27.5×54.2×1.5 mm Rogers RO4003 dielectric substrate with 0.034 mm thick copper metalization, 3.38 dielectric constant, and 0.0021 dielectric loss tangent.

The cathodes of varactors 32 and 34 were also connected to one end of three section meandered microstrip line (0.012 inch widths and 0.008 inch gaps) inductances 45*a,b,c* and 47*a,b,c*, the other ends of each section of which were connected to shunt grounded feedthrough bypass capacitors 49*a,b,c* and 51*a,b,c* (American Technical Ceramics 600S200JT-250, 20 pF each) so as to form sixth-order series-inductance-shunt-capacitance lowpass ladder networks 41 and 43, which functioned to isolate relatively high frequency signals incident to port 12 and within notch filter 10 from the sources of the relatively low frequency bias voltages 53 and 55. Bias voltages 53 and 55 were connected to the junctions of series meandered microstrip line sections 45*c* and 47*c* and shunt feedthrough bypass capacitors 49*c* and 51*c*, respectively. The frequency $f_0$ of the maximum attenuation of notch filter 10 was tuned by individually adjusting the magnitudes of bias voltages 53 and 55, and, in general, these magnitudes were different. Note that the varactors 32 and 34 were connected to the ground plane on the bottom of the substrate by 0.032 inch diameter, 0.060 long solid copper vias. It was found important to minimize inductance in series with the shunt bypass capacitors, so the bypass capacitors 49*a,b,c* and 51*a,b,c* were installed as substrate feedthroughs, since their lengths matched the substrate thickness, and their ground terminals were soldered directly to the ground plane on the bottom of the substrate.

Figure 15A:
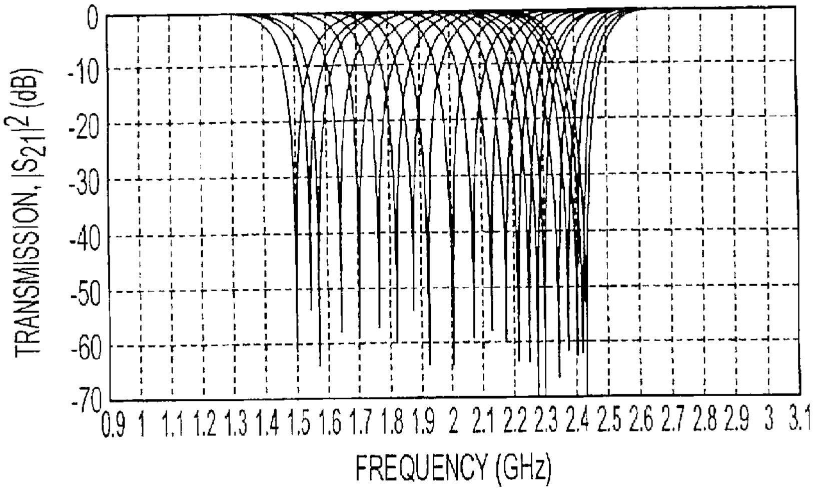
FIG. 15*a* is a graph illustrating the measured transmission characteristics of the filter of FIG. 14 at twenty-two different varactor bias settings.
Figure 15B:
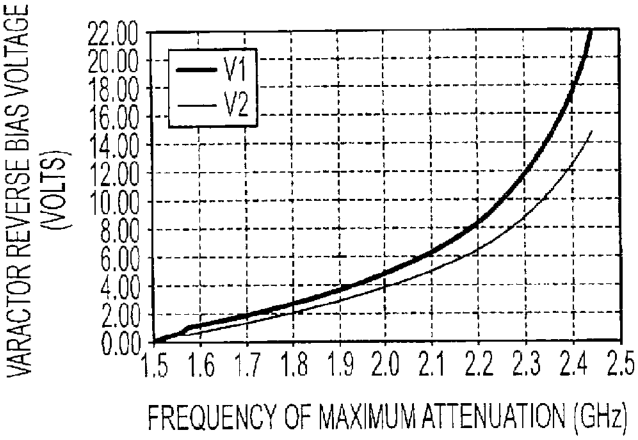
FIG. 15*b* is a graph illustrating the variation in the individual varactor bias voltages with the corresponding frequencies of maximum notch attenuation as shown in FIG. 15*a* for the filter of FIG. 14.
Figure 15C:
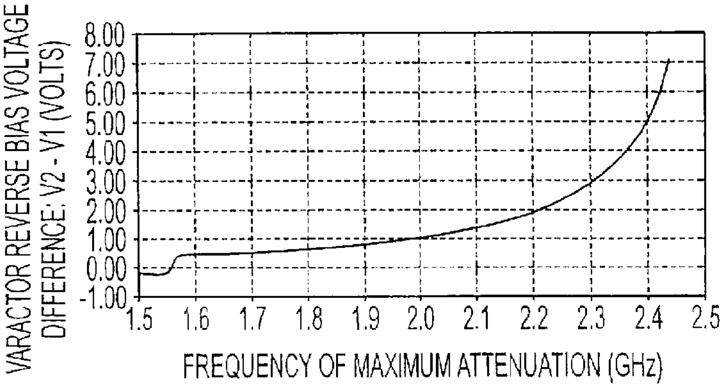
FIG. 15*c* is a graph illustrating the difference in the individual varactor bias voltages with the corresponding frequencies of maximum notch attenuation as shown in FIG. 15*a* for the filter of FIG. 14.
Figure 15D:
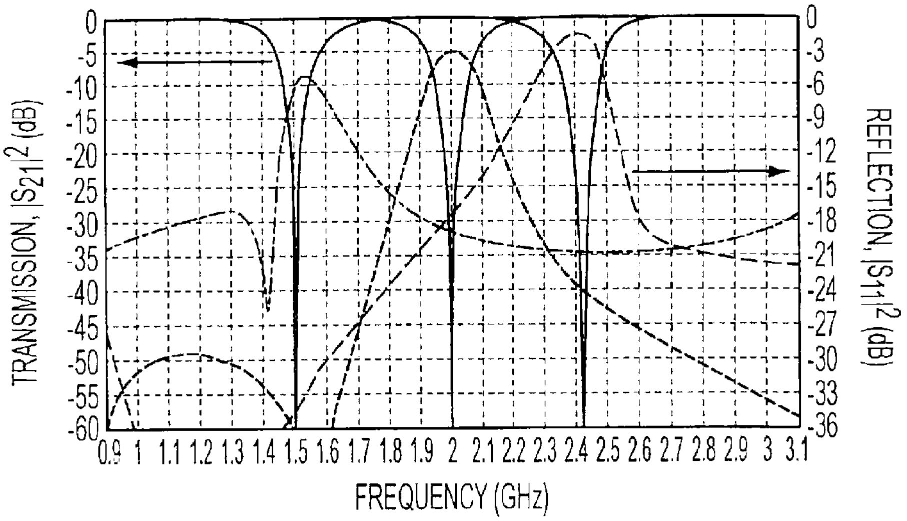
FIG. 15*d* is a graph illustrating the measured transmission and reflection characteristics of the filter of FIG. 14 at the two extreme varactor bias settings and an intermediate varactor bias setting.

A set of measured transmission responses for a bias voltage tuning range of 0V to 22V is shown in FIG. 15*a*. A 50 dB bandstop attenuation depth was maintained from 1.500 GHz to 2.438 GHz for a frequency tuning range of 47.6%. From FIGS. 15*a* and 15*d* it is apparent that the attenuation characteristics were somewhat skewed at the extremes of the tuning range. Calculating symmetric 3 dB bandwidths in a worst case fashion showed 3 dB bandwidth changing from about 235 MHz at 1.5 GHz to a minimum of 220 MHz at 2 GHz to 223 MHz at 2.4 GHz and fractional 3 dB bandwidth changing from 15.7% at 1.5 GHz to a minimum of 10.7% at 2.1 GHz to 11.2% at 2.4 GHz. Fractional bandwidth (or effective unloaded Q) enhancements by a factor of between 100 to 500 were observed relative to a similarly tuned traditional notch filter as in FIG. 1 over the entire tuning range. All this despite the fact that measured resonator intrinsic $Q_u$ varied from about 22 to about 88 as varactor bias changed from 0 V to 17 V. Unlike in the previous example, no additional ad-hoc or empirical adjustments were needed or employed to realize the measured performance, other than the experimental optimization of the relative varactor biases—as is expected from the preceding theory in order to compensate for anticipated circuit parameter changes due to the changing operating frequency and bias voltages so as to achieve the maximum bandstop attenuation at each center frequency. The recorded variation in the two independent varactor bias voltages versus frequency of maximum attenuation of the notch is shown in FIG. 15*b* and the difference between the two bias voltages as a function of the frequency of maximum attenuation of the notch is shown in FIG. 15*c*, in which V1 and V2 correspond to bias voltages $V_{B1}$ 53 and $V_{B2}$ 55, respectively. Additionally, both the transmission and reflection characteristics of the notch filter tuned to three different frequencies at three different bias settings are shown in FIG. 15*d*.

D. Distributed Bridged-T Notch Filter

Figure 16A:
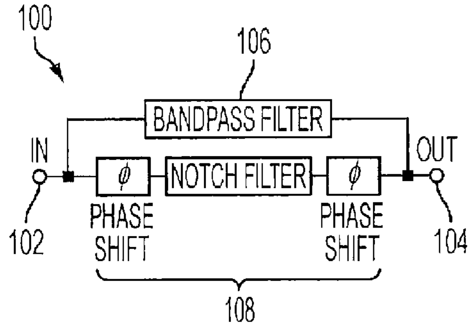
FIG. 16*a* is a schematic diagram of a distributed "bridged-T" notch filter according to the invention.
Figure 16B:
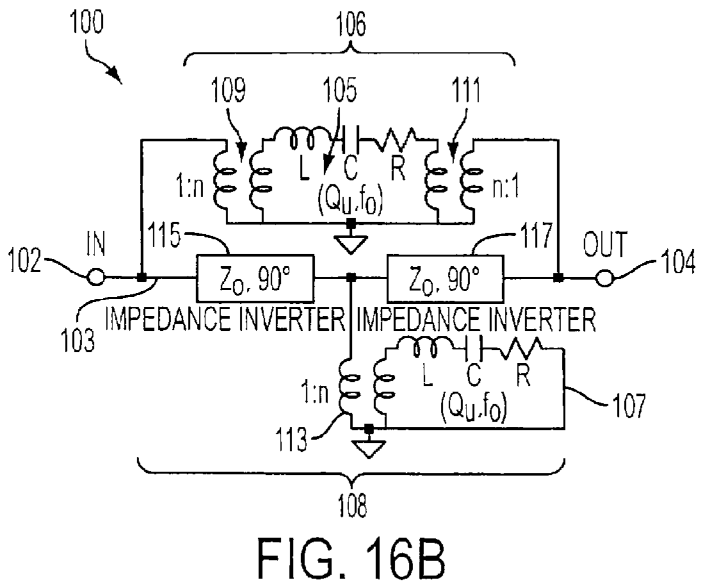
FIG. 16*b* is a representative equivalent circuit schematic of a distributed "bridged-T" notch filter as in FIG. 16*a* according to the invention.

Referring now to FIGS. 16*a*-*d*, in another embodiment of the invention as represented by absorptive notch filter 1100 of FIG. 41, another two-signal-path absorptive notch filter is a "first-order" distributed-element bridged-T notch filter 100. Referring now to FIG. 16*a*, an input port 102 is coupled to an output port 104 through a single-resonance bandpass filter 106 for a first signal path, while input port 102 is coupled to output port 104 through a single-resonance notch filter 108 for a second signal path. Conceptually, the enhanced notch response is achieved by paralleling the bandpass filter 106 with the phase-shifted notch filter 108. The circuit schematic of a corresponding representative idealized "first-order" notch filter 100 is shown in FIG. 16*b*, where constituent bandpass filter 106 is comprised of ideal transformers 109 and 111 and lumped-element resistance-inductance-capacitance (RLC) resonance 105 and constituent notch filter 108, a conventional notch filter as in FIG. 1, is comprised of series-connected impedance inverters 115 and 117 comprising all-pass phase shift network 103, ideal transformer 113, and lumped-element RLC resonance 107. Transformers 109 and ill couple bandpass resonance 105 to input port 102 and output port 104, respectively. Notch resonance 107 is coupled by transformer 113 to all-pass phase shift network 103 and on to input port 102 and output port 104 through impedance inverters 115 and 117, respectively. The coupling magnitudes of ideal transformers 109, 111, and 113 are all denoted by transformer turns ratio, n, which is $$n^2=R/Z_o=2\pi f_o L/(Z_o Q_u), \tag{75}$$

with R the resistance, L the inductance, $f_o$ the resonant frequency, and $Q_u$ the unloaded Q of each resonance 105 and 107. All-pass phase shift network 103 has a characteristic impedance $Z_o$ and is coupled to conventional notch resonance 107 midway along its length. To achieve signal cancellation at frequency $f_o$, both resonances 105 and 107 are tuned to resonate at $f_o$, the delay line 103 is about a half-wavelength long at $f_o$, and the attenuation at $f_o$ is about the same through both signal paths. Although a single dual-mode resonator could have been used to implement the two resonances 105 and 107, for the sake of simplicity the fundamental mode of two open-circuited half-wavelength resonators was used instead. The layout of a corresponding microstrip realization of the "first-order" distributed bridged-T notch filter 100 is shown schematically in FIG. 16*c*, where both resonators 105 and 107 are open-circuited half-wavelength lines that are partially parallel-coupled to the 50 Ω delay line 103.

Figure 16C:
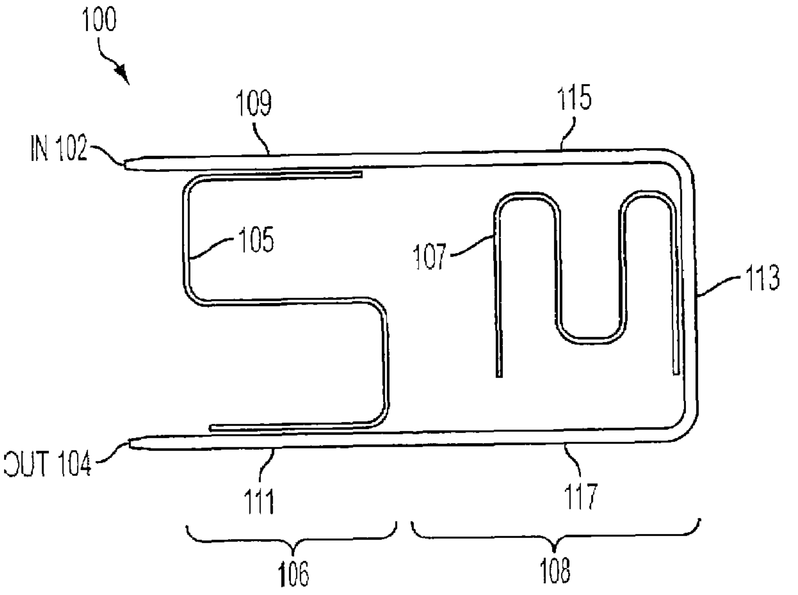
FIG. 16*c* is the layout of a microstrip realization of a distributed "bridged-T" notch filter as in FIGS. 16*a-b* according to the invention.
Figure 16D:
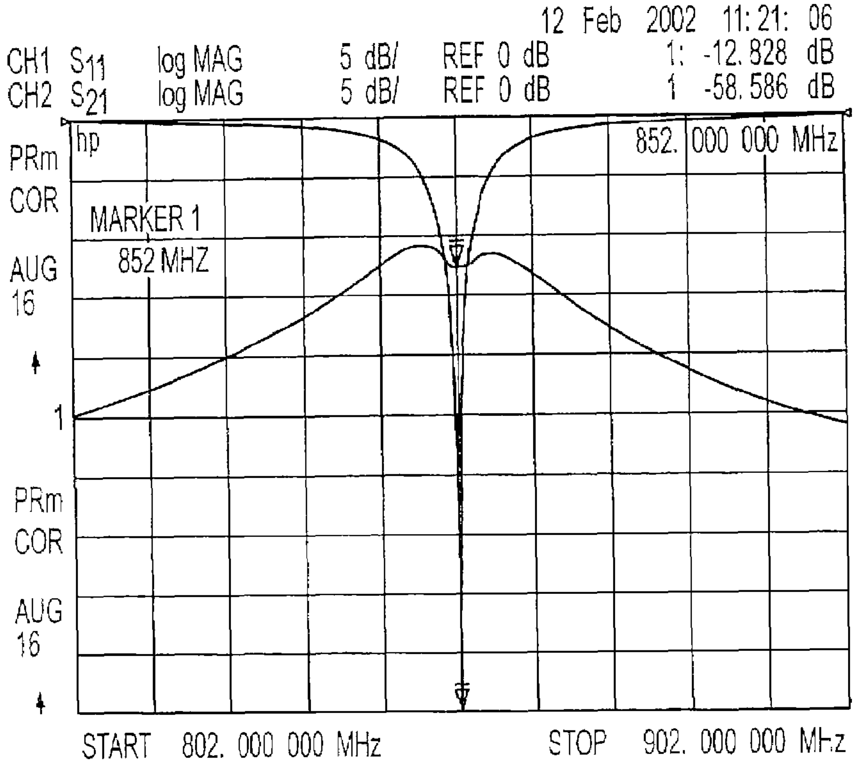
FIG. 16*d* is a graph of the measured transmission and reflection characteristics of the distributed "bridged-T" notch filter of FIG. 16*c*.
Figure 33A:
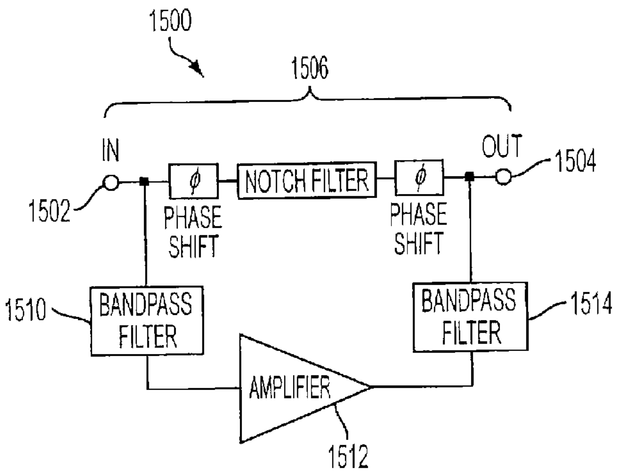
FIG. 33*a* is a schematic diagram of a distributed "bridged-T" active notch filter according to the invention.
Figure 33B:
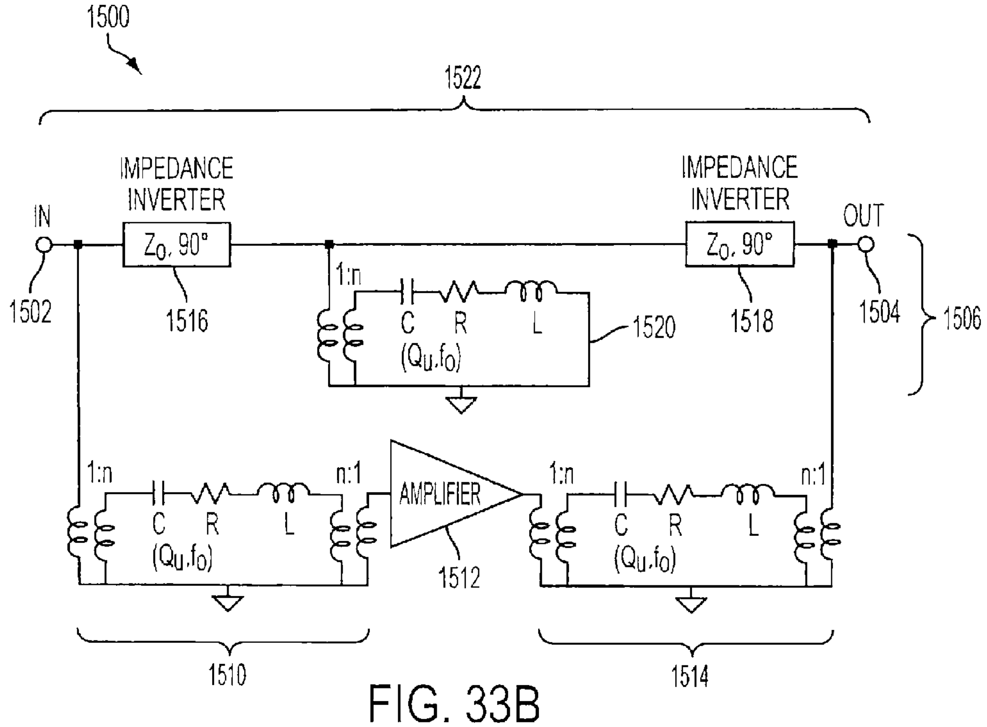
FIG. 33*b* is a representative equivalent circuit schematic of a first-order distributed "bridged-T" active notch filter according to the invention.
Figure 34A:
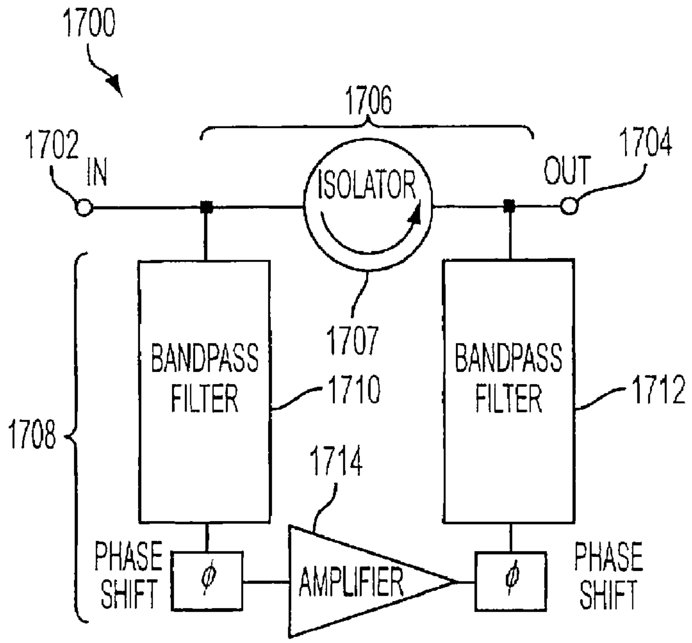
FIG. 34*a* is a schematic diagram of an isolator-based active notch filter according to the invention.
Figure 34B:
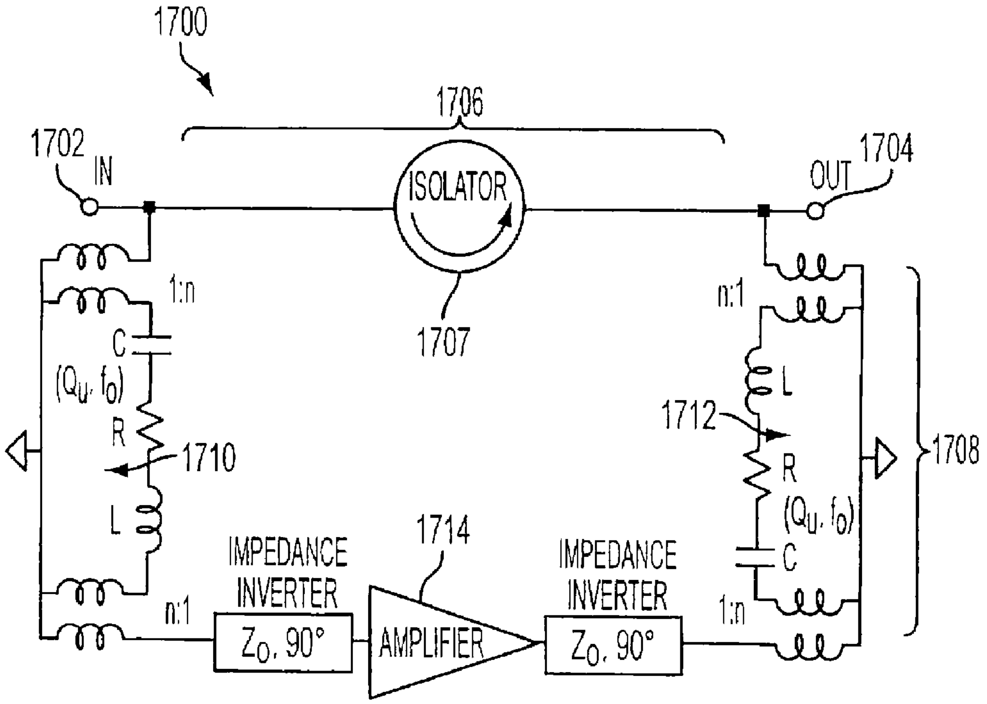
FIG. 34*b* is a representative equivalent circuit schematic of a first-order isolator-based active notch filter according to the invention.
Figure 35A:
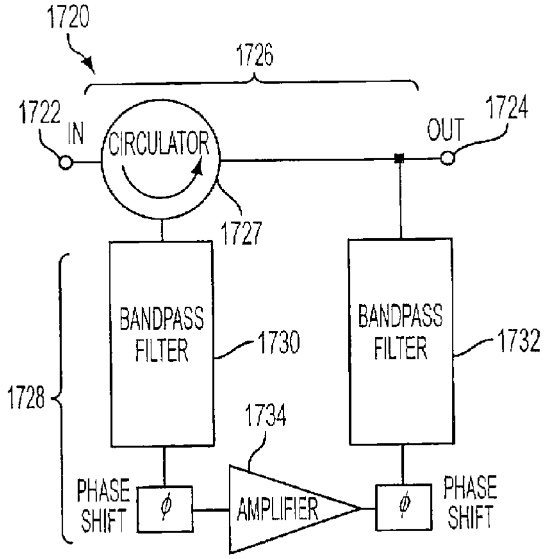
FIG. 35*a* is a schematic diagram of a circulator-based active notch filter according to the invention.
Figure 35B:
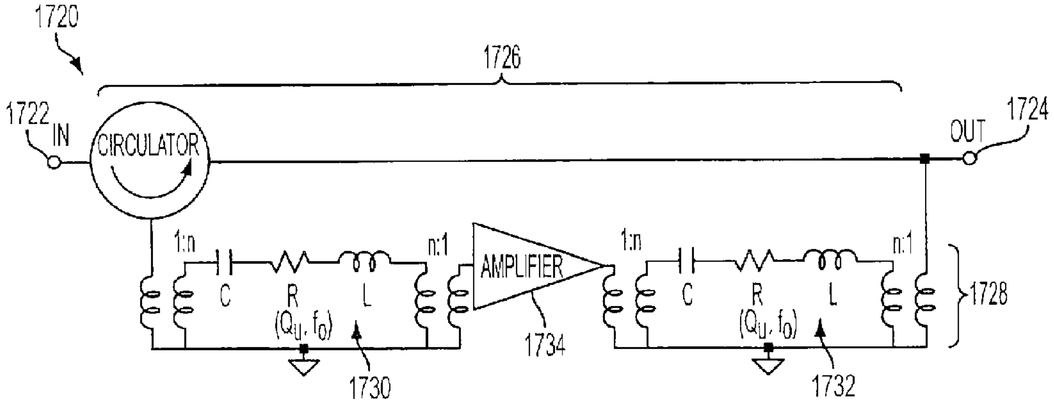
FIG. 35*b* is a representative equivalent circuit schematic of a first-order circulator-based active notch filter according to the invention.

Still referring to FIG. 16*c*, a prototype of filter 100 was constructed using SMA connectors and a 98.43 mm×57.15 mm Taconic TLT-8-0310-CH/CH substrate with a dielectric thickness of 0.78 mm, relative dielectric constant of 2.55, dielectric loss tangent of 0.0006, and copper thickness of 0.036 mm. The delay line 103 width was 2.06 mm and the resonator line width was 1.02 mm, providing impedances of 51.3 and 76.7 ohms, respectively. The parallel-coupled line sections 109, 111, and 113 were 25.02 mm long with a 0.51-mm coupling gap and were connected by 59.31-mm lengths of delay line. The bandpass 105 and notch 107 resonator line lengths were 121.54 mm and 122.40 mm, respectively. FIG. 16*d* shows the measured filter response: a center frequency of 852 MHz, notch depth of about 58 dB, and relative 3-dB bandwidth ($bw_{3dB}$) of 1.55%. The bandpass 105 and notch 107 resonators had measured unloaded Q's of about 155 and 134, respectively, while the prototype filter's 100 measured effective unloaded Q was 50,400, which represents effective unloaded Q enhancement by a factor of more than 325. Unloaded Q, $Q_u$, is calculated from measured band-reject responses using:

$$Q_u=\left|\frac{f_o f_1}{f_1^2-f_o^2}\right|10^{L_o/20}\sqrt{\frac{10^{-L_1/10}-10^{-L_o/10}}{1-10^{-L_1/10}}}, \tag{76}$$

where $L_o$ and $L_1$ are attenuation values at center frequency $f_o$ and frequency $f_1$. When calculating $Q_u$ of individual resonators, delay line loss is subtracted from $L_o$ and $L_1$. Resonator $Q_u$ still limited notch selectivity through (75). To realize greater selectivity (smaller values of n and $bw_{3dB}$), the bandpass resonator 105 could be replaced with a bandpass resonator-amplifier-resonator cascade as shown in FIGS. 33*a*-*b* and/or the effective value of $Z_o$ could be increased using impedance transformations. For example, assuming a lossless delay line and equal source and load impedances, $R_S$ and $R_L$, when $Z_o=R_S$ then $bw_{3\ dB}\cong 2.53/Q_u$, but when $Z_o=2R_S$ then $bw_{3dB}\cong 2/Q_u$. It can be seen that filter 100 exhibited a performance essentially equivalent to a superconductive implementation of a traditional notch filter, while being orders of magnitude less expensive, smaller, and lighter, as well as requiring no power source and being inherently more reliable.

E. Triple-Mode Resonator Absorptive Notch Filter

Figure 17A:
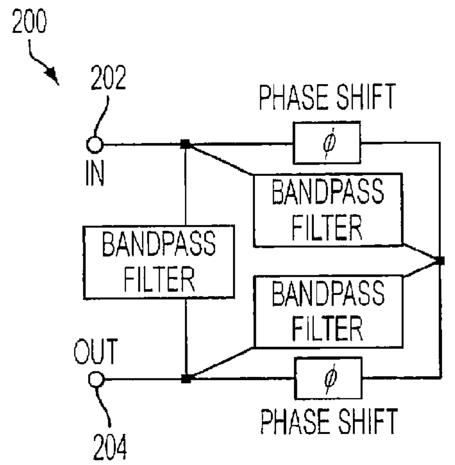
FIG. 17*a* is a schematic diagram of a triple-mode microstrip resonator absorptive notch filter according to the invention.
Figure 17B:
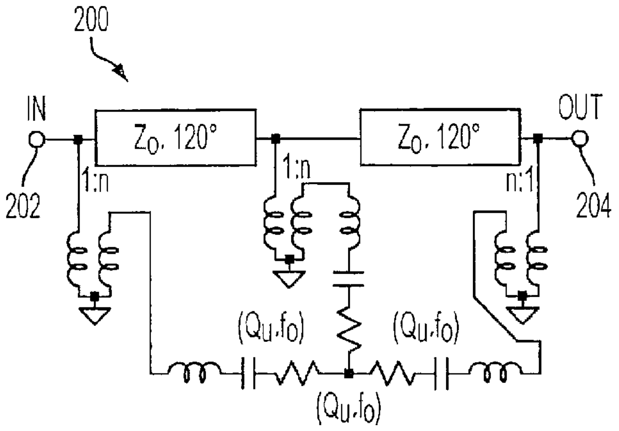
FIG. 17*b* is a representative equivalent circuit schematic of a triple-mode microstrip resonator absorptive notch filter as in FIG. 17*a* and according to the invention.
Figure 17C:
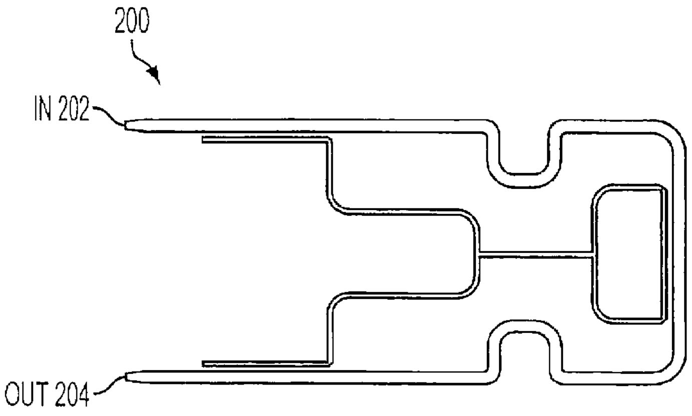
FIG. 17*c* is the layout of a microstrip realization of a triple-mode microstrip resonator absorptive notch filter as in FIGS. 17*a-b* according to the invention.
Figure 17D:
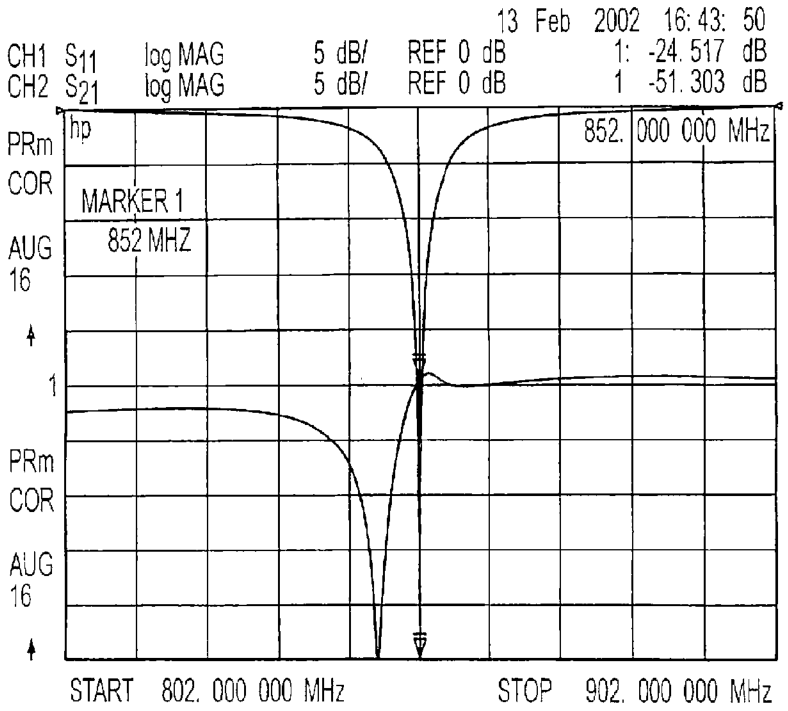
FIG. 17*d* is a graph of the measured transmission and reflection characteristics of the triple-mode microstrip resonator absorptive notch filter of FIG. 17*c*.

Referring now to FIGS. 17*a*-*c*, in another embodiment of the invention as represented by notch filter 1100 in FIG. 41, a triple-mode half-wavelength microstrip-resonator circuit 200 is an example of an enhanced-Qu notch filter with more than two signal paths. The diagram and schematic in FIGS. 17*a* and *b*, corresponding to the microstrip layout in FIG. 17*c*, show there are five possible signal paths between an input port 202 and an output port 204, with triple-mode resonances providing three distinct bandpass paths and the transmission line providing delay paths. In this case, n is much more complicated than given in (75). The prototype filter 200 in FIG. 17*c* was constructed using the same materials, line widths, and coupling gaps as filter 100, except that the parallel-coupled-line sections were 20.32 mm long and were connected by 80.77-mm lengths of delay line. FIG. 17*d* shows the measured filter response: a center frequency of 852 MHz, notch attenuation of 51 dB, and $bw_{3\ dB}$ of 1.43%. For this circuit, individual resonance $Q_u$'s cannot be calculated using (76) and the notch center frequency is offset from $f_o$. The prototype's measured effective $Q_u$ was about 22,300, which represents an effective $Q_u$ enhancement by a factor of about 89. It is also evident from the measured return loss shown in FIG. 17*d* that filter 200 exhibited practically no reflection in either the passbands or the stopband. Thus, as was the case for filter embodiment 10, filter 200 can be reciprocal, passive, and impedance matched to the source and load at all frequencies of interest, and the same is also possible for filter embodiment 100. The absorptive, rather than reflective, nature of such notch filters designed according to the invention has significant ramifications for applications that cascade amplifiers with notch filters—making it safer to employ higher performance, conditionally stable amplifiers (amplifiers that prefer a constant source and or load impedance). As mentioned above, this absorptive stopband property is not unique to filter 200 but can also be evident in the other embodiments of the invention, e.g. for filters 10 and 100, if designed or tuned to realize this property, as would be evident to one skilled in the art.

F. Absorptive "Doublet" Notch Filter

Figure 18A:
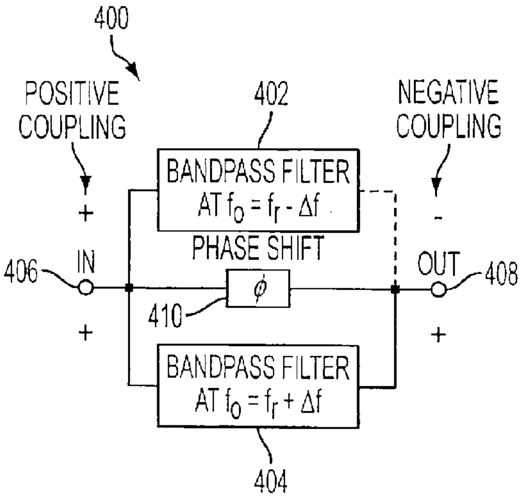
FIG. 18*a* is a schematic diagram of an arbitrary-order absorptive "doublet" notch filter according to the invention.
Figure 18B:
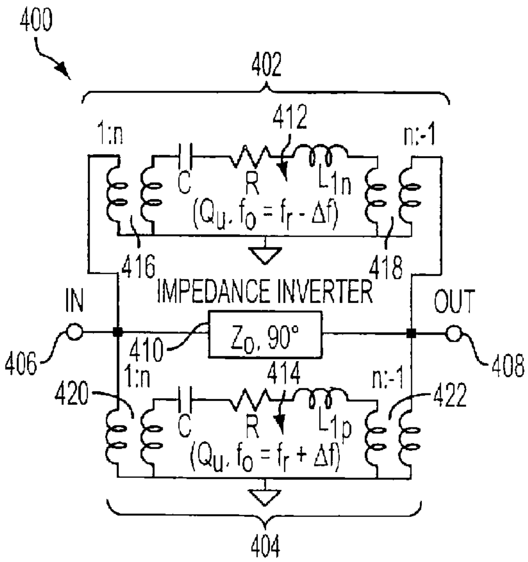
FIG. 18*b* is a representative equivalent circuit schematic of a first-order version of an absorptive "doublet" notch filter as shown in FIG. 18*a* according to the invention.
Figure 18C:
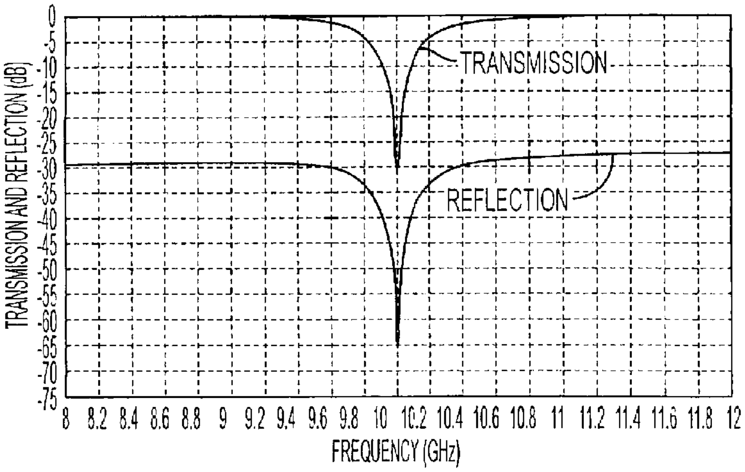
FIG. 18*c* is a graph illustrating representative simulated transmission and reflection characteristics of the first-order absorptive "doublet" notch filter of FIG. 18*b*.

Another passive reciprocal embodiment of the invention is shown in FIG. 18*a*. Notch filter 400 includes two bandpass filters 402 and 404 connected in parallel and whose passbands are slightly offset from each other, and having a common input port 406 coupled to a common output port 408 through an all-pass phase shift or time delay element 410. Key aspects of this embodiment are that the relative sign of one of the bandpass filter couplings to one of the ports must be opposite to that of the other bandpass filter couplings to the ports and the center passband frequency of the bandpass filter 402 with the single opposite coupling must be offset below the desired frequency of maximum notch filter attenuation, while the center passband frequency of the other bandpass filter 404 must be offset above the desired frequency of maximum notch filter attenuation. A representative circuit schematic of a first-order version of notch filter 400 is shown in FIG. 18*b*. Bandpass filter 402 is comprised of couplers (ideal transformers) 416 and 418 whose couplings are equal in magnitude and opposite in sign and which both couple to constituent resonance 412, bandpass filter 404 is comprised of couplers (ideal transformers) 420 and 422 whose coupling are equal in magnitude and equal in sign and which both couple to constituent resonances 414, and the resonant frequency of resonance 412 is less than that of resonance 414 while the frequency of maximum notch attenuation is between the resonant frequencies of resonances 412 and 414. Input port 406 is coupled to output port 410 by three independent signal paths: unit-element impedance inverter (or other type and/or value of all-pass phase shift element) 410 and bandpass filters 402 and 404. Input port 406 is coupled to resonances 412 and 414 by couplers 416 and 420, respectively, and resonances 412 and 414 are coupled to output port 408 by couplers 418 and 422, respectively. Representative simulated transmission and reflection responses are shown in FIG. 18*c* for an assumed resonator Qu of 40 at 10 GHz, from which it is evident that filter 400 is also capable of, though not limited to, realizing a non-reflective stopband characteristic.

Figure 19A:
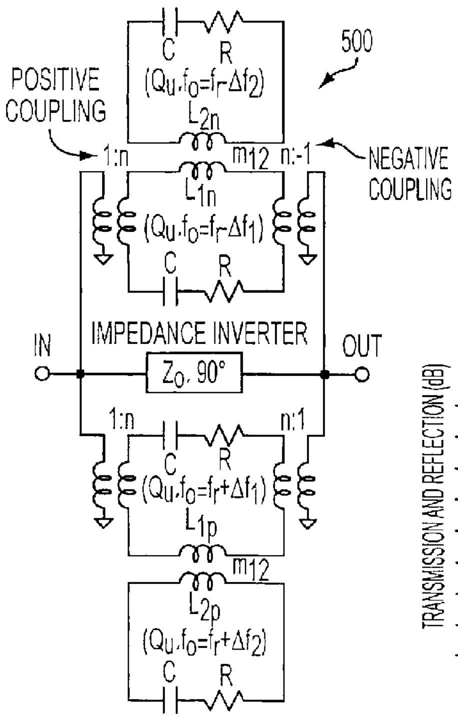
FIG. 19*a* is a representative equivalent circuit schematic of a second-order absorptive "doublet" notch filter according to the invention.
Figure 19B:
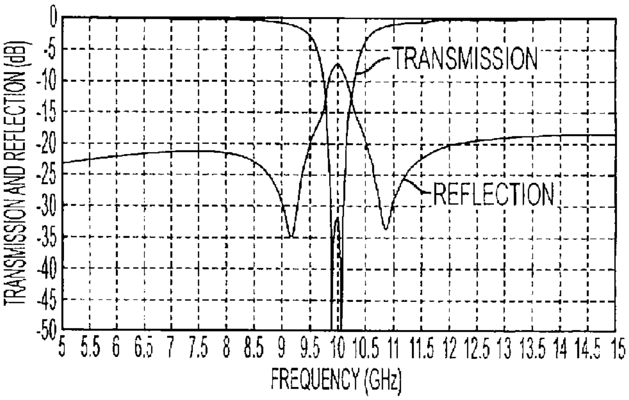
FIG. 19*b* is a graph illustrating representative simulated transmission and reflection characteristics of the second-order absorptive "doublet" notch filter of FIG. 19*a*.

The concept of filter 400 can also be extended to higher-order filters, as exemplified by the representative intrinsic (i.e., non-cascaded) second-order notch filter 500 circuit schematic of FIG. 19*a* together with representative simulated transmission and reflection responses in FIG. 19*b*. In this type of higher-order implementation, each additional resonance is coupled to one previous resonance and all have different resonant frequencies, as indicated in FIG. 19*b* for an assumed resonator Qu of 40 at 10 GHz.

G. Overlaid Absorptive Notch Filters

Figure 20A:
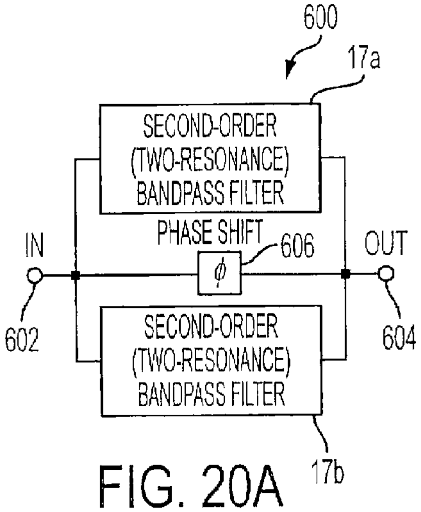
FIG. 20*a* is a schematic diagram of a second-order overlaid absorptive-pair notch filter according to the invention.
Figure 20B:
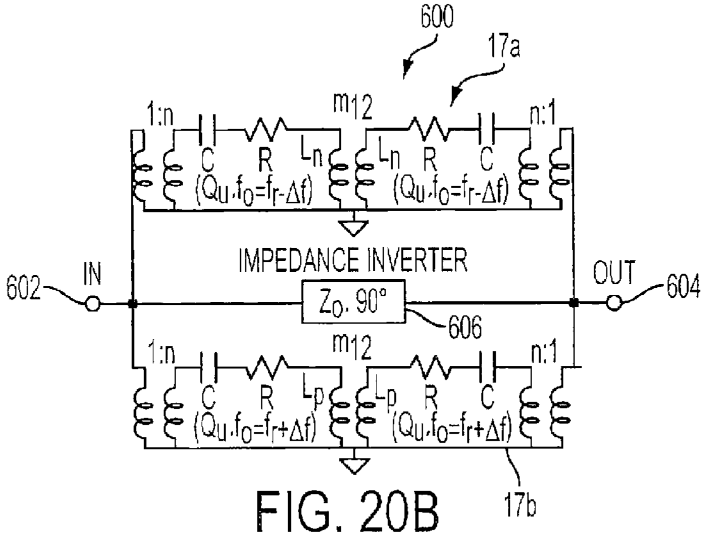
FIG. 20*b* is a representative equivalent circuit schematic of a second-order overlaid absorptive-pair notch filter as shown in FIG. 20*a* according to the invention.
Figure 20C:
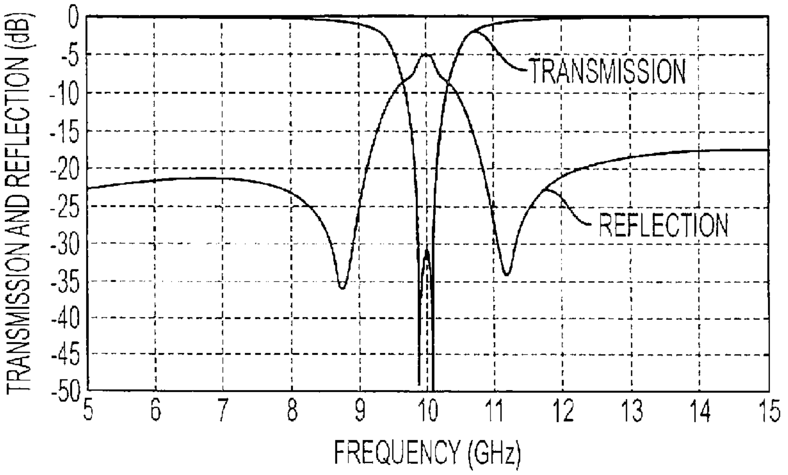
FIG. 20*c* is a graph illustrating representative simulated transmission and reflection characteristics of the second-order overlaid absorptive-pair notch filter of FIG. 20*b*.

The alternative second-order notch filter 600 in FIG. 20*a* illustrates an alternative higher-order notch filter comprised of two of the notch filters 10 described above overlaid on each other. Here, both bandpass filters 17*a* and 17*b* are joined to the common ports 602 and 604 by couplings of the same relative sign and the two resonances of each bandpass filter have substantially the same resonant frequency, even though the resonant frequencies differ between the two bandpass filters. As in the previous case of the absorptive "doublet" notch filter 400, a unit element impedance inverter (or other type and/or value of all-pass phase shift element) 606 forms a third independent signal path connecting the input port 602 to the output port 604. FIG. 20*b* is a corresponding representative circuit schematic of notch filter 600 while FIG. 20*c* shows representative simulated transmission and reflection responses for an assumed resonator Qu of 40 at 10 GHz. It is also noted that yet higher-order notch filters similarly comprised of overlaid instances of filters 10 and filters 700 and 800 (described below), together with combinations and extensions thereof as would be evident to one skilled in the art, are also a subject of the present invention.

H. Intrinsic Higher-Order Absorptive Notch Filters

Figure 21A:
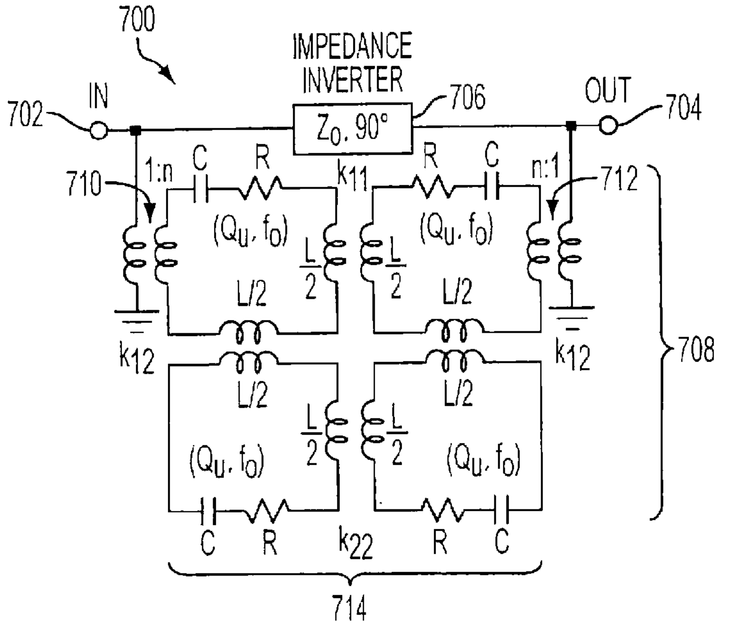
FIG. 21*a* is a representative equivalent circuit schematic of an intrinsic second-order "biquad" absorptive notch filter according to the invention.
Figure 21B:
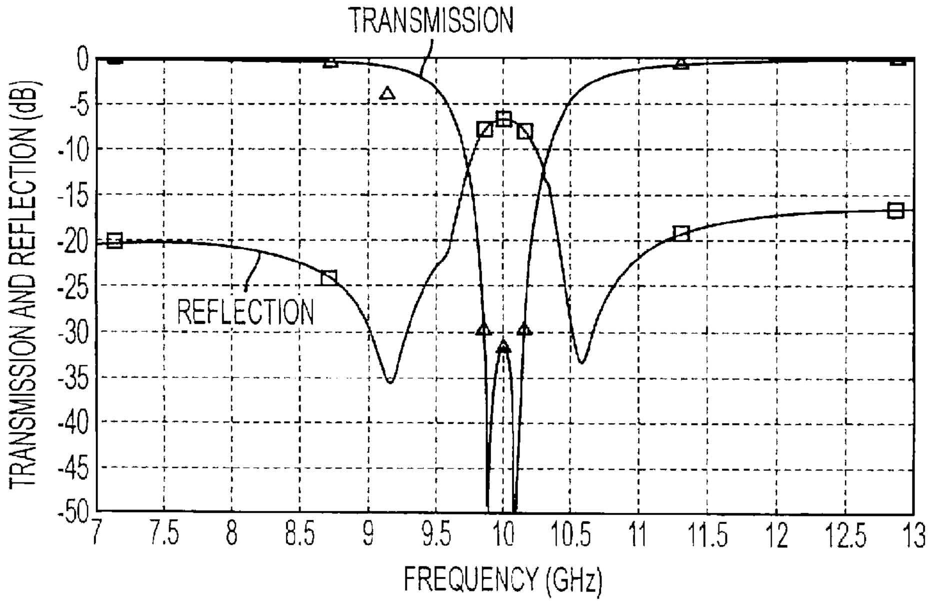
FIG. 21*b* is a graph illustrating representative simulated transmission and reflection characteristics of the intrinsic second-order "biquad" absorptive notch filter of FIG. 21*a*.
Figure 21C:
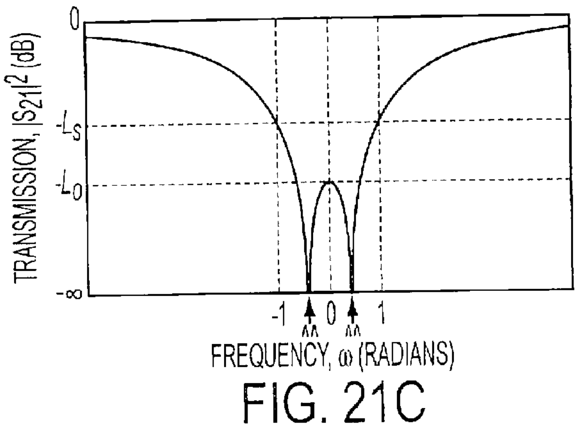
FIG. 21*c* is a graph illustrating a representative simulated transmission characteristic of a normalized highpass prototype of an intrinsic second-order "biquad" absorptive notch filter as in FIG. 21*b* according to the invention.
Figure 22A:
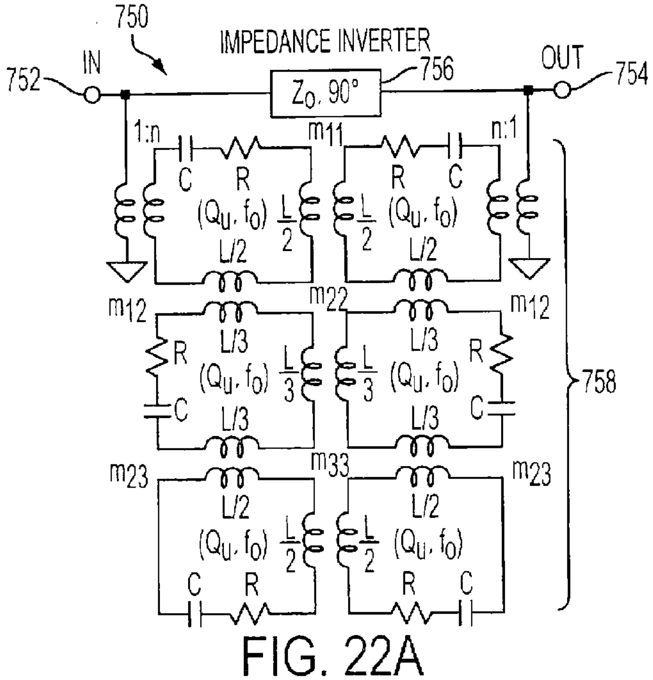
FIG. 22*a* is a representative circuit schematic of an intrinsic third-order absorptive notch filter according to the invention.
Figure 22B:
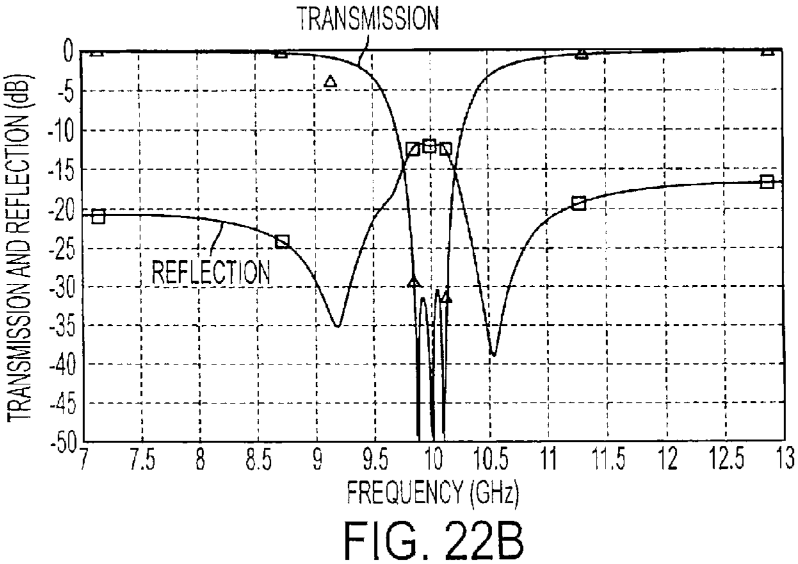
FIG. 22*b* is a graph illustrating representative simulated transmission and reflection characteristics of the intrinsic third-order absorptive notch filter of FIG. 22*a* with resonator $Q_u$=40.

While it is generally preferable to cascade and/or overlay first-order frequency-agile notch filter cells such as those described above (eg., filter embodiments 10, 100, and 400) in order to realize higher-order frequency-agile notch filters, FIGS. 21*a* and 22*a* illustrate related embodiments of the invention that represent preferable means of realizing fixed-tuned (not frequency-agile) higher-order notch filters. FIG. 21 a illustrates a representative circuit schematic of another particular instance of absorptive notch filter 1120 of FIG. 40: a second-order absorptive notch filter 700, with input port 702 and output port 704 coupled by a cross-coupled (i.e., canonic) fourth-order bandpass filter 708 (in which, for example, the four resonances could be realized using two dual-mode resonators), as well as by a unit element impedance inverter (or other type and/or value of all-pass phase shift element) 706. Representative simulations of transmission and return loss of the circuit, assuming resonances tuned to 10 GHz and with $Q_u$=40, are shown in FIG. 21*b*. FIG. 22*a* shows a representative circuit schematic of an analogous third-order notch filter 750, with input port 752 and output port 754 coupled by a cross-coupled (i.e., canonic) sixth-order bandpass filter 758 (in which, for example, the six resonances could be realized using three dual-mode resonators), as well as by a unit element impedance inverter (or other type and/or value of all-pass phase shift element) 756. Corresponding representative simulated transmission and reflection responses are shown in FIG. 22*b*. Although arbitrary $n^{th}$-order notch filters made according to the invention 1120 of FIG. 40 could similarly employ cross-coupled $(2*n)^{th}$-order bandpass filters, with their input and output ports coupled through a phase shift or time delay element, for particular applications it may be preferable to combine lower-order notch filters, such as those in FIGS. 37*a*, 21*a*, and/or 22*a*, in cascade and/or overlaid in order to effectively manage complexity and enhance manufacturability.

I. Absorptive Passive Biquad Notch Filter

Figure 23:
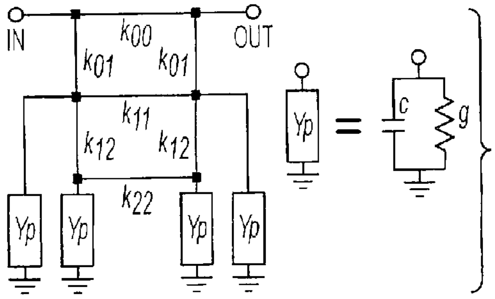
FIG. 23 is a representative equivalent circuit schematic of an admittance inverter based highpass prototype of the intrinsic second-order "biquad" absorptive notch filter of FIG. 21*a* according to the invention.
Figure 24:
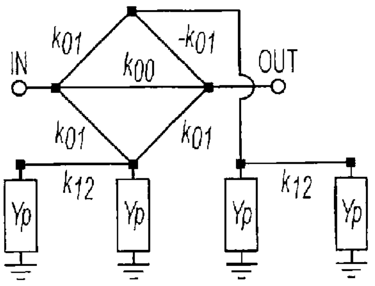
FIG. 24 is a representative equivalent circuit schematic of an admittance inverter based highpass prototype of the intrinsic second-order "doublet" absorptive notch filter of FIG. 19*a* according to the invention.

In the invention embodiment of notch filter 700 shown in FIG. 21*a*, notch filter 10 as shown in FIGS. 37*a* and 5*c-d* has essentially been extended to a biquad (second-order) topology by simply coupling an additional resonator to each of its two resonators and optionally coupling these two new resonators to each other. In particular, referring to FIG. 21*a*, ideal transformers 710 and 712 of turns ratio 1:n couple a network of four mutual inductively coupled ($k_{xy}$) lumped RLC resonators 714 (with nominal resonant frequency, $f_o$, and unloaded Q, $Q_u$) to input and output ports 702 and 704 which are also connected by an impedance inverter 706. A representative transmission response of the corresponding normalized lossy highpass prototype is shown in FIG. 21*c*. To understand the design of the lossy passive biquad bandstop filter 700, it is instructive to consider its highpass prototype, as illustrated in FIG. 23, where $k_{00}$, $k_{01}$, $k_{11}$, $k_{12}$, and $k_{22}$ are normalized admittance inverters and $Y_p$ is a normalized shunt admittance comprised of a capacitance c in parallel with a conductance g. Although not considered further here, the highpass prototype of the analogous second-order passive bandstop building block 500 of FIG. 19*a* is shown in FIG. 24 to emphasize that a variety of electrically equivalent circuit topologies exist.

Since the network of FIG. 23 is reciprocal and symmetric, even- and odd-mode analysis is possible. Assuming normalized admittances, the two-port scattering parameters, $S_{11}$ and $S_{21}$, are given by $$S_{11} = \frac{1 - Y_o Y_e}{(1 + Y_o)(1 + Y_e)} \tag{77}$$

$$S_{21} = \frac{Y_o - Y_e}{(1 + Y_o)(1 + Y_e)} \tag{78}$$

where the even- and odd-mode admittance, $Y_e$ and $Y_o$, are given by $$Y_e = jk_{oo} + \cfrac{k_{01}^2}{Y_p + jk_{11} + \cfrac{k_{12}^2}{Y_p + jk_{22}}} \tag{79}$$

$$Y_o = -jk_{oo} + \cfrac{k_{01}^2}{Y_p - jk_{11} + \cfrac{k_{12}^2}{Y_p - jk_{22}}} \tag{80}$$

Referring to FIG. 21*c*, the highpass prototype must realize the following objectives:

$$S_{11}=0 \tag{81}$$

$$|S_{21}|_{\omega=\pm\omega_z}^2=0 \tag{82}$$

$$|S_{21}|_{\omega=0}^2=10^{-L_o/10}=A_O \tag{83}$$

$$|S_{21}|_{\omega=\pm 1}^2 = 10^{-L_s/10} = A_s \tag{84}$$

$$\left.\frac{\partial |S_{21}|^2}{\partial \omega}\right|_{\omega=-\infty,-\omega_z,0,\omega_z,\infty} = 0 \tag{85}$$

Applying (77), (79), and (80), it is found that, in order to satisfy condition (81), it is necessary to require that $$k_{00}=1,\ k_{22}=0,\ \text{and}\ k_{01}=\sqrt{2k_{11}}. \tag{86}$$

Objectives (82)-(85) can then be used to determine the values $k_{01}$, $k_{11}$, and $k_{12}$ given the mid-band attenuation, $L_o$, the band-edge attenuation, $L_s$, the relative stopband bandwidth, γ, and the bandstop resonator unloaded Q, $Q_u$, while making use of (78), (79), and (80). It is found that, in order to guarantee infinite attenuation at $\omega=\pm\omega_z$, it is necessary to require that $$k_{11}=2g,\ k_{01}=2\sqrt{g},\ \text{and}\ k_{12}>g. \tag{87}$$

Further, to specify a mid-band ($\omega=0$) attenuation, $L_o$, then $$k_{12}=g\sqrt{(1+\sqrt{A_O})(1+3\sqrt{A_O})/(1-A_O)} \tag{88}$$

where $A_o=10^{-L_o/10}$.

By applying (86) and (87) in (79), (80), and (78), the transfer function can be written as a biquadratic in terms of $s=j\omega$:

$$S_{21}(j\omega) = j\frac{(s^2 + \omega_z^2)}{(s - s_p)(s - s_p^*)} \tag{89}$$

and its square magnitude can be written as $$|S_{21}(j\omega)|^2 = \frac{(s^2 + \omega_z^2)^2}{(s - s_p)(s + s_p)(s - s_p^*)(s + s_p^*)} \tag{90}$$

where the transmission zero frequencies, $\omega_Z$, are $$\omega_z = \pm\sqrt{\frac{k_{12}^2 - g^2}{c^2}} = \pm\frac{\alpha}{q_u} \tag{91}$$

and the complex quadruplet transmission poles are $$\pm s_p = \pm\frac{2}{q_u} \pm j\omega_z \ \text{and}\ \pm s_p^* = \pm\frac{2}{q_u} \mp j\omega_z, \tag{92}$$

with $q_u=c/g=\gamma Q_u$ (the unloaded Q of the highpass prototype admittances, $Y_p=j\omega c+g$, at $\omega=\pm 1$) given by $$q_u = \sqrt{\alpha^2 + 4\left(\left(\frac{A_S}{1 - A_S}\right) + \sqrt{\left(\frac{A_S}{1 - A_S}\right)\left(\alpha^2 + \frac{1}{1 - A_S}\right)}\right)} \tag{93}$$

where $A_s=10^{-L_s/10}$ and α is $$\alpha = 2\sqrt{\frac{10^{L_o/20} + 1}{10^{L_o/10} - 1}} = \sqrt{\left(\frac{k_{12}}{g}\right)^2 - 1}\,. \tag{94}$$

The minimum resonator $Q_u$ for a required bandstop filter γ, $L_s$, and $L_o$ is found using (93) and (94) in $$Q_u = \frac{q_u}{\gamma} \tag{95}$$

Transmission is zero at stopband frequencies $\pm\omega_z$, even with resonator loss included in the analysis. Also, the transfer function (89) of the inherently fourth-order (4 capacitor) highpass prototype is reduced to second-order (biquad form) due to the parameter choices in (86) and (87). While a reduction in order may seem undesirable, the following example shows that it is actually beneficial.

As an example, the performance of a fourth-order filter (with eight resonators), comprised of a cascade, according to invention embodiment 1200 of FIG. 38*a*, of two of the passive biquad subcircuits 700 of FIG. 21*a*, was analyzed with a microwave circuit simulator. The cascaded network 1200 was designed to achieve a stopband width of 10 MHz at a center frequency of 2 GHz (γ=0.5% relative stopband bandwidth) and a minimum stopband attenuation of 45 dB using resonators with $Q_u$=200 (the approximate $Q_u$ of 87 Ω microstrip resonators on a 1.5 mm thick Rogers RO4003C substrate). The impedance inverter 706 was implemented using a quarter wavelength lossy microstrip transmission line. The simulated performance of the two individual passive biquad subcircuits 700, together with that of the fourth-order cascade 1200, is shown in FIG. 25. For comparison, a "conventional" quasi-elliptic eighth-order bandstop filter was also simulated. Its eight resonators also had $Q_u$=200 and were coupled to a transmission line at intervals of a quarter wavelength. The resonators were sequentially tuned to the eight zero frequencies of a lossless elliptic bandstop filter and were coupled progressively more tightly to the line according to the proximity of their resonances to the center frequency. The maximum couplings in both filters were the same (ideal transformer turns ratios, n, of 0.02) and both filters used the same lossy transmission lines (although the quasi-elliptic design required 3.5 times more transmission line length than the cascaded biquad filter design). The transmission and reflection performances of the two filters are compared in FIG. 26.

Defining selectivity as the ratio of stopband width to passband width, the cascaded filter exhibits about 25% better selectivity than the quasi-elliptic filter at 0.5 dB, 16% better selectivity at 1 dB, and 14% better selectivity at 3 dB. Consequently, a cascaded biquad filter in accordance with this invention demonstrates better performance than a comparable elliptic function characteristic when lossy resonators are involved.

J. Some Alternate Passive Absorptive Notch Filter Topologies

Figure 27A:
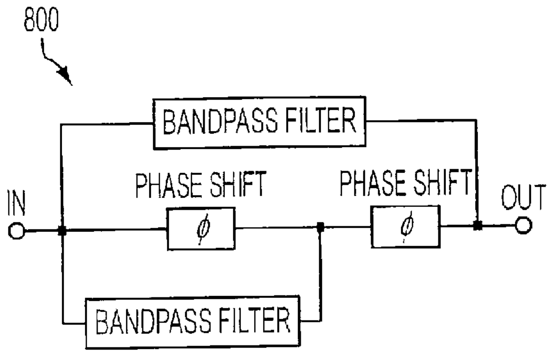
FIG. 27*a* is a schematic diagram of an overlapped absorptive notch filter according to the invention.
Figure 27B:
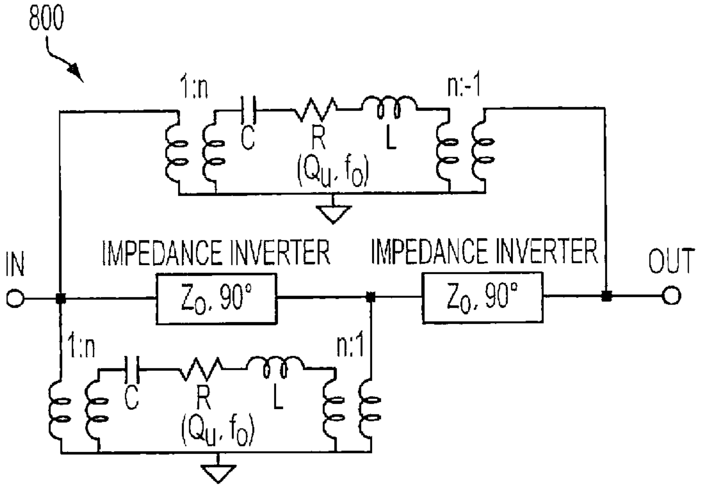
FIG. 27*b* is a representative equivalent circuit schematic of a first-order overlapped absorptive notch filter according to the invention.
Figure 28A:
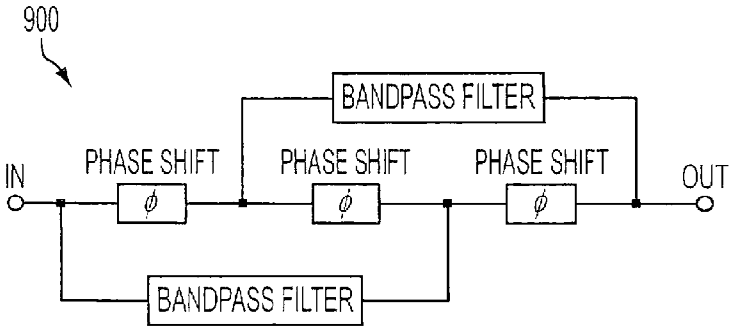
FIG. 28*a* is a schematic diagram of an interleaved absorptive notch filter according to the invention.
Figure 29A:
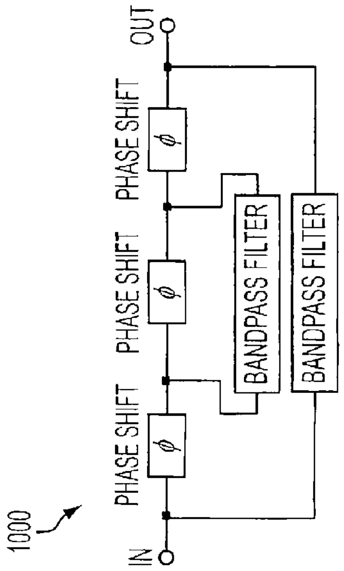
FIG. 29*a* is a schematic diagram of a concentric absorptive notch filter according to the invention.
Figure 28B:
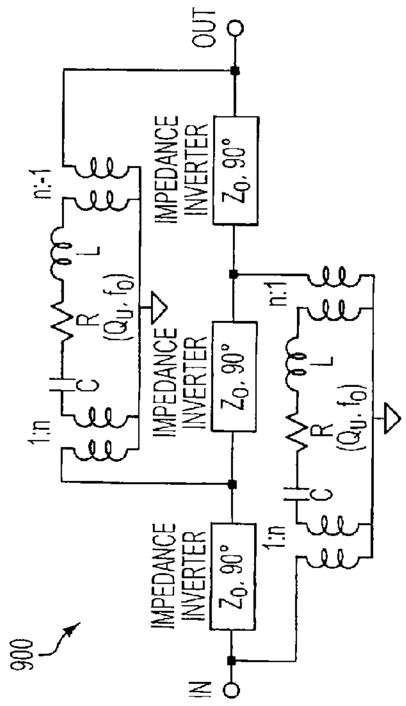
FIG. 28*b* is a representative equivalent circuit schematic of a first-order interleaved absorptive notch filter according to the invention.
Figure 29B:
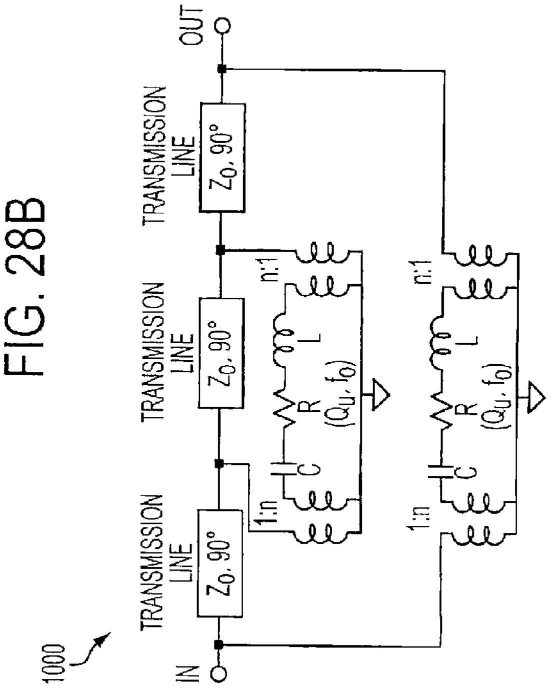
FIG. 29*b* is a representative equivalent circuit schematic of a first-order concentric absorptive notch filter according to the invention.
Figure 30B:
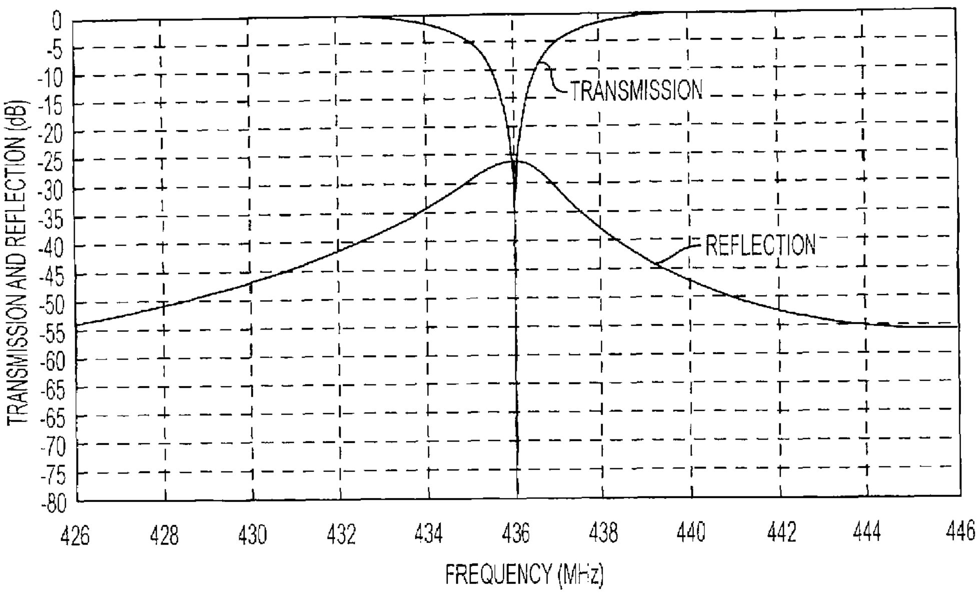
FIG. 30*b* is a graph illustrating simulated transmission and reflection characteristics of the compact, quasi-interleaved first-order absorptive notch filter of FIG. 30*a*.
Figure 31A:
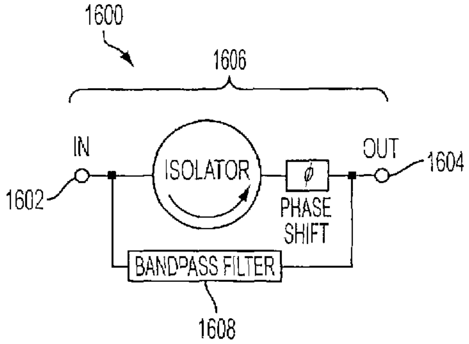
FIG. 31*a* is a schematic diagram of an isolator-based absorptive notch filter according to the invention.
Figure 31B:
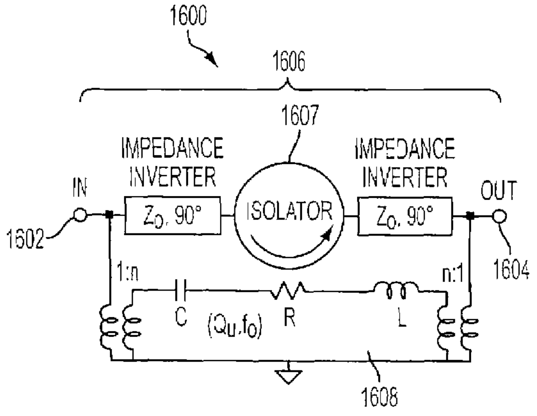
FIG. 31*b* is a representative equivalent circuit schematic of a first-order isolator-based absorptive notch filter according to the invention.
Figure 32A:
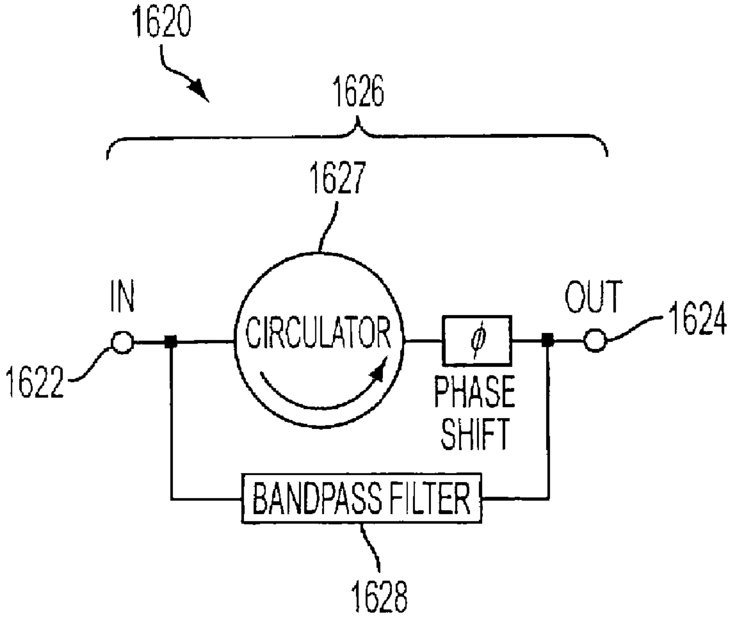
FIG. 32*a* is a schematic diagram of a circulator-based absorptive notch filter according to the invention.
Figure 32B:
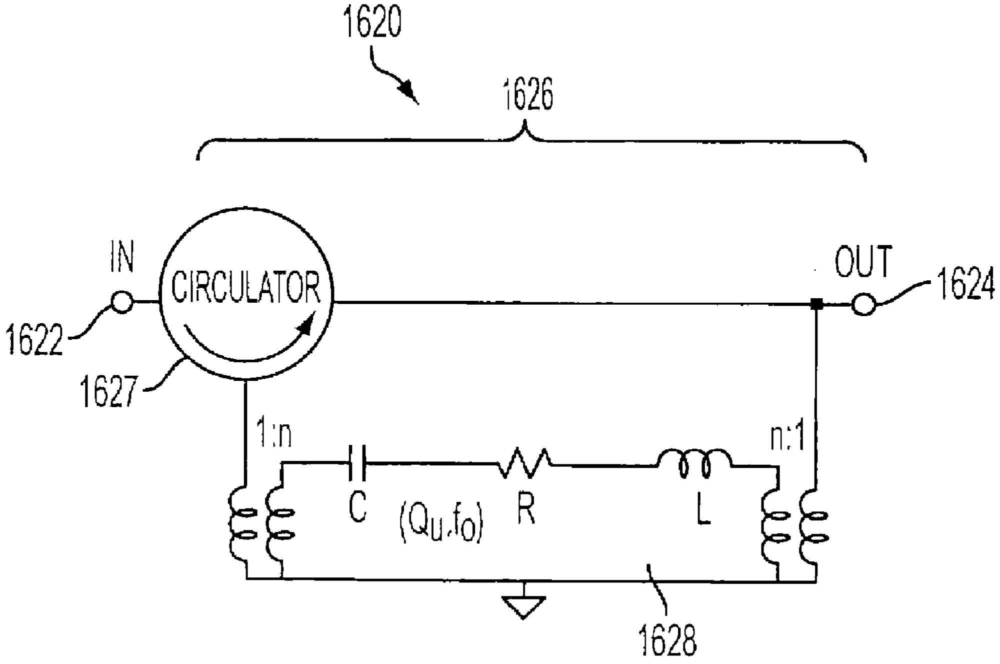
FIG. 32*b* is a representative equivalent circuit schematic of a first-order circulator -based absorptive notch filter according to the invention.

Besides coupling bandpass filters to a phase shift or time delay element in an overlaid fashion, as described above in FIGS. 20*a*-*b*, it is also possible to couple bandpass filters to the phase shift element in an overlapped fashion 800, an interleaved fashion 900, and a concentric fashion 1000, as illustrated by conceptual diagrams and representative circuit schematics in FIGS. 27*a* and b, FIGS. 28*a* and *b*, and FIGS. 29*a* and b, respectively, and such embodiments are a subject of the invention. In particular, attention is drawn to one very compact implementation of a quasi-interleaved topology, as illustrated by its microstrip layout on a 1.575 mm thick RT/Duroid 5880 substrate in FIG. 30*a* and corresponding simulated transmission and reflection responses in FIG. 30*b*. This example is meant to highlight the fact that the various constituent couplings of the invention, and which are described throughout this disclosure as components in the various embodiments of the invention, can be either point, or predominantly localized, couplings (as in the case of the ideal transformer couplings of lumped resonators to other elements in the various representative equivalent circuit schematic figures) or substantially distributed couplings (as in the parallel-line couplings in the microstrip layouts of FIGS. 11, 16*c*, 17*c*, 37*c*, 37*d*, and 30*a* and the interdigitated-parallel-line couplings in the microstrip layout of FIG. 14). Also, simple modifications to explicitly described embodiments are within the scope of this invention, as exemplified in FIG. 30*a* where the two resonators couple to each other across the central portion of the common delay line—an aspect of the topology of the embodiments of either of FIGS. 37*a* or 28*b* not illustrated therein.

K. Active and Non-Reciprocal Passive Absorptive Notch Filters

In addition to passive reciprocal embodiments of the invention, passive non-reciprocal embodiments and active embodiments are possible as well. FIGS. 31*a*-*b* and 32*a*-*b* illustrate two passive reciprocal embodiments 1600 and 1620 also a subject of the invention, including bandpass filters 1608 and 1628 and employing an isolator 1607 (with an assumed 360 degree phase shift between isolator ports) or a circulator 1627 (with an assumed 180 degree phase shift between circulator ports) within phase shift networks 1606 and 1626, respectively. An important advantage of these passive non-reciprocal embodiments of the invention is that they require only half the number of resonators as the previously described passive reciprocal embodiments for the same order of notch filter response. That is, they require the same number of resonators as the order of the notch filter response, not twice the number of resonators as the order of the notch filter response. These passive non-reciprocal notch filters also require the addition of a passive non-reciprocal component in the primary signal path, contributing to increased insertion loss and signal distortion in the passband of the notch filter, as well as to increased filter size and cost together with decreased compatibility with monolithic circuit manufacturing processes. It should also be noted that non-first-order versions of the embodiments 1600 and 1620 of FIGS. 31*a* and 32*a*, as is true for all previously described embodiments, can include substantially unconventional implementations of the bandpass filters 1608 and 1628, including concentric, interleaved, and/or overlapped coupling of resonators to phase shift elements on either side of the non-reciprocal component, as well as multiple bandpass filter input and/or output couplings (that is, the bandpass filters can have more ports than two).

FIGS. 33*a*-*b*, 34*a*-*b*, 35*a*-*b*, and 36*a*-*b* illustrate five representative active (as opposed to passive) embodiments of the invention. All of these embodiments contribute little passband signal distortion, since the all-pass signal path is free of active components.

Active notch filter 1500 of FIGS. 33*a*-*b* is simply an active form of the passive reciprocal "distributed bridged-T" embodiment of FIGS. 16*a*-*c*, where loss in the bandpass filters 1510 and 1514 is compensated for by the gain of the amplifier 1512, allowing much more selective and narrowband attenuation characteristics to be realized from resonators of a given Qu. Amplifier 1512 stability is achieved by means of the frequency-selective attenuation of the notch filter 1506 in its feedback path. Input port 1502 is coupled to output port 1504 by two independent frequency dependent networks (i.e., two independent signal paths): conventional notch filter 1506 and active bandpass filter 1508. Constituent notch filter 1506 is comprised of series connected unit-element impedance inverters (all-pass 90 degree phase shifters) 1516 and 1518 forming an all-pass 180 degree phase shift network 1522 and resonance 1520 coupled to 1522 at the junction of 1516 and 1518. Constituent active bandpass filter 1508 is comprised of single-resonance two-port bandpass filters 1510 and 1514 connected by amplifier 1512.

FIGS. 34*a*-*b*, 35*a*-*b*, and 36*a*-*b* illustrate alternative passive means of achieving attenuation (and therefore inherent stability) in the amplifier's feedback path. Further, the embodiments of FIGS. 33-36, with half the number of amplifiers, up to half the number of resonators, and as much as half the delay line length, are substantially smaller, more economical, and less lossy than comparable prior art devices. These advantages become even more important if first-order active notch filter stages are to be cascaded to realize a higher-order attenuation response.

FIGS. 34*a*-*b* and 35*a*-*b* illustrate two active filter embodiments 1700 and 1720 also a subject of the invention, including active bandpass filters 1708 and 1728 that include amplifiers 1714 and 1734 and employing an isolator 1707 (with an assumed 360 degree phase shift between isolator ports) or a circulator 1727 (with an assumed 180 degree phase shift between circulator ports) within phase shift networks 1706 and 1726, respectively.

Figure 36A:
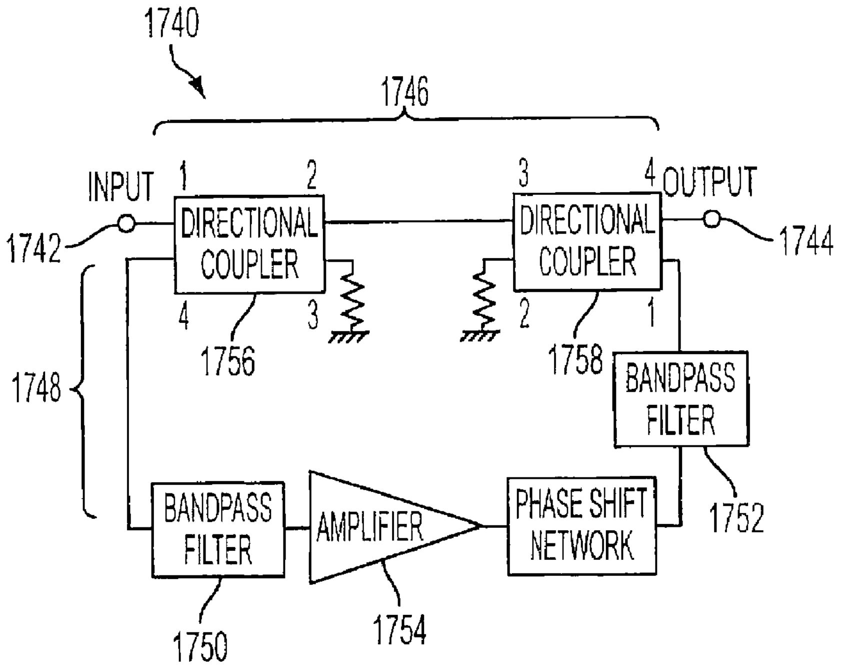
FIG. 36*a* is a schematic diagram of a directional-coupler-based active notch filter according to the invention.
Figure 36B:
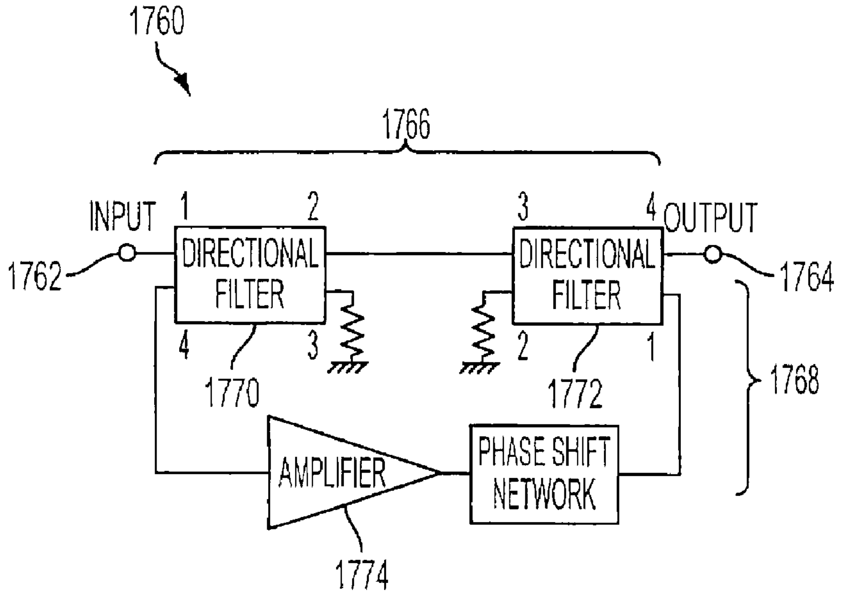
FIG. 36*b* is a schematic diagram of a directional-filter-based active notch filter according to the invention.

FIGS. 36*a* and 36*b* illustrate an additional two active filter embodiments 1740 and 1760 also a subject of the invention, including active bandpass filters 1748 and 1768 that include amplifiers 1754 and 1774 and at least one directional coupler 1756 or at least one directional filter 1770, respectively.

L. Miscellaneous

Figure 30A:
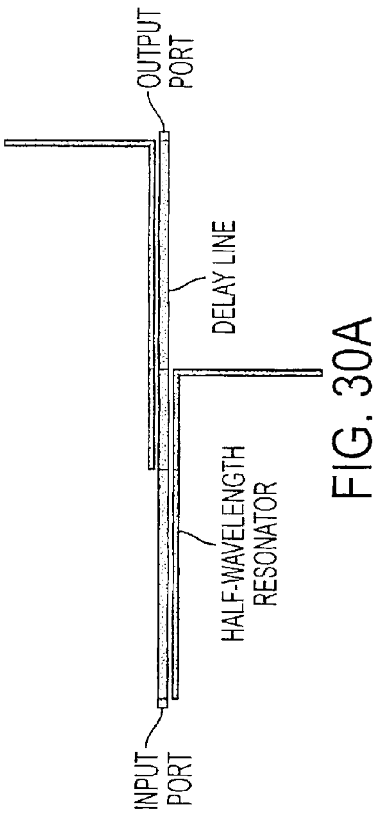
FIG. 30*a* is a layout of a representative microstrip realization of a compact, quasi-interleaved first-order absorptive notch filter according to the invention.

Design of filters according to the invention can generally be accomplished via iterative circuit optimization using a circuit simulator coupled with iterative electromagnetic analysis of pertinent physical structures comprising the target notch filter implementation. In particular, filters 10, 100, 200, and that illustrated in FIG. 30*a* are especially amenable to this design concept and their specific implementations were designed using this approach.

It will be appreciated that any of the resonant components referred to in the text or in the figures could be incorporated in the ground plane of a planar circuit. For instance, resonant components could be implemented in the ground plane of a predominantly microstrip circuit as coplanar waveguide resonators and coupled to microstrip or coplanar waveguide circuits on the substrates upper surface. Such embodiments of the invention could be termed “photonic bandgap” or defected “ground plane” embodiments. Similarly, while the invention has been described primarily in terms of planar implementations, three dimensional implementations are also considered within the scope of this invention.

Further, it will also be appreciated that the teachings of the previously referenced U.S. Pat. No. 5,781,084 with respect to the design and synthesis of one-port reflection-mode filters including a ladder network of resonators having progressively reducing Q values can be applied to the design and synthesis of the one-port admittances $Y_p$ 26 and $Y_m$ 28 of filter embodiment 10 as shown in FIG. 5*c*.

Obviously many modifications and variations of the present invention are possible in light of the above teachings. It is therefore to be understood that the scope of the invention should be determined by referring to the following appended claims.

I claim:

1. An absorptive bandstop filter, comprising
an input port;
an output port;
two or more resonances, wherein said resonances have substantially the same values of unloaded Q and wherein said resonances have resonant frequencies such that the largest resonant frequency is no more than fifty percent larger than the smallest resonant frequency;
one or more frequency-dependent networks, each connecting said input port to said output port, wherein
said frequency-dependent networks may have portions in common to the extent that there are at least two distinct predominant signals paths that convey signal power from said input port to said output port, with at least one of said distinct predominant signal paths including no amplifier and with no more than one of said distinct predominant signal paths including one or more amplifiers,
at least one of said frequency-dependent networks includes a first bandpass filter,
each said frequency-dependent network has frequency-dependent signal transmission magnitude and/or phase characteristics,
said frequency-dependent networks or combinations and/or portions thereof do not constitute a 3 dB hybrid coupler,
some of said frequency-dependent networks may be electrically tunable,
and each of said signal transmission magnitude and phase properties of each of said frequency-dependent networks are selected such that
a combined signal power transferred from said input port to said output port is substantially attenuated at one or more stopband frequencies within a range of frequencies defining a stopband
and such that the relative 3dB bandwidth of said stopband is substantially independent of a maximum level of attenuation within said stopband and/or the maximum level of said attenuation within said stopband is substantially independent of the unloaded Q of all said resonances.

2. An absorptive bandstop filter as in claim 1, wherein
at least one of said frequency-dependent networks includes at least one component that exhibits substantially distributed circuit characteristics at frequencies within said stopband.

3. An absorptive bandstop filter as in claim 2, wherein
each of said signal transmission magnitude and phase properties of each of said frequency-dependent networks are additionally selected such that a signal power reflected from said input port and said output port is substantially attenuated at all frequencies within said stopband, wherein a maximum reflected power level in said stopband is of a same or smaller order of magnitude as a maximum reflected power level within at least one passband adjacent to said stopband.

4. An absorptive bandstop filter as in claim 2, wherein
a first of said frequency-dependent networks is a passive frequency-dependent phase shift network characterized by a predominately frequency-invariant transmission magnitude within said stopband;
said passive frequency-dependent phase shift network may be characterized by an essentially frequency-invariant transmission phase shift within said stopband;
and a second of said frequency-dependent networks includes a second bandpass filter.

5. An absorptive bandstop filter as in claim 4, wherein
said passive frequency-dependent phase shift network includes a transmission line.

6. An absorptive bandstop filter as in claim 4, wherein
a third said frequency-dependent network includes a third bandpass filter.

7. An absorptive bandstop filter as in claim 4, wherein
said passive frequency-dependent phase shift network includes a circulator.

8. An absorptive bandstop filter as in claim 7, wherein
said bandpass filter includes at least one amplifier.

9. An absorptive bandstop filter as in claim 4, wherein
said passive frequency-dependent phase shift network includes an isolator.

10. An absorptive bandstop filter as in claim 9, wherein
said first bandpass filter includes at least one amplifier.

11. An absorptive bandstop filter as in claim 4, wherein
said first bandpass filter includes at least one amplifier and at least one passive directional coupler.

12. An absorptive bandstop filter as in claim 4, wherein said first bandpass filter includes at least one amplifier and at least one passive directional filter.

13. An absorptive bandstop filter as in claim 2, wherein a first of said frequency-dependent networks includes a constituent bandstop filter and a second of said frequency-dependent networks includes a second bandpass filter;

the stopband frequencies of said constituent bandstop filter are substantially the same as the passband frequencies of said second passband filter;

and there is a relative phase difference between the phase shifts through said second bandpass filter and said constituent bandstop filter of substantially 180 degrees at one or more frequencies within said stopband of said absorptive bandstop filter.

14. An absorptive bandstop filter as in claim 13, wherein said bandpass filter includes an amplifier.

15. An absorptive bandstop filter, comprising an input port;

an output port;

a first signal path connecting said input port to said output port, said first signal path comprising a first coupling means having a first coupling magnitude, a first coupling phase shift, and a predominately frequency-invariant transmission magnitude within a range of frequencies defining a frequency band of interest;

a second signal path connecting said input port to said output port, said second signal path constituting a bandpass filter comprising:

a first one-port filter containing one or more resonances; and a second one-port filter containing one or more resonances;

wherein each said first and second one-port filters has frequency-dependent signal transmission magnitude and/or phase characteristics;

wherein said first one-port filter is coupled to a first portion of said first signal path by a second coupling means having a second coupling magnitude and a second coupling phase shift;

wherein said second one-port filter is coupled to a second portion of said first signal path by a third coupling means having a third coupling magnitude and a third coupling phase shift;

wherein said first and second one-port filters are coupled to each other by a fourth coupling means having a fourth coupling magnitude and a fourth coupling phase shift; and wherein one or more of said resonances of each of said first and second one port-filters may include a mechanical and/or electrical tuning means;

wherein said first coupling magnitude differs from said fourth coupling magnitude and/or said first coupling phase shift differs from said fourth coupling phase shift; and wherein said coupling magnitudes and coupling phases of each of said coupling means and said frequency-dependent signal transmission magnitude and phase characteristics of each of said one-port filters are selected such that a combined signal power transferred from said input port to said output port is substantially attenuated at one or more stopband frequencies within a range of frequencies defining a stopband within said frequency band of interest and such that the relative 3dB bandwidth of said stopband is substantially independent of a maximum level of attenuation within said stopband and/or the maximum level of said attenuation within said stopband is substantially independent of an unloaded Q of said resonances of each of said first and second one port-filters.

16. An absorptive bandstop filter as in claim 15, wherein said resonance of said first one-port filter is a first resonance having a first resonant frequency, and said first one-port filter also includes a first conductance, and a first unloaded Q, wherein said first resonance is coupled to said first portion of said first signal path by said second coupling means; and said resonance of said second one-port filter is a second resonance having a second resonant frequency, and said second one-port filter also includes a second conductance, and a second unloaded Q, wherein said second resonance is coupled to said second portion of said first signal path by said third coupling means;

said first resonance is coupled to said second resonance by said fourth coupling means;

said first coupling means is a phase shift element with a characteristic admittance $Y_t$ and said first coupling phase shift $\phi$ at one or more frequencies within said stopband;

said coupling magnitude and coupling phase of each of said second, third, and fourth coupling means may be approximated by the corresponding admittance magnitude and phase of a second, third, and fourth admittance inverter, respectively, at one or more frequencies within said stopband;

said phase of each of said second, third, and fourth admittance inverters is nominally an odd multiple of 90 degrees, or $\pi/2$ radians, at one or more frequencies within said stopband;

said admittance magnitude of each of said second and third admittance inverter is nominally given by $$k_{01} = \sqrt{Y_t \frac{b^2 + g^2 + k_{11}^2}{k_{11}\sin\phi}}$$

at one or more frequencies within said stopband, where g is the nominal conductance of both of said resonances, $k_{11}$ is the nominal admittance magnitude of said fourth admittance inverter, and b is a frequency-invariant susceptance having a value proportional to the difference between said resonant frequencies of said resonances.

17. An absorptive bandstop filter as in claim 16, wherein said characteristic admittance $Y_t$ is nominally equal to the admittance of a signal source connected to said input port at one or more frequencies within said stopband.

18. An absorptive bandstop filter as in claim 17, wherein said resonant frequencies are nominally equal and said b is nominally zero.

19. An absorptive bandstop filter as in claim 18, wherein the value of said $\phi$ is nominally an odd multiple of 90 degrees, or $\pi/2$ radians, at one or more frequencies within said stopband.

20. An absorptive bandstop filter as in claim 18, wherein the value of said $k_{11}$ is nominally equal to the value of said g.

21. An absorptive bandstop filter as in claim 20, wherein the value of said $\phi$ is nominally an odd multiple of 90 degrees, or $\pi/2$ radians, at one or more frequencies within said stopband.

22. An absorptive bandstop filter as in claim 15, wherein said mechanical and/or electrical tuning means are comprised of varactors having independently electrically controllable capacitances.

23. An absorptive bandstop filter as in claim 15, wherein
said resonance of said first one-port filter is a first resonance having a first resonant frequency, and said first one-port filter also includes a first conductance, and a first unloaded Q, wherein said first resonance is coupled to said first portion of said first signal path by said second coupling means;
said resonance of said second one-port filter is a second resonance having a second resonant frequency, and said second one-port filter also includes a second conductance, and a second unloaded Q, wherein said second resonance is coupled to said second portion of said first signal path by said third coupling means;
said first one-port filter further includes a third resonance having a third resonant frequency, and said first one-port filter also includes a third conductance, and a third unloaded Q, wherein said third resonance is coupled to said first resonance by a fifth coupling means having a fifth coupling magnitude and a fifth coupling phase shift;
said second one-port filter further includes a fourth resonance having a fourth resonant frequency, and said second one-port filter also includes a fourth conductance, and a fourth unloaded Q, wherein said fourth resonance is coupled to said second resonance by a sixth coupling means having a sixth coupling magnitude and a sixth coupling phase shift;
said first resonance is coupled to said second resonance by said fourth coupling means;
said third resonance is coupled to said fourth resonance by a seventh coupling means having a seventh coupling magnitude and a seventh coupling phase shift;
said first coupling means is a phase shift element with a characteristic admittance $Y_t$ and said first coupling phase shift $\phi$ at one or more frequencies within said stopband;
said coupling magnitude and coupling phase of each of said second, third, fourth, fifth, sixth, and seventh coupling means may be approximated by a corresponding admittance magnitude and phase of a second, third, fourth, fifth, sixth, and seventh admittance inverter, respectively, at one or more frequencies within said stopband;
said phase of each of said second, third, fourth, fifth, sixth, and seventh admittance inverters is nominally an odd multiple of 90 degrees, or $\pi/2$ radians, at one or more frequencies within said stopband.

24. An absorptive bandstop filter as in claim 23, wherein
said resonant frequencies are nominally equal;
said conductances are nominally equal to a conductance g at one or more frequencies within said stopband;
said unloaded Q's are nominally equal at one or more frequencies within said stopband;
said characteristic admittance $Y_t$ is nominally equal to the admittance of the signal source connected to said input port at one or more frequencies within said stopband;
said admittance magnitude of said seventh admittance inverter is nominally zero at one or more frequencies within said stopband;
said admittance magnitudes $k_{01}$ of said second and third admittance inverters are nominally given by $$k_{01}=\sqrt{2k_{11}Y_t}$$

at one or more frequencies within said stopband, where $k_{11}$ is the nominal admittance magnitude of said fourth admittance inverter and is given by $$k_{11}=2g;$$

said admittance magnitudes $k_{12}$ of said fifth and sixth admittance inverters are nominally given by $$k_{12}>g.$$

25. An absorptive bandstop filter as in claim 24, wherein said bandpass filter is a second-order bandpass filter.

* * * * *